(12) United States Patent
Ohnishi et al.

(10) Patent No.: US 8,130,499 B2
(45) Date of Patent: Mar. 6, 2012

(54) HEAT DISSIPATING STRUCTURE BASE BOARD, MODULE USING HEAT DISSIPATING STRUCTURE BASE BOARD, AND METHOD FOR MANUFACTURING HEAT DISSIPATING STRUCTURE BASE BOARD

(75) Inventors: Tohru Ohnishi, Mie (JP); Hitoshi Kouno, Mie (JP); Toshiyuki Taniguchi, Mie (JP); Koji Nakashima, Mie (JP); Toshiyuki Nakata, Mie (JP); Tsunetsugu Imanishi, Mie (JP); Keiichi Nakao, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/530,277

(22) PCT Filed: Nov. 28, 2008

(86) PCT No.: PCT/JP2008/003509
§ 371 (c)(1),
(2), (4) Date: Sep. 8, 2009

(87) PCT Pub. No.: WO2009/069308
PCT Pub. Date: Jun. 4, 2009

(65) Prior Publication Data
US 2010/0091464 A1 Apr. 15, 2010

(30) Foreign Application Priority Data

Nov. 30, 2007 (JP) .................................. 2007-309763
Dec. 6, 2007 (JP) .................................. 2007-315609
Dec. 11, 2007 (JP) .................................. 2007-319166

(51) Int. Cl.
*H05K 7/20* (2006.01)
(52) U.S. Cl. ........ 361/710; 361/709; 361/715; 361/723; 257/706; 174/16.3; 438/123
(58) Field of Classification Search .......... 361/701–704, 361/707–23
See application file for complete search history.

(56) References Cited

U.S. PATENT DOCUMENTS 4,630,174 A 12/1986 Kaufman
(Continued)

FOREIGN PATENT DOCUMENTS

DE 36 43 288 6/1988
(Continued)

OTHER PUBLICATIONS

European Search Report issued Aug. 17, 2010 in counterpart European Application 08 85 4096.

(Continued)

*Primary Examiner* — Courtney Smith
(74) *Attorney, Agent, or Firm* — Wenderoth, Lind & Ponack, L.L.P.

(57) ABSTRACT

The present invention relates to a heat dissipation structure board and a module using this heat dissipation structure used for purpose required of high reliability such as a hybrid vehicle or an electric vehicle and to a method of manufacturing the heat dissipation structure. A resin structure is disposed on a lead frame constituting a heat dissipation board and an odd-shaped electronic component or the like mounted on this lead frame or the like to cover up the lead frame and the odd-shaped electronic component or the like, and this resin structure is fixed to a metal plate, a chassis of a device and the like to constitute the heat dissipation structure board as a whole, whereby fixing strengths of fixing the lead frame and the odd-shaped electronic component or the like, a bonding strength at an interface between the lead frame and the heat transfer layer and the like can be reinforced.

26 Claims, 33 Drawing Sheets

U.S. PATENT DOCUMENTS

| | | | |
|---|---|---|---|
| 5,559,374 A * | 9/1996 | Ohta et al. | 257/723 |
| 6,060,150 A | 5/2000 | Nakatani et al. | |
| 6,355,131 B1 | 3/2002 | Nakatani et al. | |
| 6,358,351 B1 | 3/2002 | Nakatani et al. | |
| 6,509,629 B2 * | 1/2003 | Yoshimatsu et al. | 257/660 |
| 6,522,555 B2 * | 2/2003 | Hirano et al. | 361/760 |
| 6,548,152 B2 | 4/2003 | Nakatani et al. | |
| 6,863,962 B2 | 3/2005 | Nakatani et al. | |
| 6,979,843 B2 * | 12/2005 | Nakajima et al. | 257/182 |
| 7,449,726 B2 * | 11/2008 | Nakanishi et al. | 257/177 |
| 7,582,951 B2 * | 9/2009 | Zhao et al. | 257/660 |
| 7,892,893 B2 * | 2/2011 | Obara | 438/112 |
| 2002/0026980 A1 | 3/2002 | Nakatani et al. | |
| 2002/0040760 A1 | 4/2002 | Nakatani et al. | |
| 2003/0076663 A1 | 4/2003 | Hirano et al. | |
| 2003/0124326 A1 | 7/2003 | Nakatani et al. | |
| 2003/0183907 A1 * | 10/2003 | Hayashi et al. | 257/666 |
| 2004/0070480 A1 * | 4/2004 | Nakashima et al. | 336/200 |
| 2005/0035434 A1 | 2/2005 | Fissore et al. | |
| 2005/0135065 A1 * | 6/2005 | Nakatsu et al. | 361/703 |
| 2007/0257343 A1 * | 11/2007 | Hauenstein et al. | 257/676 |

FOREIGN PATENT DOCUMENTS

| | | |
|---|---|---|
| JP | 63-208253 | 8/1988 |
| JP | 63-240056 | 10/1988 |
| JP | 9-139580 | 5/1997 |
| JP | 10-173097 | 6/1998 |
| JP | 2001-57406 | 2/2001 |
| JP | 2001-057406 | 2/2001 |
| JP | 3898158 | 3/2007 |

OTHER PUBLICATIONS

International Search Report issued Feb. 24, 2009 in International (PCT) Application No. PCT/JP2008/003509.

* cited by examiner

180
HEAT DISSIPATING STRUCTURE BASE BOARD, MODULE USING HEAT DISSIPATING STRUCTURE BASE BOARD, AND METHOD FOR MANUFACTURING HEAT DISSIPATING STRUCTURE BASE BOARD

TECHNICAL FIELD

The present invention relates to a heat dissipation structure board used in a hybrid vehicle such as a mild hybrid vehicle, an electric vehicle or an industrial device, a module using the heat dissipation structure board and a method of manufacturing the heat dissipation structure board.

BACKGROUND ART

Recently, attention has been paid to a hybrid vehicle or a variety of industrial devices realizing low power consumption by accumulating regenerative electric power during braking or the like in an electric double layer capacitor or the like.

Such a device requires a circuit module dealing with high current such as a DC/DC converter (which converts a DC input into a DC output) controlling high current exceeding 100 A with high accuracy. It is necessary to mount a power semiconductor and the like used in this module on a heat dissipation board that can deal with heat dissipation and high current.

As a heat dissipation board of this type, there is known a metal-based printed circuit board structured to bond a printed circuit board onto a metal board via an insulating adhesive layer that contains a metal oxide and/or a metal nitride in Patent Document 1.

FIG. 34 is a cross-sectional view showing an example of a conventional heat dissipation board. In FIG. 34, conductor circuit 3 is fixed onto metal board 1 via first insulating adhesive layer 2. Conductor layer for circuit ("circuit conductor layer") 5 is further formed on conductor circuit 3 via second insulating adhesive layer 8. Conductor circuit 3 is connected to circuit conductor layer 5 by via hole 6. However, there is a limit to such a conventional heat dissipation board for reinforcing a peel strength of circuit conductor layer 5.

For example, when a part of circuit conductor layer 5 is formed as an external lead terminal part and pulled as indicated by arrow 7, it is only an adhesive force of insulating adhesive layer 8 that resists this "tensile force". As a result, it is difficult to deal with vibration resistance (for example, an acceleration test of about 4 G to 20 G is conducted in XYZ directions) as required for on-vehicle devices. Furthermore, even if a thick material such as a lead frame that can deal with a high current and that has a high strength is employed for conductor circuit 3 and circuit conductor layer 5, similar problems occur.

In this way, in the conventional heat dissipation board, circuit conductor layer 5 that is an outermost layer is only adhesively bonded onto a surface of second insulating adhesive layer 8. Due to this, if a high strength is applied to this layer via the printed board or a power cable, an adhesive surface (or an interface) of the layer is possibly peeled off.

On the other hand, it is demanded to mount a semiconductor chip main body (such as a bare chip) in place of a resin-molded semiconductor using such a mounting method as wire bonding so as to make a circuit module smaller in size and lighter in weight.

To meet the demand, there is proposed bare chip mounting for a semiconductor in Patent Document 2. However, it is difficult for a conventional semiconductor module to deal with mounting of a large-sized electronic component or an odd-shaped electronic component such as a transformer or a choke coil and the electronic component is possibly detached from the semiconductor module due to vibration or the like.

Moreover, there is also proposed a structure of setting a control printed circuit board almost in parallel on a bare-chip-mounted power semiconductor in Patent Document 2. However, it is difficult for the proposed structure to deal with mounting of a large-sized electronic component or an odd-shaped electronic component such as a transformer or a choke coil.

Patent Document 1: Japanese Patent Application No. H09-139580
Patent Document 2: Japanese Patent No. 3,898,158

SUMMARY OF THE INVENTION

The present invention has been achieved to solve these conventional problems. It is an object of the present invention to provide a heat dissipation structure board, a module using the heat dissipation structure board and a method of manufacturing the heat dissipation structure board using lead frames capable of dealing with high current and having a mechanical strength as wirings constituting a heat dissipation board, intended to increase a fixing strength of fixing the lead frames to other components (such as a fixing strength of an interface between a heat transfer layer and lead frames or a fixing strength of an interface between the heat transfer layer and a metal plate), and capable of dealing with mounting of heat-generation components such as power semiconductor. It is also an object of the present invention to provide the heat dissipation structure board, the module using the heat dissipation structure board and the method of manufacturing the heat dissipation structure board capable of fixing a large-sized or an odd-shaped electronic component, such as a transformer, a choke coil or an electronic double layer capacitor, conventionally difficult to fix at high strength.

The present invention provides a heat dissipation structure board including: a metal plate; a heat transfer layer provided on the metal plate; a terminal part; a lead frame, parts other than the terminal part being fixedly attached to the heat transfer layer; and a resin structure connected to an upper surface of the parts of the lead frame other than the terminal part, wherein the resin structure includes a connection part fixed to at least one of the metal plate, the heat transfer layer and a member to which a chassis fixing the metal plate is connected; the terminal part provided on the lead frame; a connection wiring that is a part of the lead frame protruding from the heat transfer layer; a guide part guiding the terminal part; and a reinforcement part that is a part of or more than a part of the lead frame, the reinforcement part being spaced apart in which the resin structure abuts on the lead frame.

BRIEF DESCRIPTION OF THE DRAWINGS

FIG. 32A is a cross-sectional view describing a manner of forming a heat dissipation structure board using an aluminum board or the like.

FIG. 32B is a cross-sectional view describing a manner of forming the heat dissipation structure board using the aluminum board or the like.

REFERENCE MARKS IN THE DRAWINGS

Figure 1:
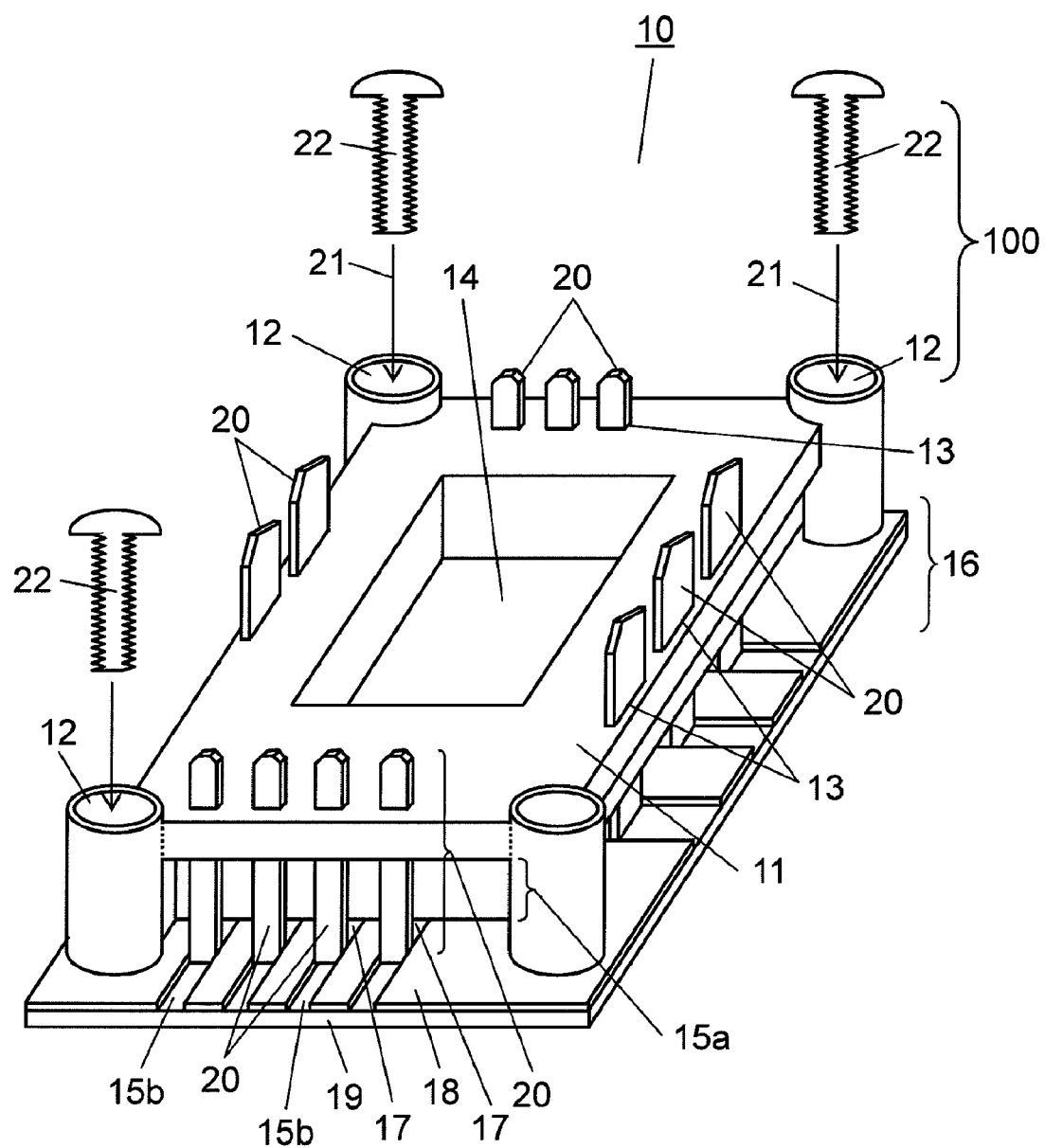
FIG. 1 is a perspective view showing an example of a resin structure used to increase strengths of connection wiring parts of a heat dissipation structure board.

10 Heat dissipation structure board
11 Resin structure
12 Attachment hole
13 Wiring hole
14 Opening
15a, 15b Concave part
16 Heat dissipation board
17 Lead frame
18 Heat transfer layer
19 Metal plate
20 Connection wiring
21 Arrow
22 Screw
23 Heat transfer resin
24 Printed circuit board
25 Ordinary electronic component
26 Module
27 Solder
28 Dotted line
29 Odd-shaped electronic component
30 Fixing member
31 Connection part
32 Coil member
33 Core part
34 Coil part
35 Guide groove
36 Guide hole
37 Connector pin
38 Connector
39 Connection terminal part
40 Case
41 Sealing material
42 Leg
43 Insertion part
44 Chassis
45 Bare chip
46 Bonding wire
47 Fixing layer
48 Metal foil pattern
49 Buffer structure part
100 Connection part
101 Reinforcement part
102 Guide part
103 Terminal part
104 Holding part

DETAILED DESCRIPTION OF THE INVENTION

It is to be noted that manufacturing steps shown in embodiments of the present invention are partially executed using a molding die. However, the molding die is not shown unless it is necessary to be shown for describing. Moreover, the figures are schematic diagrams and do not show positional relations in a dimensionally correct manner. Furthermore, contents mentioned in different embodiments can be combined.

First Embodiment

A structure of a resin structure employed to increase a strength of a heat dissipation structure board will be described below as a first embodiment of the present invention.

FIG. 1 is a perspective view showing an example of a resin structure employed to increase strengths of connection wirings of a heat dissipation structure substrate. In FIG. 1, heat dissipation structure board 10 is configured to include resin structure 11, attachment holes 12, wiring holes 13, opening 14, concave parts 15a and 15b, heat dissipation board 16, lead frames 17, heat transfer layer 18, metal plate 19, connection wirings 20 and screws 22.

Wiring holes 13 provided in resin structure 11 correspond to holes through which connection wirings 20 (connection wirings 20 may be a terminal part for connection to an external circuit or the like) formed in heat dissipation board 16 are penetrated (or, instead of being penetrated through, connection wirings 20 may be inserted, guided or fixed into the holes), respectively as described below with reference to FIG. 2 and the like. It is to be noted that wiring holes 13 may be grooves according to purposes. If wiring holes 13 are grooves, it is preferable to provide a fixing structure by means of a guide mechanism, an adhesive or the like in an openings of each of the grooves for preventing connection wiring 20 set into the grooves from moving.

In FIG. 1, heat dissipation board 16 is configured to include metal plate 19, sheet-like heat transfer layer 18 formed on metal plate 19, lead frames 17 fixed to this heat transfer layer 18 and connection wirings 20 formed by bending part of these lead frames 17 almost perpendicularly to heat transfer layer 18 and metal plate 19.

As shown in FIG. 1, heat dissipation structure board 10 is defined as a combination of heat dissipation board 16 and resin structure 11 fixed onto this heat dissipation board 16 by screws 22 or the like. This is because such functions of heat dissipation structure board 10 as a strength reinforcement function can be fulfilled by fixing a part of or more than a part of heat dissipation board 16 by resin structure 11 fixed onto heat dissipation board 16.

Alternatively, these connection wirings 20 may be used as terminals for connection to another printed circuit board, input/output cables or the like. FIG. 1 does not show terminals or terminal parts.

As shown in FIG. 1, each of connection wirings 20 is a part obtained by bending almost perpendicularly a part of each lead frame 17 fixed to sheet-like heat transfer layer 18 formed on metal plate 19. A base of each connection wiring 20 (or particularly a lead frame 17-part that is the base part of connection wiring 20 and that is fixed to heat transfer layer 18) is firmly fixed to heat transfer layer 18 by resin structure 11. Such connection part 100 refers to a structure that is a combination of one screw 22 and one attachment hole 12 fixed by screw 22. It is preferable to provide a plurality of connection parts 100 or provide connection parts 100 in a plurality of portions, respectively around resin structure 11 or the like. With this structure, a strength of heat dissipation structure board 10 can be further increased.

In FIG. 1, resin structure 11 is physically fixed to metal plate 19 of heat dissipation board 16 or a chassis or a housing (both of which are not shown) of a device fixing a main body of heat dissipation board 16, thus constituting heat dissipation structure board 10.

In FIG. 1, a part of or more than a part of each of connection wirings 20 is structured to be penetrated through one wiring hole 13 or the like formed in resin structure 11 as necessary. With this structure, connection wirings 20 bent almost perpendicularly can be, for example, reinforced, prevented from being bent or can be aligned. Further, by using resin structure 11, accuracy of positional dimensions of connection wirings 20 can be improved. Moreover, by penetrating connection wirings 20 through resin structure 11, it is possible to attain an effect of preventing mutual contact.

Concave parts 15a shown in FIG. 1 are portions obtained by denting a part of resin structure 11 and bases of connection wirings 20 are selectively pressed against concave portions 15a by, for example, denting a part of resin structure 11. The details thereof will be described below with reference to FIG. 4B and the like.

Concave parts 15b shown in FIG. 1 are concave portions partially provided on sheet-like heat transfer layer 18 or, for example, portions of traces of providing connection wirings 20 by peeling off a part of each of lead frames 17 fixed so as to be buried in transfer layer 18. By thus peeling off a part of each of lead frames 17, a predetermined creepage distance of insulation can be obtained between metal plate 19 and each lead frame 17 to make it possible to handle a primary circuit.

In FIG. 1, a part of or more than a part of each of lead frames 17 is buried in heat transfer layer 18. This is intended to improve heat dissipation properties and adhesion properties of both heat transfer layer 18 and each of lead frames 17 by increasing a contact area between heat transfer layer 18 and each lead frame 17. Further, by burying a part of or more than a part of each of lead frames 17, even if a thicker member is used, lead frames 17 can prevent a thickness of the thick member from appearing as irregularities on a surface. This can facilitate forming a solder resist (not shown) or the like.

Lead frames 17 are not always buried in heat transfer layer 18. Lead frames 17 may be fixed to a surface of sheet-like or film-like heat transfer layer 18 by an adhesive or the like. The reason is as follows. Even if lead frames 17 are fixed to the surface of heat transfer layer 18 only by the adhesive, resin structure 11 fixes lead frames 17 to a heat transfer layer 18-side, thus constituting heat dissipation structure board 10. As heat transfer layer 18, a layer obtained by adding ceramic powder or the like to thermosetting resin, a highly thermal conductive resin film (such as a polyimide film) formed by a casting method or the like is used.

Although a shape of resin structure 11 is a quadrangle (a shape having opening 14 constituted in a central portion) in FIG. 1, the shape may be a linear shape, an L-shape, a U-shape or the like according to need.

In FIG. 1, attachment holes 12 are formed in peripheral edges of resin structure 11, respectively. By providing attachment holes 12 in the respective peripheral edges, interference of attachment holes 12 with connection wirings 20 extending from heat dissipation board 16 is prevented.

Next, referring to FIG. 2, a manner of setting resin structure 11 onto heat dissipation board 16 to constitute heat dissipation structure board 10 will be described. FIG. 2 is a perspective view describing the manner of setting resin structure 11 onto heat dissipation board 16.

Figure 2:
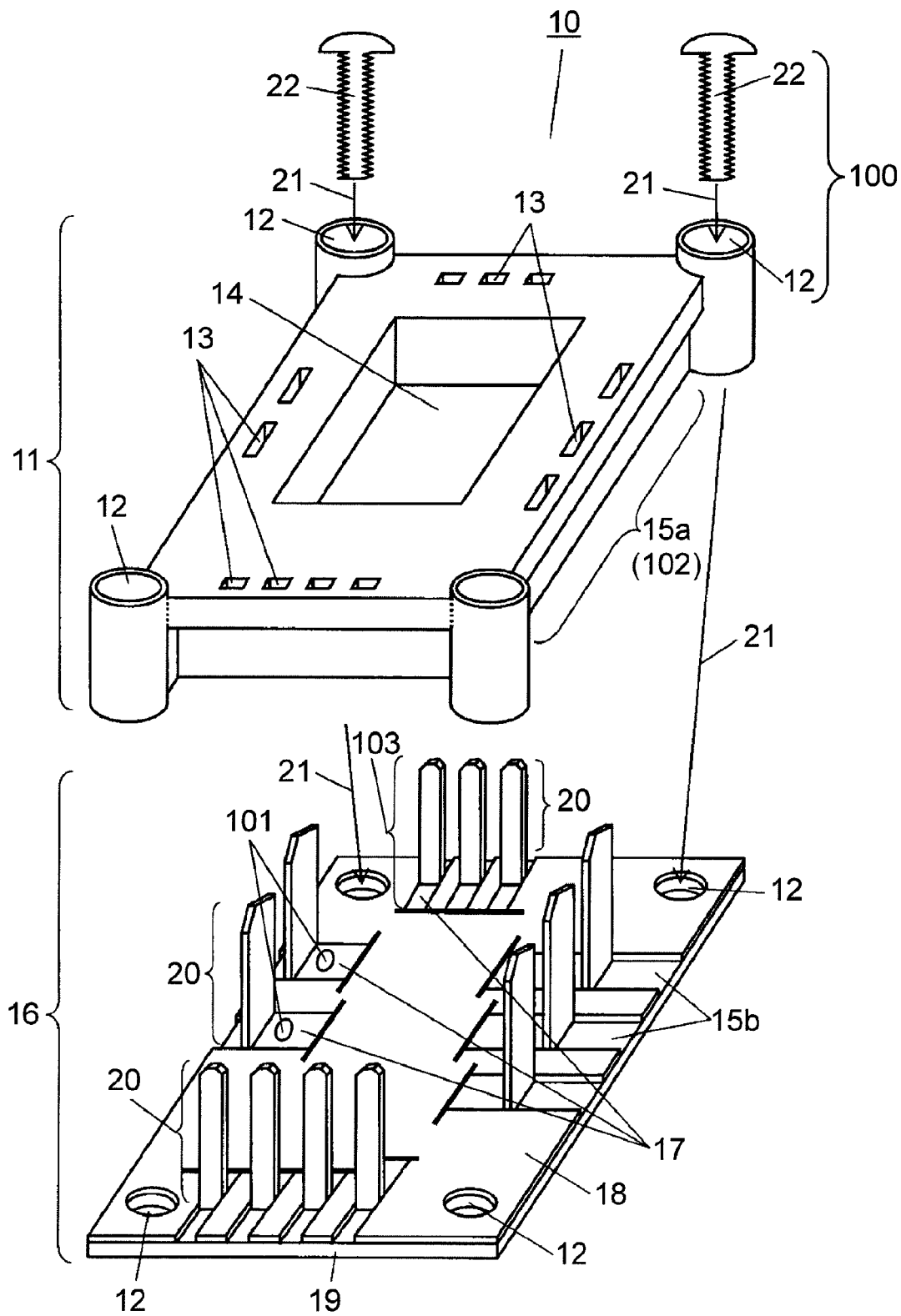
FIG. 2 is a perspective view describing a manner of setting the resin structure onto a heat dissipation board.

In FIG. 2, lead frames 17 of heat dissipation board 16 are fixed onto metal plate 19 via sheet-like heat transfer layer 18. Furthermore, in FIG. 2, a part of each of lead frames 17 (for example, a circuit pattern portion, a power semiconductor portion or the like such as a central portion of heat dissipation board 16 in which portion a power semiconductor is mounted) is not shown. In FIG. 2, heat transfer layer 18 inserted into lower portions of lead frames 17 is not shown, either. Moreover, the solder resist and the like are not shown therein.

In FIG. 2, a part of each of lead frames 17 is bent in, for example, peripheral edges of heat dissipation board 16 so as to be almost perpendicular to metal plate 19 in a state in which lead frames 17 remain parallel to one another. This part is referred to as "connection wiring 20". As indicated by arrow 21 in FIG. 2, resin structure 11 is attached onto heat dissipation board 16 to constitute heat dissipation structure board 10.

It is preferable to provide connection part 100, such as screw 22, connecting resin structure 11 to one of or more of metal plate 19 and heat transfer layer 18 (it is to be noted that "more of" includes both of metal plate 19 and heat transfer layer 18) or any one of or more than one of one of or more of metal plate 19 and heat transfer layer 18 and a chassis of a device fixing metal plate 19 (it is to be noted that the chassis includes a device housing or the like and that neither the chassis nor the housing are shown). Connection part 100 corresponds to, for example, a structure that is a combination of one screw 22 provided on each peripheral edge of resin structure 11 and one attachment hole 12 fixed by screw 22.

Moreover, reinforcement parts 101 or guide parts 102 are provided in resin structure 11 for reinforcing any one of or more than one of an adhesion strength and a peel strength of an interface between a part of or more than a part of each lead frame 17 and heat transfer layer 18, an adhesion strength between heat transfer layer 18 and metal layer 19 and a mechanical strength of each of connection wirings 20. It is to be noted that one reinforcement part 101 is a portion in which resin structure 11 pressure-contacts with each lead frame 17 and that one guide part 102 corresponds to each wiring hole 13 of resin structure 11 shown in FIG. 2. By thus integrally providing connection parts 100 contributing to connection or the like and reinforcement parts 101 contributing to strength reinforcement or the like with one resin structure 11, it is possible to increase not only a strength of heat dissipation board 16 itself but also those of resin structure 11 fixed onto heat dissipation board 16 and heat dissipation structure board 10 itself.

Connection parts 100, reinforcement parts 101 or guide parts 102 may be overlapped with one another or one or more of resin structures 11 may be constituted by combining connection parts 100, reinforcement parts 101 or guide parts 102. Further, it is not always necessary to make connection parts 100, reinforcement parts 101 or guide parts 102 separable. By providing connection parts 100, reinforcement parts 101 or guide parts 102 in one resin structure 11, cost of resin structure 11 can be reduced and attachment work of resin structure 11 can be improved.

As shown in FIG. 2, a tip end of each connection wiring 20 is preferably pointed so as to improve performance of insertion of connection wiring 20 into resin structure 11 or the like. Further, a part of each of lead frames 17 and the like are not shown in FIG. 2.

As shown in FIG. 2, resin structure 11 is fixed to each connection wiring 20 obtained by bending a part of each of lead frames 17 formed on a part of or more than a part of peripheral edges of heat dissipation board 16 to be almost perpendicular to metal plate 19 by using screw 22 or the like as indicated by arrow 21. As a result, resin structure 11 fixed onto metal plate 19 by screws 22 or the like protects lead frames 17 provided on heat dissipation board 16 and increases mechanical strengths of lead frames 17.

It is to be noted that there is no need to provide resin structure 11 in entire peripheral edges of heat dissipation board 16. It suffices to provide resin structure 11 in a necessary part such as a part of (or a side of) the peripheral edges of heat dissipation board 16 or in an interior, for example, a central portion of heat dissipation board 16. A structure of resin structure 11 is designed to cover up lead frames 17, heat transfer layer 18 and the like to be subjected to strength reinforcement. This is because resin structure 11 can structurally press these members or regions by providing resin structure 11 to cover up the members or regions to be subjected to strength reinforcement.

In this way, heat dissipation structure board 10 is configured to include metal plate 19, sheet-like heat transfer layer 18 formed on this metal plate 19, lead frames 17 fixed to this heat transfer layer 18 and one or more resin structures 11 arranged to be superimposed on a part of or more than a part of each of lead frames 17 fixed to heat transfer layer 18. This part of each lead frame 17 is protruded from heat transfer layer 18, thereby constituting one connection wiring 20. Resin structure 11 that includes connection parts 100 by which resin structure 11 is fixed to one of or more than one of metal plate 19 and heat transfer layer 18 or any one of or more than one of one of or more of metal plate 19 and heat transfer layer 18 and a chassis of a device fixing metal plate 19, and guide parts 102 or reinforcement parts 101 reinforcing any one of or more than one of the adhesion strength between a part of or more than a part of each lead frame 17 and heat transfer layer 18, the adhesion strength between heat transfer layer 18 and metal layer 19 and the mechanical strength of each of connection wirings 20, is constituted as a part of heat dissipation structure board 10.

Furthermore, connection parts 100, terminal parts 103 each of which is a part of each lead frame 17 or guide parts 102 (or wiring holes 13) protecting or guiding connection wirings 20 protect, reinforce or guide lead frames 17, connection wirings 20 protruding in a horizontal direction or at an arbitrary angle, terminal parts and the like.

In this way, as compared with adhesion strengths or mechanical strengths of connection wirings 20 and lead frames 17 measured in a state in which resin structure 11 is not provided, the adhesion strengths or mechanical strengths of these parts can be improved by providing resin structure 11 (further in a state in which connection wirings 20 are fixed to any one of or more than one of metal plate 19 and heat transfer layer 18 or any one of or more than one of one of metal plate 19 and heat transfer layer 18 and the chassis of the device fixing metal plate 19). The adhesion strengths and the like can be known by referring to a tension test conducted on electronic components or the like. In this manner, the adhesion strengths and the mechanical strengths are improved and a vibration resistance based on, for example, a vibration test of 10 G to 30 G can be improved.

As shown in FIG. 1 and the like, opening 14 is formed in a central portion of resin structure 11. Opening 14 can be used for an appearance test or the like to be conducted on a heat-generation component (not shown) mounted on heat dissipation board 16.

In this way, wiring holes 13 and attachment holes 12 are appropriately formed in the peripheral edges or the like of resin structure 11. Further, concave parts 15a are formed in outer peripheral portions of wiring holes 13 (particularly in a portion visible from outside). By forming these concave parts 15a, adhesion between resin structure 11 and heat dissipation board 16 or heat dissipation structure 10 is improved. Moreover, an effect of improving performance of insertion of connection wirings 20 into respective wiring holes 13 is produced. Furthermore, even after resin structure 11 is fixed to heat dissipation board 16 to constitute heat dissipation structure board 10, an electric characteristic check can be conducted using these concave parts 15a. It is to be noted that concave parts 15a may be provided as necessary. By making concave parts 15a large, an opening on one side surface of each wiring hole 13 (or wiring hole 13) can be formed into a groove. Alternatively, each wiring hole 13 may be formed into an elongated groove.

Each wiring hole 13 may be formed into a groove instead of a hole. Further, by using wiring holes 13 as guide parts 102, wiring holes 13 serving as guide parts 102 can guide and protect connection wirings 20 each constituted by a part of each lead frame 17 and terminals (part of connection wirings 20) and can increase strengths of connection wirings 20 and the terminals. A tapered guide structure including a guide function may be provided in each of wiring holes 13 and used as a guide part. In this way, guide parts 102 may be identical to wiring holes 13 or may be integrated with wiring holes 13.

Moreover, by inserting connection wirings 20 into respective wiring holes 13, it is possible to attain an effect of correcting bending or strains (or adjusting cores) of connection wirings 20 even if bending, strains or the like remain in a part of connection wirings 20. As a result, as described below with reference to FIG. 6, it is possible to improve the performance of inserting connection wirings 20 into respective wiring holes 13 formed in printed circuit board 24.

Furthermore, by using this resin structure 11, it is possible to increase strengths of connection wirings 20 and the like of heat dissipation board 16 and make metal plate 19 thinner and lighter, accordingly. It is to be noted that reliability of resin structure 11 with respect to heat is improved by forming resin structure 11 out of high heat resistance resin. The reason for using the resin is to use good formability (including that for injection molding or the like) into a predetermined shape and to make resin structure 11 lighter in weight. The resin is also cost effective in light of workability and material cost as compared with ceramic or the like.

While resin structure 11 may be formed out of single resin that can be subjected to injection molding, resin structure 11 may be formed out of a combination of the resin and a metal component or the like. Alternatively, when injection molding is conducted, multicolor molding may be conducted on resin structure 11. In another alternative, resin structure 11 may be molded while integrating the resin with a high-strength material such as metal for an interior, a surface and the like. This can further improve the mechanical strength. In still another alternative, resin structure 11 may be constituted by a plurality of divided components. By providing resin structure 11 constituted by one or more connection wirings 20 or a combination of a plurality of components, resin structure 11 can correspond to various kinds of heat dissipation structure boards, thereby keeping a lid on cost.

Moreover, by elaborating a method of attaching or fixing resin structure 11 onto heat dissipation board 16, not only a tensile strength of each lead frame 17 on heat dissipation board 16 or heat dissipation structure board 10 but also a pressing strength, a torsion strength or a strength with respect to vibration resistance or the like can be increased (or reinforced). A filling factor of an inorganic filler or the like in heat transfer layer 18 can be improved and heat dissipation performance of heat dissipation board 16 can be improved by as much as this reinforcement effect. This is because a filling factor of a resin component in heat transfer layer 18 decreases and an adhesive force between heat transfer layer 18 and lead frames 17 possibly decreases as the filling factor of the inorganic filler in heat transfer layer 18 increases.

A structure of a pressing part of resin structure 11, a method of attaching the pressing part and the like are designed to provide an optimum shape according to purposes.

Heat dissipation structure board 10 may be heat dissipation structure board 10 configured to include metal plate 19; heat transfer layer 18 provided on this metal layer 19; lead frames 17 each including terminal part 103, parts other than this terminal parts 103 being fixedly attached to heat transfer layer 18; and resin structure 11 connected to upper surfaces of the parts of lead frames 17 other than the terminal parts, wherein resin structure 11 includes connection parts 100 connecting resin structure 11 to metal plate 19 or a member to which metal plate 19 is connected; and guide parts 102 (such as wiring holes 13 in FIG. 2 or the like) guiding terminal part 103 provided on each lead frame 17. It is to be noted that each connection wiring 20 is a part of terminal part 103. This is because both connection wiring 20 and terminal part 103 can be used properly according to usage purposes or the like. Resin structure 11 guides any one of or more than one of terminal parts 103 and connection wirings 20, whereby strengths of terminal parts 103 and connection wirings 20 can be increased and workability such as insertion performance can be improved.

Connection wirings 20 are arranged to be superimposed on lead frames 17 fixed to heat transfer layer 18, whereby resin structure 11 can directly press connection wirings 20 against heat transfer layer 18 and the strengths of connection wirings 20 (or terminal parts 103) and the like can be increased.

Furthermore, resin structure 11 includes connection parts 100 (for example, attachment holes 12 shown in FIG. 1) connected to one of or more than one of metal plate 19 and heat transfer layer 18 or any one of or more than one of one of or more than one of metal plate 19 and heat transfer layer 18 and the chassis of the device fixing metal plate 19, and reinforcement parts 101 reinforcing any one of or more than one of the adhesion strength between a part of or more than a part of each of lead frames 17 and heat transfer layer 18, the adhesion strength between heat transfer layer 18 and metal plate 19 and the mechanical strength of each of connection wirings 20. It is thereby possible to increase not only strengths of entirety of heat dissipation board 16 and heat dissipation structure board 10 but also those of connection wirings 20 (or terminals 103 each constituted by a part of each lead frame 17).

In this way, resin structure 11 can increase any one of or more than one of the adhesion strength between a part of or more than a part of each lead frame 17 and heat transfer layer 18, the adhesion strength between heat transfer layer 18 and metal plate 19 and the mechanical strength of each connection wiring 20. Such reinforcement parts 101 correspond to, for example, concave parts 15b formed in connection wirings 20 shown in FIG. 1, respectively. Reinforcement parts 101 are intended to cause concave parts 15a provided in resin structure 11 to press lead frames 17 against heat transfer layer 18.

In this way, by providing each of connection parts 100 and each of reinforcement parts 101 of resin structure 11 both as a part of one connection wiring 20, mechanical connection strengths of these regions can be increased.

In FIG. 1, any one of or more than one of (or a part of or more than a part of) connection wirings 20, terminal parts 103 and the like are formed in the peripheral edges (or a part of the peripheral edges) of heat dissipation board 16 and heat transfer layer 18, and connection wirings 20 (or the terminal parts thereof) are bent from heat transfer layer 18 almost perpendicularly. This is useful, for example, for securing the creepage distance of insulation between metal plate 19 and each connection wiring 20.

There is no need to provide heat dissipation board 16 and resin structure 11 integrally. By separately preparing these members, electronic components such as a power semiconductor for which it is necessary to dissipate heat can be attached onto on heat dissipation board 16 or heat dissipation structure board 10 after being mounted thereon by soldering or the like. In this manner, resin structure 11 is structured to be able to be attached later onto heat dissipation board 16 or heat dissipation structure board 10. With this structure, connection wirings 20 are free from an adverse effect of soldering or the like and resin structure 11 does not obstruct an operation for soldering the power semiconductor and the like. Further, while connection wirings 20 may be fixed to heat dissipation board 16 or heat dissipation structure board 10 by adhesive or the like, connection wirings 20 may be fixed thereto in a detachable state using screws 22. By fixing connection wirings 20 in the detachable state, workability such as maintainability can be improved.

Second Embodiment

An example of a method of manufacturing heat dissipation board 16 or heat dissipation structure board 10 described in the first embodiment will be described as a second embodiment with reference to FIGS. 3A, 3B, 4A and 4B.

Figure 3A:
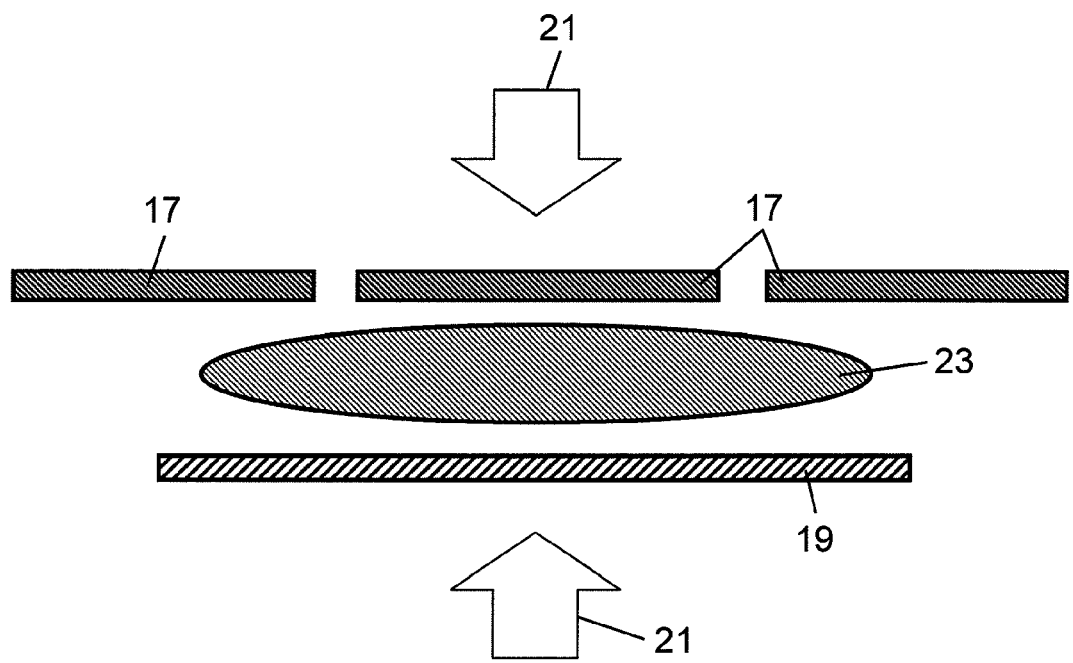
FIG. 3A is a cross-sectional view describing an example of a method of manufacturing the heat dissipation board.
Figure 3B:
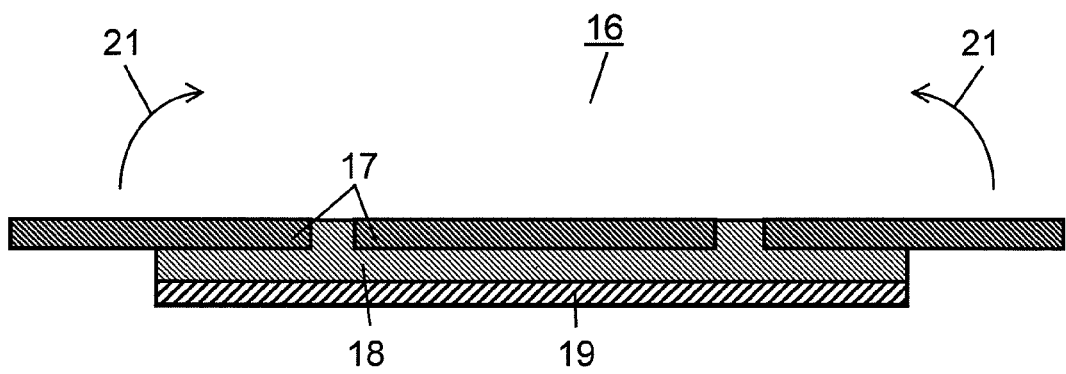
FIG. 3B is a cross-sectional view describing the example of the method of manufacturing the heat dissipation board.

Both FIGS. 3A and 3B are cross-sectional views describing an example of a method of manufacturing heat dissipation board 16.

First, as show in FIG. 3A, heat transfer resin 23 is set on metal plate 19 and lead frames 17 worked into a predetermined pattern shape are set on heat transfer resin 23. As indicated by arrow 21, these heat transfer resin 23 and lead frames 17 are integrated by being heated and pressed using a die and a press (both of which are not shown). Further, heat transfer resin 23 is hardened, thus providing heat transfer layer 18.

FIG. 3B is a cross-sectional view showing a state after hardening heat transfer resin 23 into heat transfer layer 18. As shown in FIG. 3B, a part of or more than a part of each lead frame 17 that constitutes heat dissipation board 16 is buried in heat transfer layer 18. In this manner, a contact area between each lead frame 17 and heat transfer layer 18 is increased and heat generated by a power semiconductor (not shown) mounted in each lead frame 17 is dissipated from lead frame 17 to metal plate 19 via heat transfer layer 18. In addition, a bonding strength (or peel strength) of bonding (or peeling) each lead frame 17 to (or from) heat transfer layer 18 is increased.

Figure 4A:
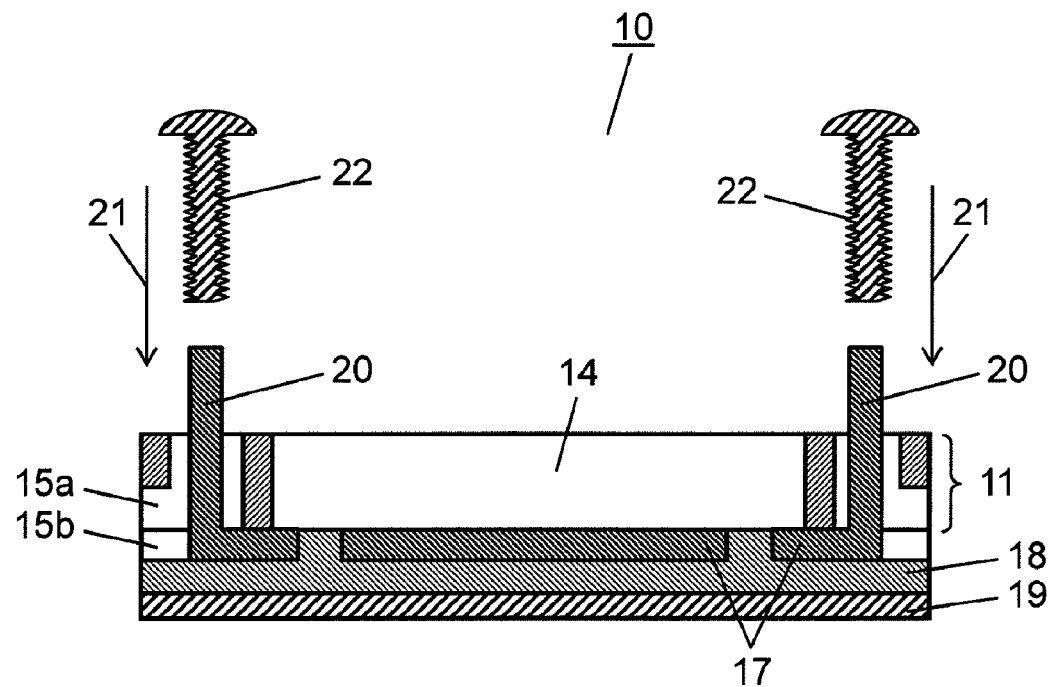
FIG. 4A is a cross-sectional view describing an example of a method of manufacturing the heat dissipation structure board with connection wiring parts reinforced.

Next, as indicated by arrow 21 in FIG. 3B, a part of each lead frame 17 is bent almost perpendicularly to metal plate 19 or the like, thus providing a shape shown in FIG. 4A.

Figure 4B:
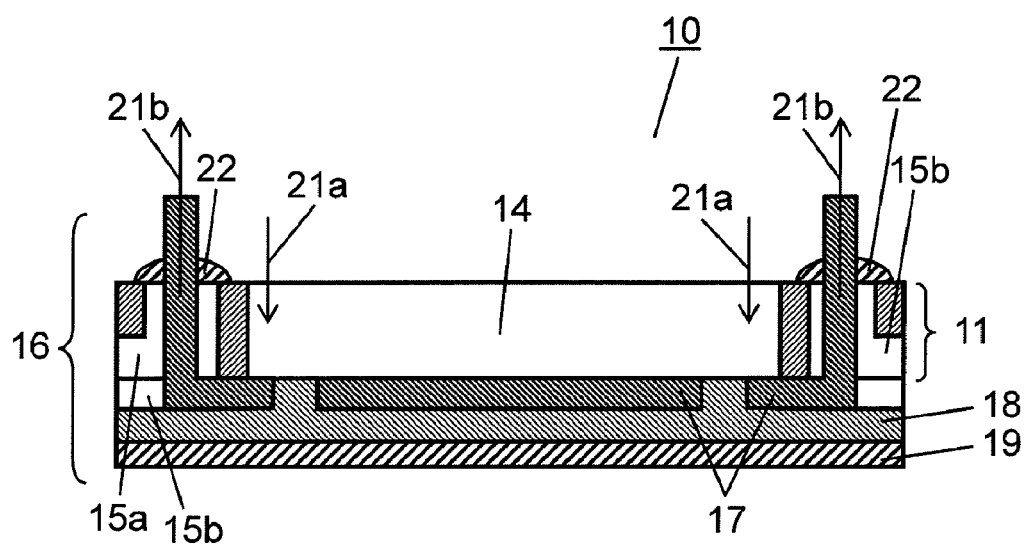
FIG. 4B is a cross-sectional view describing the example of the method of manufacturing the heat dissipation structure board with the connection wiring parts reinforced.

FIGS. 4A and 4B are cross-sectional views each showing an example of a method of manufacturing heat dissipation board 16 with connection wirings 20 reinforced.

In FIG. 4A, a part of each lead frame 17 buried in heat transfer layer 18 is pulled up (or peeled off) to provide connection wiring 20 or a terminal part (not shown). The part peeled off from heat transfer layer 18 is defined as concave part 15b and as a creepage distance of insulation between metal plate 19 and connection wiring 20, thereby improving insulation properties. While the peeled part is bent almost perpendicularly to provide connection wiring 20 in FIGS. 4A and 4B, a bending angle of the peeled part (or whether to bend the part or not) is selected according to purposes.

Next, as shown in FIG. 4B, resin structure 11 is set on heat dissipation board 16 and resin structure 11 is fixed to heat dissipation board 16 using screws 22 as indicated by arrow 21, thus providing heat dissipation structure board 10. In FIG. 4B, each screw 22 is shown in a rear side of each connection wiring 20. This is intended to prevent shorting from occurring between metal screw 22 and connection wiring 20. Preferably, a screw made of a high-strength and excellent heat transfer material such as metal is used as each screw 22. If screws 22 require high strength, thick screws at M3 or higher, M4 or higher or M6 or higher are used. It is to be noted that M3 and the like are JIS standards for screws 22.

As shown in FIG. 4B, concave parts 15a and 15b are formed in parts of resin structure 11 (for example, in parts of an outer peripheral surface of resin structure 11 or parts of the outer peripheral surface thereof which parts come into contact with heat dissipation board 16). With this structure, it is possible to easily confirm, for example, whether or not lead frames 17 can be inserted into respective wiring holes 13 formed in resin structure 11. Furthermore, adhesion between resin structure 11 and each lead frame 17 can be thereby improved.

Reinforcement of strengths of connection wirings 20 and the like of heat dissipation board 16 (or heat dissipation structure board 10) will next be described. As shown in FIG. 4B, a base of each connection wiring 20 of heat dissipation board 16 is firmly fixed to resin structure 11, thereby making it possible to reinforce the strength of each connection wiring 20. It is to be noted that the base includes neighborhoods of the base. The neighborhoods of the base are defined as regions with radii not more than 10 millimeters (mm) from a position at which connection wiring 20 is bent (or a location at which strength reinforcement by resin structure 11 is desired). Even if resin structure 11 presses a position away by a radius greater than 10 mm from the bent position or the location at which strength reinforcement is desired, a predetermined strength reinforcement effect is not often obtained.

As shown in FIG. 4B, each connection wiring 20 formed in heat dissipation board 16 is fitted into resin structure 11. Furthermore, using screws 22 or the like, resin structure 11 is mechanically fixed onto metal plate 19 and the like of heat dissipation board 16, thus providing heat dissipation structure board 10. Arrow 21a shown in FIG. 4B indicates "a pressing force" generated by each screw 22 and resin structure 11. Arrow 21b indicates an external force applied to each connection wiring 20 from outside or the like. For example, even if the external force indicated by arrow 21b, for example, a tensile force indicated by arrow 21b is generated, the force can be cancelled by the pressing force indicated by arrow 21a. As a result, the external force (such as the tensile force) is not transmitted to an interface between each lead frame 17 and heat transfer layer 18, an interface between heat transfer layer 18 and metal plate 19 or both of the interfaces. Due to this, it is possible to prevent occurrence of peeling, for example, peeling at the interface between each lead frame 17 and heat transfer layer 18.

It is to be noted that concave part 15a shown in FIG. 4A and the like is obtained by opening or denting one side surface of or more than one side surface of each wiring hole 13 formed in resin structure 11. In this way, by forming concave part 15a in a part of resin structure 11, a fixing strength of fixing resin structure 11 to each lead frame 17 can be reinforced. The reason is as follows. Even if a warp or a swell is generated on heat dissipation board 16, resin structure 11 or the like, resin structure 11 reliably comes into contact with each lead frame 17 on a side on which no concave part 15a or 15b is provided, that is, on lead frame 17-side.

Figure 5A:
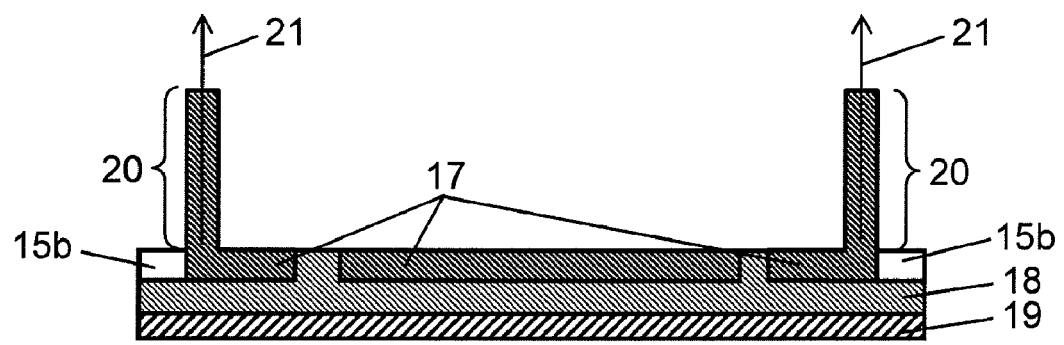
FIG. 5A is a cross-sectional view describing peeling of an interface at a base of each connection wiring of the heat dissipation board if no resin structure is provided.
Figure 5B:
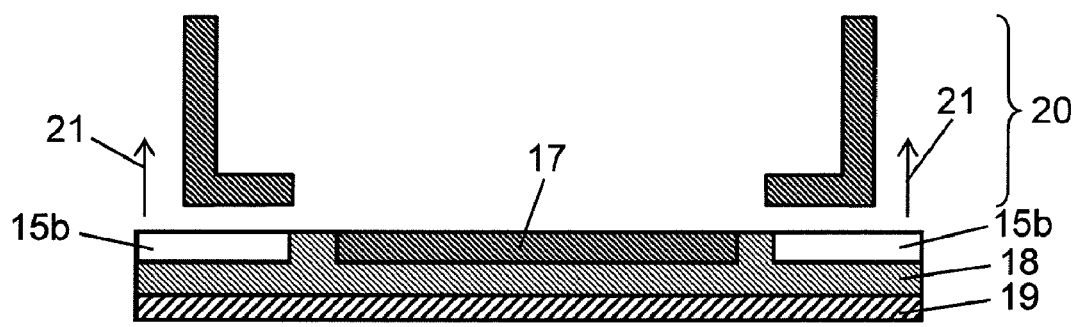
FIG. 5B is a cross-sectional view describing peeling of the interface at the base of each connection wiring of the heat dissipation board if no resin structure is provided.

Next, peeling of the interface near the base of each connection wiring 20 or peeling of the interface between each lead frame 17 and heat transfer layer 18 will be described with reference to FIGS. 5A and 5B. FIGS. 5A and 5B are both cross-sectional views describing peeling of the interface at the base of each connection wiring 20 of heat dissipation board 16 or heat dissipation structure board 10 in a case where no resin structure 11 is provided.

FIG. 5A is a cross-sectional view describing a case where the tensile force indicated by arrow 21 is generated in each connection wiring 20 of heat dissipation board 16 or heat dissipation structure board 10.

FIG. 5B is a cross-sectional view describing a manner in which each connection wiring 20 is peeled off from heat dissipation board 16 by the tensile force. If quite a high tensile force is generated in a vibration test or the like, connection wiring 20 is possibly peeled off at the interface between each lead frame 17 and heat transfer layer 18 as shown in FIG. 5B.

On the other hand, as shown in FIG. 4B and the like, heat dissipation structure board 10 according to the present invention is constituted by reinforcing and fixing a part of heat dissipation board 16 by resin structure 11. With this structure, the external force is not transmitted to the interface between each lead frame 17 and heat transfer layer 18 and the like, so that peeling is prevented at these interfaces. In this way, by fixing resin structure 11 onto metal plate 19 and the like by screws 22 or the like, any one of or more than one of a bonding strength of bonding a part of or more than a part of each lead frame to heat transfer layer 18, a bonding strength of bonding heat transfer layer 18 to metal plate 19 and a mechanical strength of each connection wiring 20 are reinforced.

As described above, heat dissipation structure board 10 capable of reinforcing strengths of lead frames 17, the interfaces between lead frames 17 and heat transfer layer 18 and the like by a method of manufacturing heat dissipation structure board 10, the heat dissipation structure board 10 including metal plate 19; sheet-like heat transfer layer 18 formed on this metal plate 19; lead frame 17 fixed to this heat transfer layer 18; and one of or more than one of resin structures 11 arranged to be superimposed on a part of or more than a part of lead frame 17 fixed to heat transfer layer 18, the method including steps of: protruding the part of this lead frame 17 from heat transfer layer 18 or bending the part of lead frame 17 almost perpendicularly to provide connection wiring 20 or the terminal part; and fixing resin structure 11 to any one of or more than one of metal plate 19 and heat transfer layer 18 or any one of or more than one of any one of or more than one of metal plate 19 and heat transfer layer 18, a chassis of a device fixing metal plate 19 and a member to which metal plate 19 is connected.

Third Embodiment

Members used for heat dissipation board 16, heat dissipation structure board 10 or the like will be described as a third embodiment.

As each of lead frames 17, a member made of such a material having high heat conductivity as copper or aluminum is preferably used. A thickness of each lead frame 17 is preferably not less than 0.2 mm (more preferably, not less than 0.3 mm). If the thickness of each lead frame 17 is less than 0.2 mm, there is a probability that a strength of each connection wiring 20 falls and connection wiring 20 is bent or deformed during operation.

Furthermore, the thickness of each lead frame 17 is preferably not more than 10.0 mm (more preferably, not more than 5.0 mm). If the thickness of each lead frame 17 exceeds 10.0 mm, the thickness may possibly influence formation of each connection wiring 20 into a fine pattern.

If thick lead frame 17 (at the thickness, for example, not less than 0.2 mm or preferably not less than 0.3 mm) is used while burying a part of or more than a part of lead frame 17 in heat transfer layer 18, the thickness does not appear as irregularities on a surface of heat dissipation board 16. Due to this, a printing performance for printing a solder resist (not shown) on each lead frame 17 can be improved.

Heat transfer resin 23 will next be described. Heat conductivity of heat transfer resin 23 can be improved, for example, by using resin and filler as heat transfer resin 23. Further, reliability of heat transfer resin 23 can be improved by using thermosetting resin as the resin.

In this case, inorganic filler having, for example, a generally spherical shape and a diameter not less than 0.1 micrometer and not more than 100 micrometers is appropriate as the filler. If the diameter is less than 0.1 micrometer, it is difficult to disperse the filler into the resin. If the diameter exceeds 100 micrometers, transfer layer 18 becomes thick and the thickness of transfer layer 18 influences thermal diffusion performance. In the third embodiment, the filler made of a mixture of two types of alumina, that is, one with an average grain size of three micrometers and the other with an average grain size of 12 micrometers is used as the inorganic filler. By using the alumina of the large grain size and that of the small grain size, the alumina of the small grain size can be filled up into gaps among the alumina of the large grain size and the alumina can be filled up at high concentration close to 90 weight %. As a result, the heat conductivity of heat transfer layer 18 becomes about 5 W/(m·K).

As the inorganic filler, the inorganic filler containing at least one type selected from among alumina, magnesium oxide, boron nitride, silicon nitride, silicon carbide, aluminum nitride, zinc oxide, silica, titanium oxide, tin oxide and zirconium silicate is preferable in view of heat conductivity and cost.

If the thermosetting resin is used, it is preferable to contain at least one type of thermosetting resin selected from among a group consisting of epoxy resin, phenol resin, cyanate resin, polyimide resin, aramid resin and PEEK resin. This is because these resins are excellent in heat resistance and electric insulation properties.

On the other hand, to further improve heat dissipation properties of heat transfer layer 18, it is necessary to increase a content of the inorganic filler. As a result, a content of the thermosetting resin in heat transfer layer 18 is possibly reduced. If the content of the thermosetting resin in heat transfer layer 18 is reduced, a bonding force between heat transfer layer 18 and each lead frame 17 possibly falls. As a result, an interface between heat transfer layer 18 and each lead frame 17 on heat dissipation board 16 possibly peels off.

However, according to the present invention, heat dissipation board 16 or heat dissipation structure board 10 is structured so that resin structure 11 physically presses each lead frame 17 or particularly each lead frame 17 or the like near a base of each connection wiring 20 against heat transfer layer 18. A physical strength of the physically pressed part is thereby reinforced and it is possible to prevent peeling of the interface between heat transfer layer 18 and each lead frame 17 and the like on heat dissipation board 16 or heat dissipation structure board 10.

Fourth Embodiment

A case where a module is constituted by combining heat dissipation board 16 or heat dissipation structure board 10 described in the first embodiment with a printed circuit board will be described as a fourth embodiment.

Figure 6:
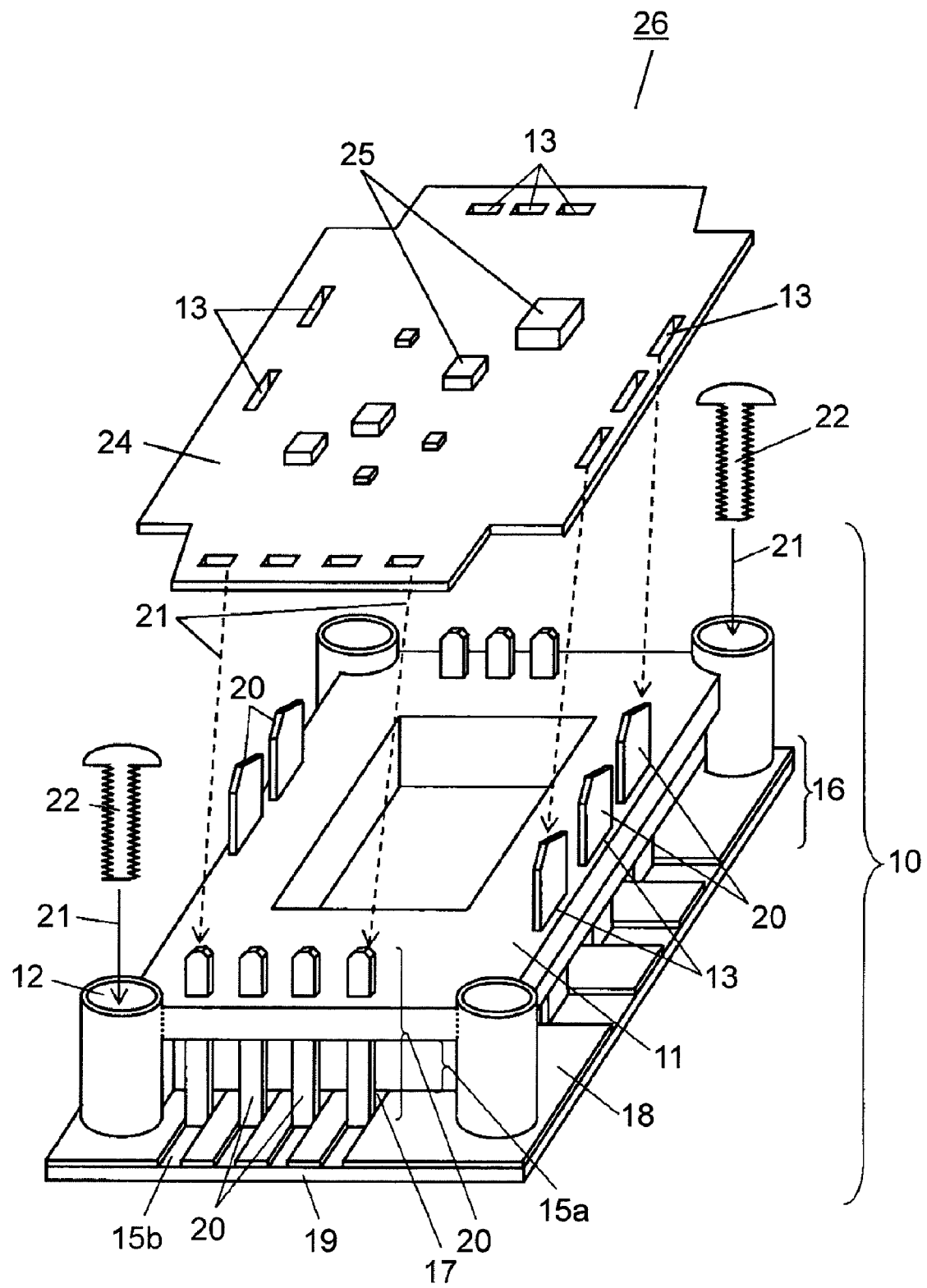
FIG. 6 is a perspective view describing a manner of fixing a printed circuit board onto a heat dissipation structure board reinforced by a resin structure.

FIG. 6 is a perspective view describing a manner of fixing a printed circuit board onto heat dissipation board 16 reinforced by resin structure 11.

In FIG. 6, resin structure 11 protects bases and neighborhoods of connection wirings 20 formed on heat dissipation board 16. Resin structure 11 is fixed onto metal plate 19, a housing below metal plate 19 and the like by screws 22 or the like. Arrow 21 indicates that wiring holes 13 formed in printed circuit board 24 are set to connection wirings 20, respectively, thereby providing module 26.

In this way, formed is module 26 including: a heat dissipation board 16-part including metal plate 19; sheet-like heat transfer layer 18 formed on this metal plate 19; lead frames 17 fixed to this heat transfer layer 18; connection wirings 20 each obtained by bending a part of each of lead frames 17 almost perpendicularly to heat transfer layer 18; and resin structure 11 fixing a part of or more than a part of each of these connection wirings 20; and a printed circuit board 24-part, wherein a part of or more than a part of each connection wiring 20 is pressed against heat transfer layer 18 by resin structure 11, a part of or more than a part of a tip end of each connection wiring 20 (the tip end is a part above a central portion of connection wiring 20 whereas a part below the central portion thereof is a part constituting the base of connection wiring 20) is connected to the printed circuit board 24-part is formed.

In FIG. 6, the number of printed circuit boards 24 is one or more. For example, a plurality of printed circuit boards 24 may be connected and stacked by common connection wirings 20 while being spaced apart from one another at a certain distance. By thus connecting a plurality of printed circuit boards 24 by connection wirings 20 each constituted by a part of each lead frame 17, printed circuit boards 24 can be connected at a smallest distance and noise generation can be reduced. Further, fixing strength of printed circuit boards 24 can be increased.

A power device such as a power transistor or a power semiconductor handling high current exceeding 100 A and, therefore, accompanied by heat generation (it is to be noted that the power device such as a power FET or the power transistor is not shown in FIG. 7) is fixed to a heat dissipation board 16-side, for example, a surface of each lead frame 17. Furthermore, ordinary electronic components 25 or the like controlling the power device or the like are fixed to a printed circuit board 24-side. A plurality of heat dissipation boards 16 and a plurality of printed circuit boards 24 are connected in vertical direction (or perpendicular direction or thickness direction). This vertical connection is made by connection wirings 20 each obtained by bending each lead frame 17 that is a wiring pattern of heat dissipation board 16 almost perpendicularly, thereby making it possible to reduce a pulling length (line length) between circuits and to, therefore, improve noise resistance characteristics of finished circuits. This is because it is difficult that connection wirings 20 or the like serve as an antenna capturing external noise by as much as reduction in the line length.

In this way, provided is module 26 including: heat dissipation board 16 including: metal plate 19; sheet-like heat transfer layer 18 formed on this metal plate 19; lead frames 17 fixed to this heat transfer layer 18; and connection wirings 20 each obtained by bending a part of each of lead frames 17 almost perpendicularly to heat transfer layer 18; one or more connection wirings 20 fixing or guiding at least one of or more than one of or a part of or more than a part of each of lead frames 17, each of terminal parts 103 and each of connection wirings 20; and one or more printed circuit boards 24 almost parallel to metal plate 19 and provided on a different surface from a surface on which metal plate 19 of connection wirings 20 is provided, wherein printed circuit boards 24 are electrically connected to a part of or more than a part of each connection wiring 20 (which may be a terminal part of each connection wiring 20), and wherein resin structure 11 includes a structure part fixed to any one of or more than one of metal plate 19 and heat transfer layer 18 or any one of or more than one of any one of or more than one of metal plate 19 and heat transfer layer 18 and a chassis of a device fixing metal plate 19.

Furthermore, resin structure 11 is fixed to metal plate 19 or the chassis (not shown) holding metal plate 19 by one or more (preferably a plurality of) attachment holes 12 provided in metal plate 19, and resin structure 11 is constituted into a heat dissipation board holding connection wirings 20 or a part of or more than a part of each printed circuit board 24 connected to connection wirings 20. It is thereby possible to hold printed circuit boards 24 with high strength and reinforce strength of module 26.

If heat dissipation board 16 and printed circuit boards 24 are arranged almost parallel to each other, connection wirings 20 are preferably bent almost perpendicularly as shown in FIG. 6 and the like. Otherwise, a bending angle and the like of connection wirings 20 may be changed according to purposes.

Figure 7A:
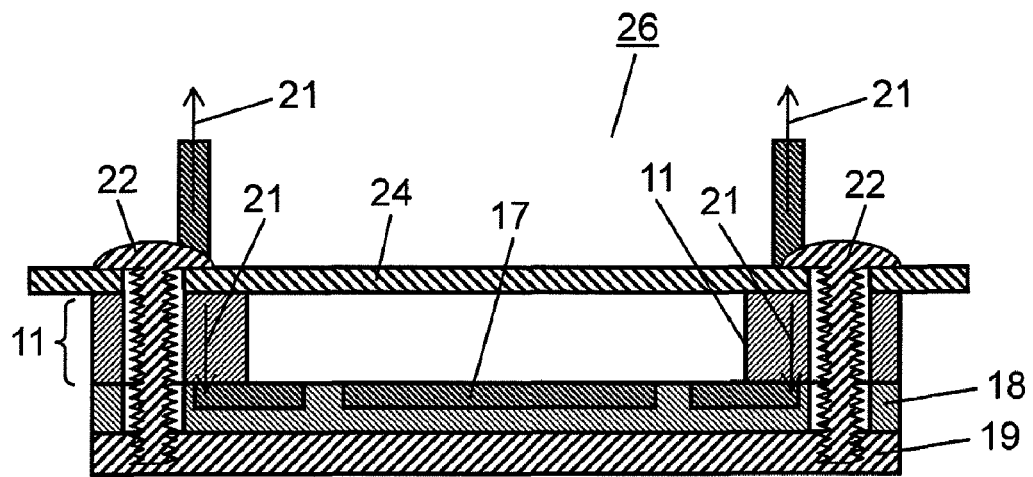
FIG. 7A is a cross-sectional view describing a mechanism of reinforcing a strength of a module using the resin structure.
Figure 7B:
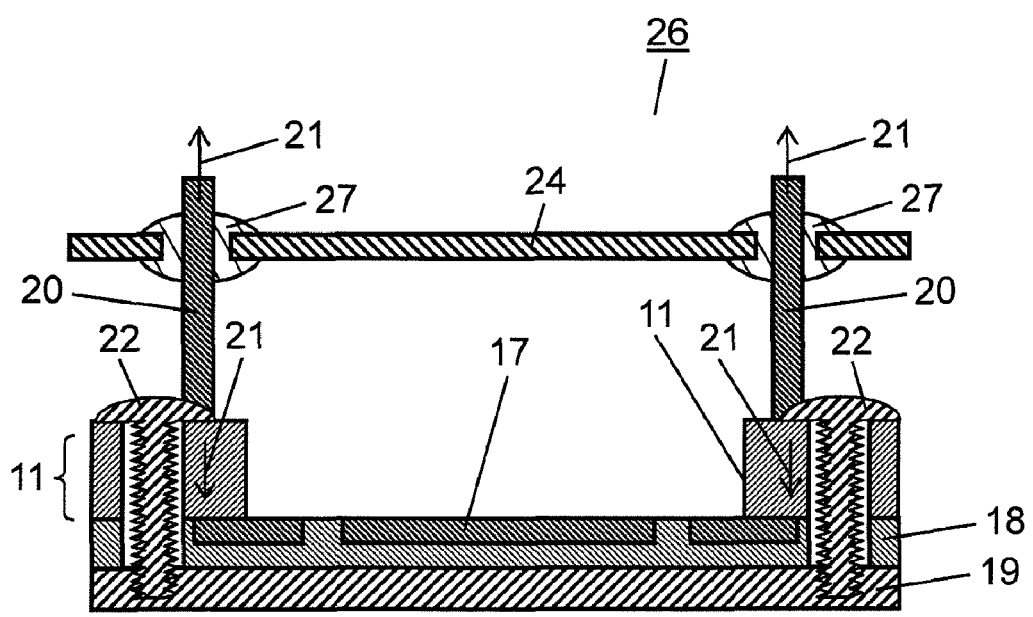
FIG. 7B is a cross-sectional view describing the mechanism of the reinforcing the strength of the module using the resin structure.

Referring to FIGS. 7A and 7B, a manner of reinforcing the strength of module 26 using resin structure 11 will next be described.

FIGS. 7A and 7B are cross-sectional views describing a mechanism of reinforcing a strength of module 26. In FIGS. 7A and 7B, each through-hole or the like formed in printed circuit board 24 is connected to each of connection wirings 20 by a solder 27 (solder 27 including a lead-free solder, for which even a conductive adhesive or the like is regarded as a type of a solder as long as it functions to be substituted for the solder).

It is to be noted that each printed circuit board 24 may be multilayer printed circuit board 24 and that each wiring hole 13 may include a through-hole or a plated through-hole. In FIGS. 7A and 7B, a copper foil pattern, the through-holes and the like formed on or in a surface layer or an inner layer of each printed circuit board 24 are not shown.

If each wiring hole 13 of printed circuit board 24 is to be connected to each connection wiring 20 inserted into this wiring hole 13 by solder 27, excessive solder 27 often drips or flows downward. In such a case, as shown in FIG. 27B to be described below, a gap is formed between printed circuit board 24 and resin structure 11, thereby making it possible to control flow of solder 27 and to make a visual inspection.

As described above, heat dissipation board 16 configured so that a part of or more than a part of each of connection wirings 20 or resin structure 11 is formed on a part of or more than a part of heat dissipation board 16 and so that each connection wiring 20 is bent almost perpendicularly to heat transfer layer 18, whereby connection reliability and fixing strength of fixing heat dissipation board 16 to each printed circuit board 24 can be improved or increased. If each connection wiring 20 is bent almost perpendicularly, it is preferable that a bending angle of connection wiring 20 is not more than 90 degrees plus 10 degrees or 90 degrees minus 10 degrees. If the bending angle is greater than 90 degrees plus 10 degrees or 90 degrees minus 10 degrees, it is often difficult to insert each connection wiring 20 into each attachment hole 12 provided in resin structure 11.

FIG. 7A describes a manner of fixing resin structure 11 including each printed circuit board 24 to heat dissipation board 16 by screws 22 or the like. As shown in FIG. 7A, each printed circuit board 24 is similarly fixed directly to metal plate 19 or a chassis or the like (not shown) of a device fixing metal plate 19 by screws 22 or the like.

FIG. 7B is a cross-sectional view describing a case of separating each printed circuit board 24 from resin structure 11. In FIG. 7B, printed circuit boards 24 are fixed using connection wirings 20 of heat dissipation board 16 partially reinforced by resin structure 11. In this manner, even if a tensile force is generated on a printed circuit boards 24-side, a pressing force generated by screws 22 or the like presses resin structure 11 against heat dissipation board 16 and thereby cancels this tensile force.

It is to be noted that heat generated from the power semiconductor or the like spreads via lead frames 17 and spreads toward metal plate 19 for heat dissipation via heat transfer layer 18 excellent in heat conductivity. As a result, it is difficult to transmit the heat generated from the power semiconductor or the like to printed circuit boards 24, thereby suppressing thermal influence on ordinary electronic components 25 or the like mounted in each printed circuit board 24.

It is to be noted that connection wirings 20 can be positioned with high accuracy using resin structure 11 and that connectivity of a plurality of connection wirings 20 to printed circuit boards 24 is improved.

Attachment positions or the like of screws 22 may be set to appropriate positions according to a size and a shape of module 26. Furthermore, by designing the attachment positions of screws 22 and a shape of resin structure 11 to have optimum values according to various components to be used, strength and vibration resistance can be increased or improved.

Moreover, a method of fixing resin structure 11 is not limited to the method using screws 22 but may be a method using a structure (for example, a clutch structure, a hook structure or a wedge structure) formed in a part of resin structure 11 or the like.

While the power semiconductor and the like mounted in heat dissipation board 16 can be visually inspected by forming opening 14 in a central portion or the like of resin structure 11, it is not always necessary to form opening 14 in resin structure 11.

Furthermore, entire heat dissipation board 16 or heat dissipation structure board 10 can be structurally formed into a kind of frame (rigid-framed) structure by using resin structure 11 and fixing resin structure 11 further by screws 22 or the like. It is possible to reinforce strength of entire heat dissipation board 16 or heat dissipation structure board 10 (and to improve the vibration resistance thereof). Moreover, since resin structure 11 is easily replaceable, repair, maintenance, replacement or the like can be easily made and practicability can be, therefore, enhanced.

Fifth Embodiment

A manner of fixing an electronic component such as a large-sized component or an odd-shaped component (hereinafter, "odd-shaped electronic component"), for example, a transformer, a choke or a connector using resin structure 11 described with reference to FIG. 1 and the like will be described as a fifth embodiment with reference to the drawings.

Figure 8A:
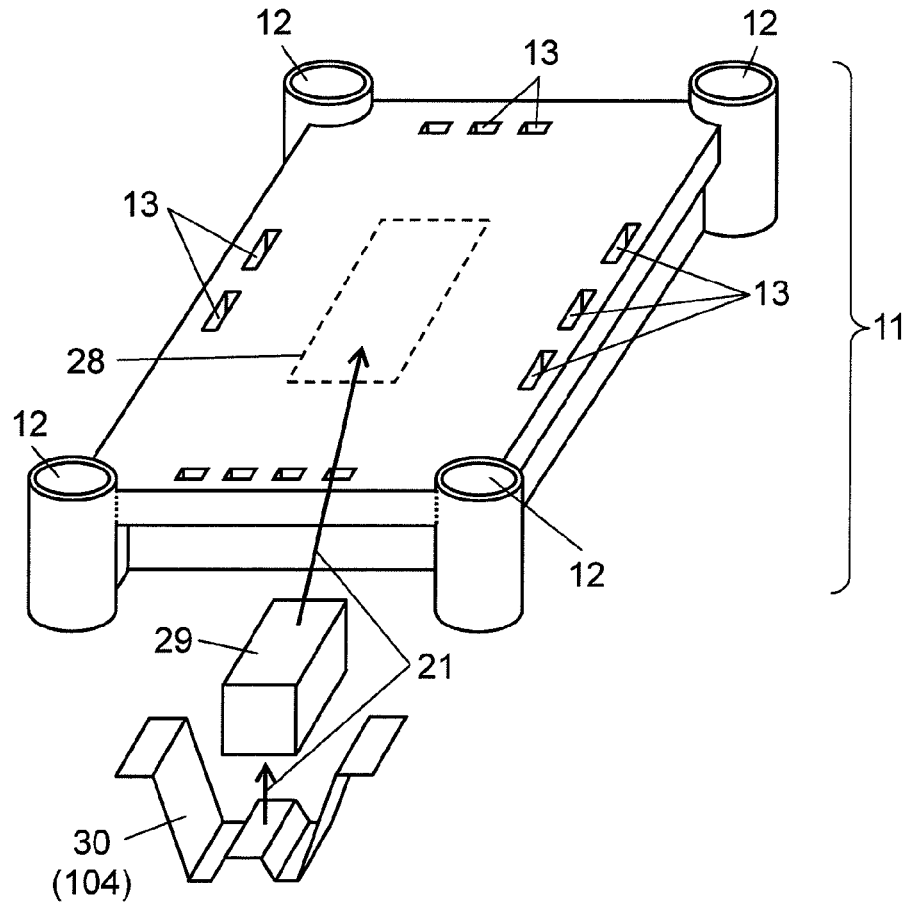
FIG. 8A is a perspective view of a manner of fixing an odd-shaped electronic component to a resin structure.
Figure 8B:
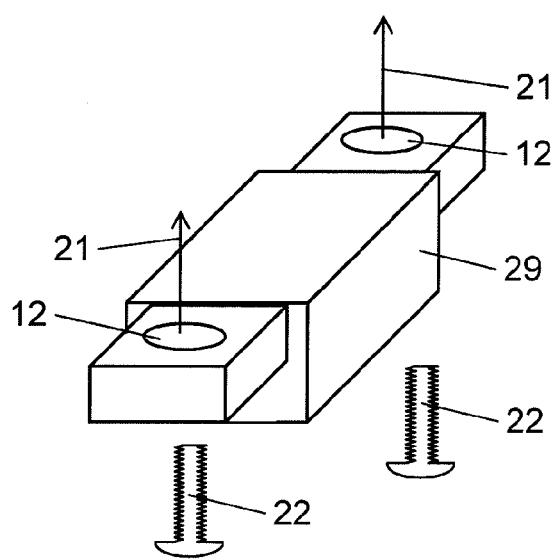
FIG. 8B is a perspective view showing a manner of providing an attachment hole in a part of the odd-shaped electronic component.

FIGS. 8A and 8B are perspective views showing a manner of fixing odd-shaped electronic component 29 using fixing member 30 serving as a holding part.

FIG. 8A is a perspective view showing a manner of fixing odd-shaped electronic component 29 to one surface or more than one surface of resin structure 11 using fixing member 30. Dotted line 28 in FIG. 8A indicates a part to which odd-shaped electronic component 29 is fixed, for example, a rear surface of resin structure 11 or a heat dissipation board 16-side of resin structure 11. While fixing member 30 serving as the holding part may be a metal fitting (for example, a spring or a stopper), screw 22 or the like, examples of fixing member 30 may include adhesive or the like or a combination of the metal fitting or the like and the adhesive (including a double-sided tape) or the like may be used as fixing member 30. Further, it is useful to provide irregularities or the like on the surface of resin structure 11 so as to facilitate attaching or fixing odd-shaped electronic component 29.

"Odd-shaped electronic component 29" is defined as a general term of a transformer, a coil component such as a choke coil, an electric double layer capacitor or a battery device such as a lithium ion battery or a large-sized, an odd-shaped or a heavy electronic component. It is to be noted that an electronic component such as a chip component that can be surface-mounted on printed circuit board 24 is referred to as "ordinary electronic component 25". A power semiconductor or the like may be either ordinary electronic component 25 or odd-shaped electronic component 29. If resin structure 11 increases or improves an attachment strength and vibration resistance thereof, the power semiconductor or the like can be handled as odd-shaped electronic component 29. Whether an electronic component is odd-shaped electronic component 29 or ordinary electronic component 25 may be determined according to a degree of demand of the attachment strength, a degree of demand of heat dissipation or the like.

A weight of odd-shaped electronic component 29 may be not less than 5 grams (g), preferably not less than 10 g or the like. This is because a component at a weight not more than 5 g, for example, ordinary electronic component 25 can be easily mounted and hardly peeled off or detached by vibration or the like. On the other hand, odd-shaped electronic component 29 at the weight not less than 5 g, particularly not less than 10 g or not less than 20 g is difficult to mount and easily peeled off or detached due to an influence of vibration or the like by as much as the heavy weight thereof. Due to this, such odd-shaped electronic component 29 is preferably fixed or mounted using resin structure 11.

FIG. 8B is a perspective view showing a manner of providing attachment holes 12 to screw resin structure 11 with a part of odd-shaped electronic component 29. As shown in FIG. 8B, it is useful to provide structures (such as attachment holes 12) for attaching resin structure 11 to an odd-shaped electronic component 29-side. Further, resin structure 11 may be integrated with odd-shaped electronic component 29. As described below with reference to FIG. 11, odd-shaped electronic component 29 may be integrally formed with a part of resin structure 11 by, for example, injection molding or insert molding odd-shaped electronic component 29, for example, a coil component constituted by a core, a coil and the like using resin.

In FIG. 8A, attachment holes 12 for fixing resin structure 11 to heat dissipation board 16 to provide heat dissipation structure board 10 and wiring holes 13 for protecting connection wirings 20 each of which is a part of each lead frame 17 of heat dissipation board 16 are formed on an outer periphery or the like of resin structure 11.

Figure 9:
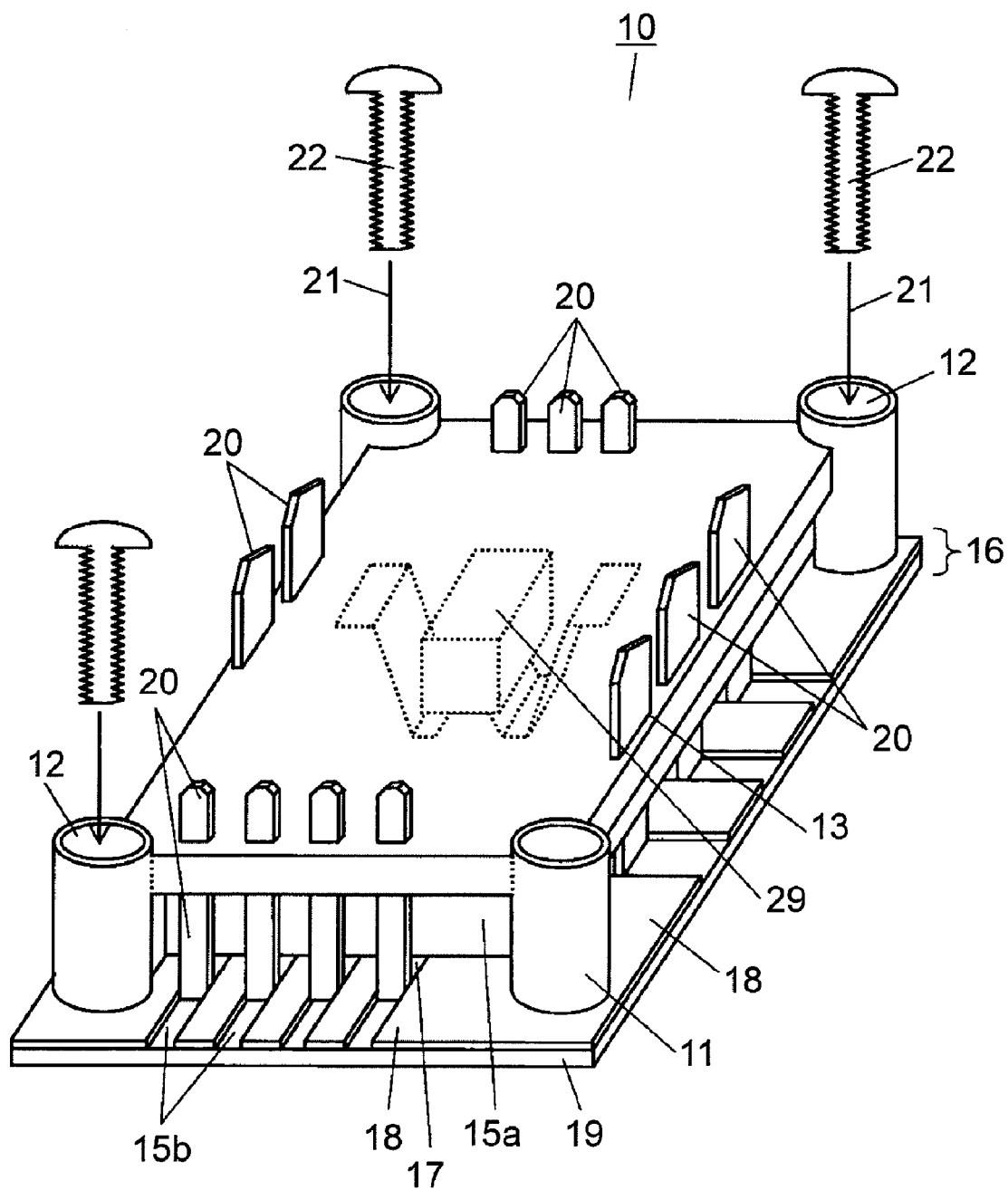
FIG. 9 is a perspective view describing a manner in which the odd-shaped electronic component is built in between a heat dissipation structure board and the resin structure.

FIG. 9 is a perspective view describing a manner in which odd-shaped electronic component 29 is built in between heat dissipation board 16 and resin structure 11. In FIG. 9, odd-shaped electronic component 29 and fixing member 30 serving as the holding part are both indicated by dotted line 28. This is intended to indicate that odd-shaped electronic component 29 and fixing member 30 are fixed to the rear surface-side (heat dissipation board 16-side) of resin structure 11. By fixing odd-shaped electronic component 29 and fixing member 30 to the rear surface-side of resin structure 11, odd-shaped electronic component 29 can be contained in between resin structure 11 and heat dissipation board 16 in a compact fashion. Moreover, fixing odd-shaped electronic component 29 and fixing member 30 to the rear surface-side facilitates electronic connection between odd-shaped electronic component 29 and lead frames 17.

It is to be noted that odd-shaped electronic component 29 may be fixed to resin structure 11 by elaborating a shape of resin structure 11 itself or by using fixing member 30 or the like serving as the holding part.

In FIG. 9, each connection wiring 20 is bent almost perpendicularly to heat transfer layer 18 and protrudes from resin structure 11. Alternatively, each connection wiring 20 may protrude to a side surface of heat transfer layer 18 as it is (without being bent).

Arrow 21 shown in FIG. 9 indicates a manner of fixing resin structure 11, to which a part of or more than a part of odd-shaped electronic component 29 is fixed, onto heat dissipation board 16 by screws 22.

Furthermore, a part of resin structure 11 fixed by screws 22 is closely attached to lead frames 17 or a part of connection wirings 20 (or bases and neighborhoods of the bases of connection wirings 20 bent almost perpendicularly), thereby fixing and reinforcing lead frames 17 and a part of connection wirings 20.

In this way, provided is module 16 configured to include: metal plate 19, heat transfer layer 18 formed on this metal plate 19; lead frames 17 fixed to this heat transfer layer 18; connection wirings 20 each obtained by protruding a part of each lead frame 17 from heat transfer layer 18; resin structure 11 fixing odd-shaped electronic component 29 of this connection wiring 20; and odd-shaped electronic component 29, wherein a part of or more than a part of odd-shaped electronic component 29 is fixed using resin structure 11, and wherein a part of or more than a part of the base of each connection wiring 20 is pressed against heat transfer layer 18 by resin structure 11.

The base of each connection wiring 20 corresponds to a part including a part below a central portion of connection wiring 20, a crease in which connection wiring 20 is bent almost perpendicularly and a lead frame 17-part within 10 mm from the crease. Particularly by reinforcing this part using resin structure 11, a strength of heat dissipation board 16 or heat dissipation structure board 10 can be increased.

It is to be noted that an upper half (a part that is not the base and that is above the central portion of connection wiring 20) of each connection wiring 20 is preferably pointed so as to improve performance of insertion of connection wiring 20 into resin structure 11 or the like.

One or more than one terminal (not shown) of odd-shaped electronic component 29 are electrically connected to each lead frame 17, thereby making it possible to handle supplying high current to odd-shaped electronic component 29 or efficiently dissipating heat from odd-shaped electronic component 29. The reason is as follows. By providing a connection part electrically connecting one or more than one external connection (or mounting) terminal of odd-shaped electronic component 29 to lead frames 17, current can be supplied to or heat can be dissipated from odd-shaped electronic component 29 via this connection part.

Moreover, by fixing odd-shaped electronic component 29 difficult to mount (because it is difficult to fix the odd-shaped electronic component of a coin-type, a cylindrical shape, a rectangular shape or the like to a board) or the like by connection wirings 20, odd-shaped electronic component 29 can resist a vibration test required to mount heat dissipation structure board 10 in a vehicle, for example, a vibration test of applying a vibration of 5 G to 10 G to heat dissipation structure board 10 in XYZ directions.

As described above, by configuring heat dissipation structure board 10 so that at least a part of or more than a part of odd-shaped electronic component 29 is held by resin structure 11 and that resin structure 11 includes a structure part fixed to any one of metal plate 19 and heat transfer layer 18 or any one of metal plate 19, heat transfer layer 18 and a chassis of a device fixing metal plate 19, a fixing strength of fixing odd-shaped electronic component 29 is increased.

It is useful that a part of resin structure 11 holds at least a part of ("at least a part of" includes "all of") odd-shaped electronic component 29. Furthermore, by causing not only resin structure 11 but also connection wirings 20 to hold at least a part of odd-shaped electronic component 29, the fixing strength of fixing odd-shaped electronic component 29 can be increased. The structure fixed to any one of or more than one of metal plate 19 and heat transfer layer 18 or a chassis of a device fixing metal plate 19 is provided on each connection wiring 20. With this structure, odd-shaped electronic component 29 can be fixed indirectly to any one of or more than one of metal plate 19 and heat transfer layer 18 and the chassis (including a housing or the like) of the device fixing metal plate 19 with high strength.

Figure 10A:
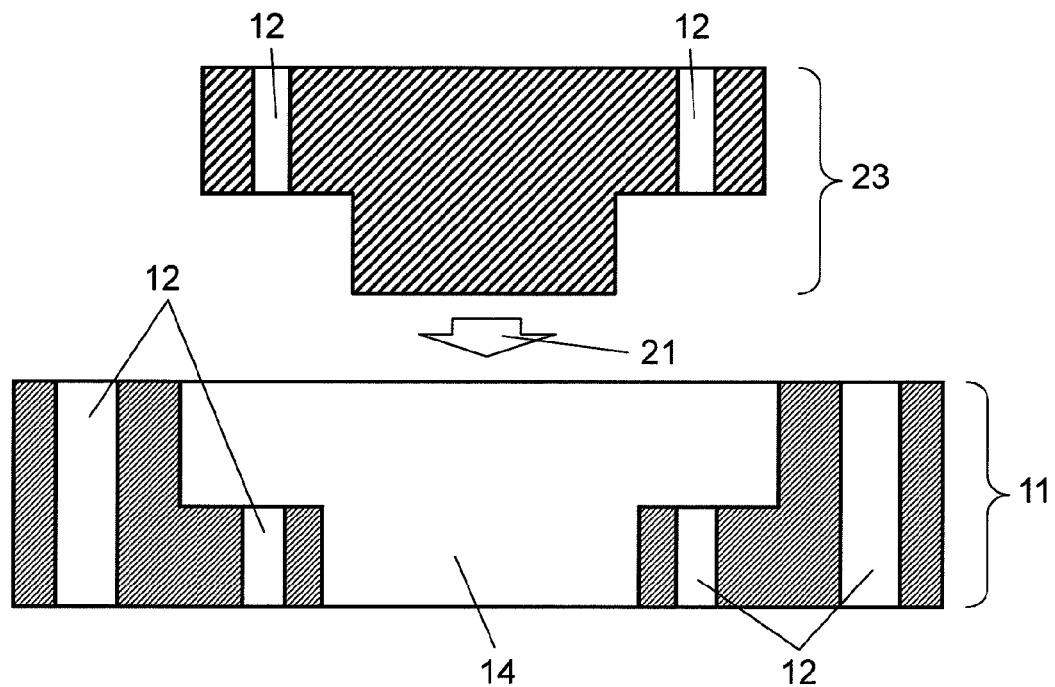
FIG. 10A is a cross-sectional view describing a manner of fixing the odd-shaped electronic component onto the resin structure.
Figure 10B:
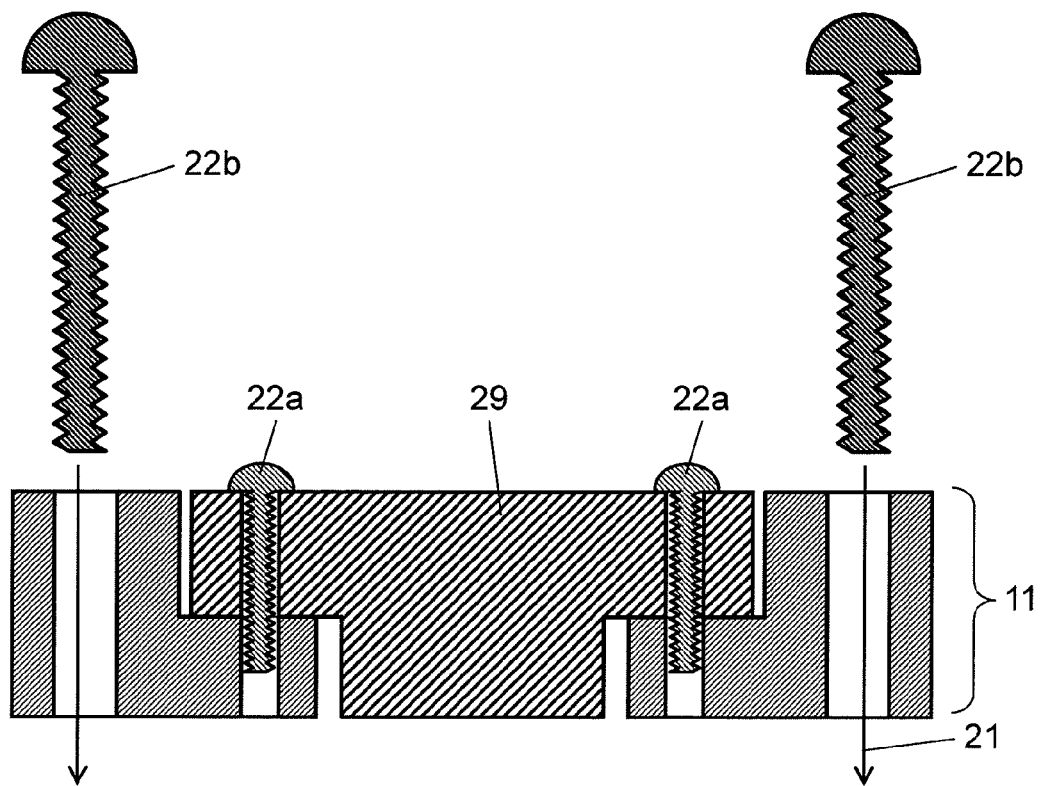
FIG. 10B is a cross-sectional view describing the manner of fixing the odd-shaped electronic component onto the resin structure.

FIGS. 10A and 10B are cross-sectional views describing a manner of fixing odd-shaped electronic component 29 to resin structure 11.

In FIG. 10A, attachment holes 12 for screwing are formed in odd-shaped electronic component 29. In addition, opening 14 into which odd-shaped electronic component 29 is inserted and attachment holes 12 for screwing odd-shaped electronic component 29 to resin structure 11 is formed in resin structure 11.

FIG. 10B is a cross-sectional view showing a manner of fixing resin structure 11 to which odd-shaped electronic component 29 is fixed by screws 22*a* to heat dissipation board 16 (not shown), the chassis of the device or the like by screws 22*b*. In FIG. 10B, attachment holes 12 are provided in a side surface or the like of odd-shaped electronic component 29. By inserting screws 22 or the like into these holes 12 as indicated by arrow 21, odd-shaped electronic component 29 is fixed to resin structure 11. In this manner, it is useful to provide attachment parts or the like of odd-shaped electronic component 29 in a part of resin structure 11.

Figure 11:
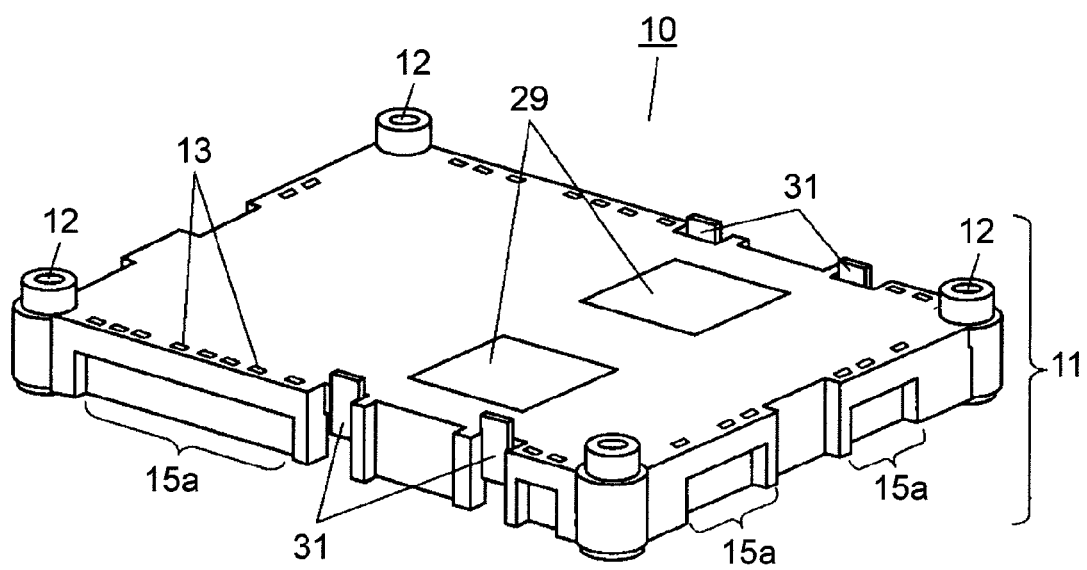
FIG. 11 is a perspective view describing a case of integrating the odd-shaped electronic component with the resin structure as a part of the resin structure.
Figure 11:
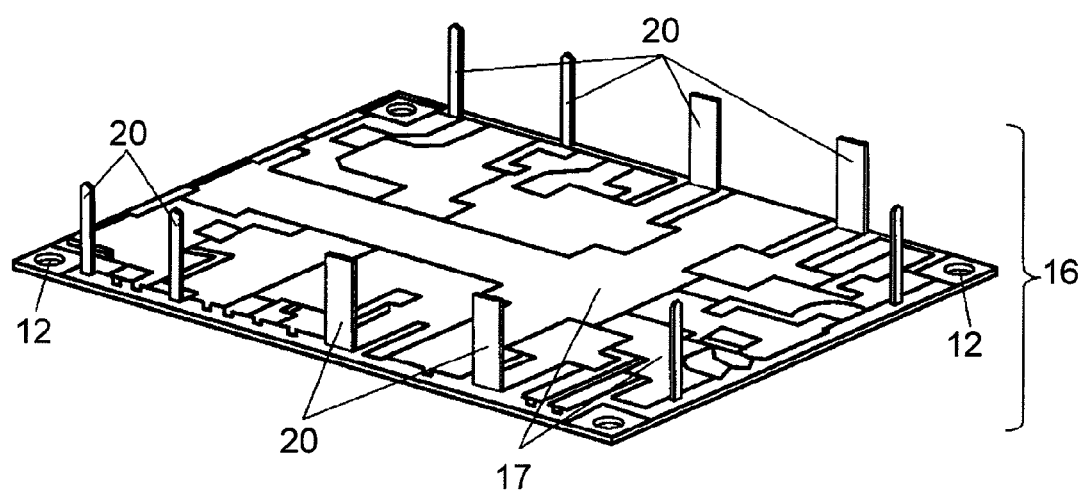

FIG. 11 is a perspective view describing a case of integrating odd-shaped electronic component 29 with resin structure 11 as a part of resin structure 11. In FIG. 11, odd-shaped electronic component 29 is insert molded into resin structure 11. By protruding one of or more than one external connection terminal of odd-shaped electronic component 29 from resin structure 11, odd-shaped electronic component 29 can be connected to connection wirings 20. As such odd-shaped electronic component 29, a choke coil constituted by a core and a wire and used in a DC-DC converter or the like can be used.

Odd-shaped electronic component 29 is insert molded or outsert molded into resin structure or integrated with resin structure 11, whereby a bonding strength of bonding odd-shaped electronic component 29 to resin structure 11 can be increased and, further, mounting cost can be reduced.

Figure 12A:
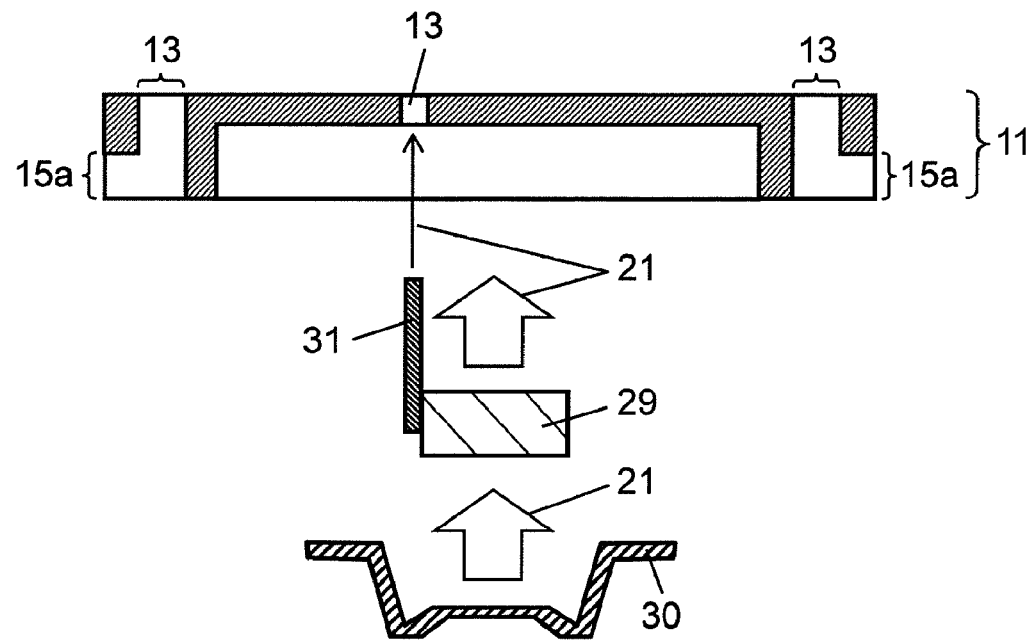
FIG. 12A is a perspective view describing a case where a terminal of the odd-shaped electronic component protrudes from the resin structure.
Figure 12B:
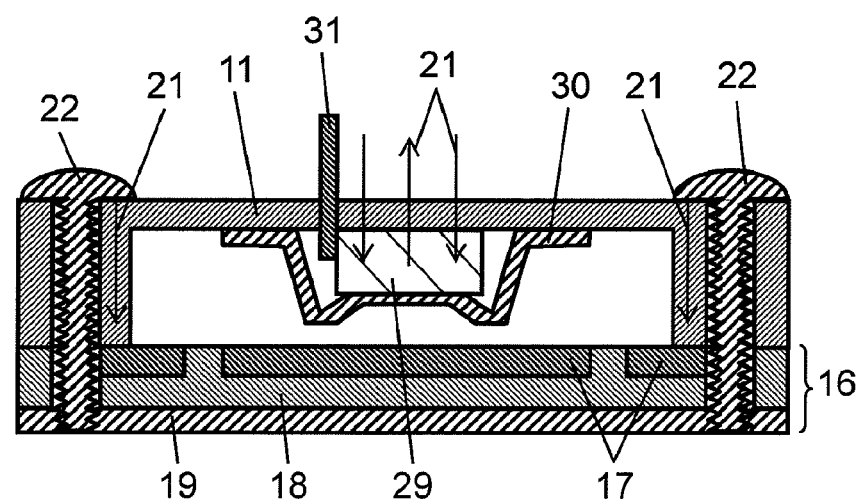
FIG. 12B is a perspective view describing the case where the terminal of the odd-shaped electronic component protrudes from the resin structure.

FIGS. 12A and 12B are perspective views both describing a manner of fixing a part of or more than a part of odd-shaped electronic component 29 using resin structure 11. In FIGS. 12A and 12B, terminal 31 corresponds to an external connection part of odd-shaped electronic component 29.

As shown in FIGS. 12A and 12B, wiring holes 13 for pulling out terminal 31 of odd-shaped electronic component 29 are formed in resin structure 11. It is thereby possible to pull out terminal 31 of odd-shaped electronic component 29 not only to a lead frame 17-side but also to a non-heat dissipation board 16-side of resin structure 11. In this way, a degree of freedom of wiring and designing of odd-shaped electronic component 29 can be improved.

FIG. 12A shows a manner of fixing odd-shaped electronic component 29 to a rear surface-side (heat dissipation board 16-side) of resin structure 11. Dotted line 28 of FIG. 12A indicates a part to which odd-shaped electronic component 29 is fixed. Using good formability of resin structure 11, a recess, a frame, a hole for attachment or fixing or the like can be formed in advance in this fixing part to fix odd-shaped electronic component 29. By using fixing member 30 as well as the fixing part, odd-shaped electronic component 29 can be fixed more firmly.

It is to be noted that odd-shaped electronic component 29 may be insert molded into resin structure 11 in advance or as a part of resin structure 11. In this manner, odd-shaped electronic component 29 can be integrated with resin structure 11, an attachment strength of attaching odd-shaped electronic component 29 to resin structure 11 can be increased and the mounting cost can be suppressed. If fixing member 30 serving as the holding part is made of an insulating material, short-circuit with lead frames 17 can be prevented. Furthermore, a metal piece is used as the fixing member 30 and brought into contact with lead frames 17 in a positive manner, whereby heat generated from odd-shaped electronic component 29 can be released toward heat dissipation board 16 via fixing member 30 serving as the holding part. In this case, it is useful to form lead frames 17 in contact with fixing member 30 made of the metal piece into a floating island pattern (for example, an island pattern electrically independent of other wiring patterns).

As described above, by providing heat dissipation board 16 configured so that one of or more than one of external connection part 31 of odd-shaped electronic component 29 is protruded or exposed to a surface of each connection wiring 20 which surface is out of contact with metal plate 19, it is possible to improve the degree of freedom of wiring and installation of odd-shaped electronic component 29. "Exposed" means a state in which it suffices that a part of odd-shaped electronic component 29 is visible from the surface. If it is necessary, an exposed part is protruded similarly to terminal 31 shown in FIG. 12B, it is possible to connect odd-shaped electronic component 29 to another printed circuit board (not shown).

In this way, provided is module 26 configured so that odd-shaped electronic component 29 electrically connected to at least one of heat dissipation board 16 and the printed circuit board (not shown in FIGS. 12A and 12B but shown in FIG. 14 to be described below) is provided between heat dissipation board 16 and resin structure 11. It is thereby possible to build in a component susceptible to the influence of vibration such as a transformer or a choke between heat dissipation structure board 16 and resin structure 11 and to deal with improvements in performance, strength and reliability of module 26.

Figure 13A:
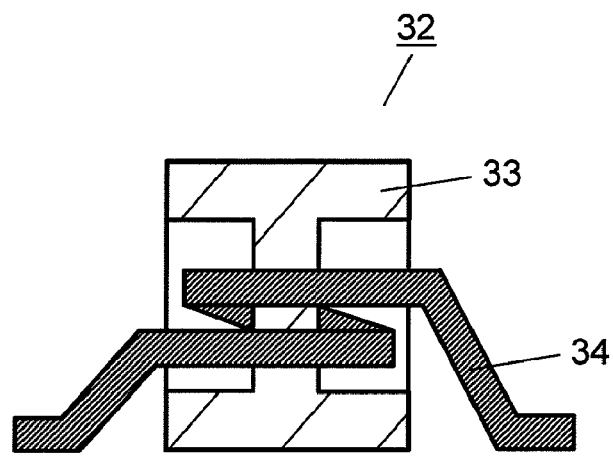
FIG. 13A is a cross-sectional view of a coil component and an enlarged cross-sectional view of a case of mounting the coil component in the resin structure.
Figure 13B:
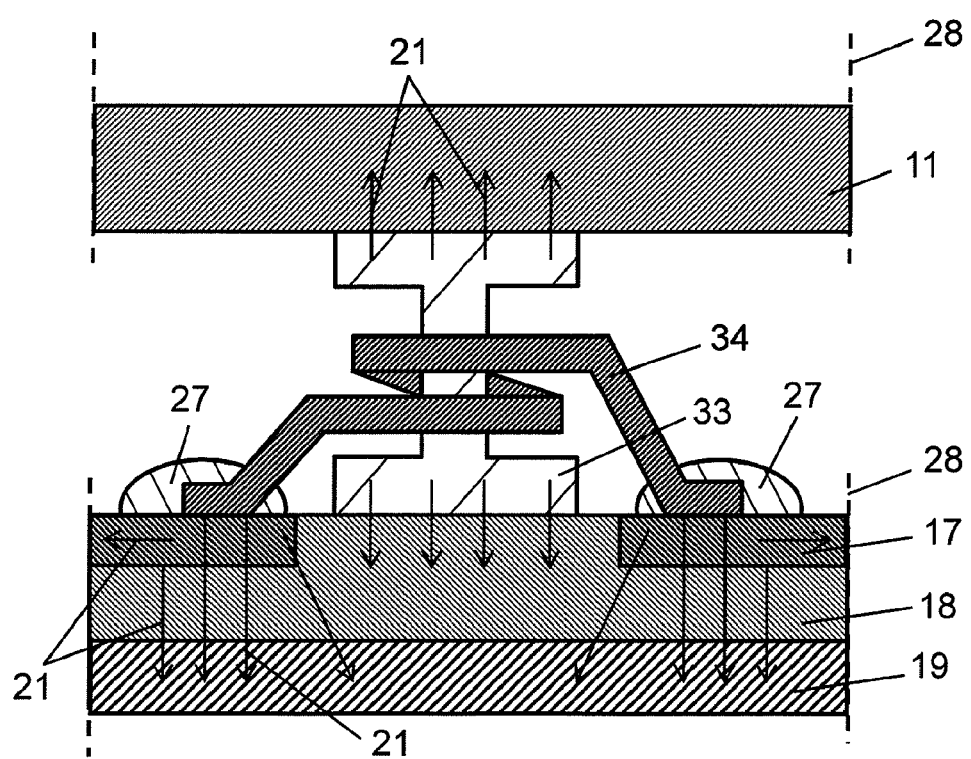
FIG. 13B is a cross-sectional view of the coil component and an enlarged cross-sectional view of the instance of mounting the coil component in the resin structure.

An example of attachment of odd-shaped electronic component 29 will next be described taking a coil such as a choke coil as an example with reference to FIGS. 13A and 13B. FIGS. 13A and 13B are a cross-sectional view of a coil component and an enlarged cross-sectional view showing a case of mounting the coil component in module 26, respectively. In FIGS. 13A and 13B, coil component 32 is configured to include a core part 33, a coil part 34 and the like. Coil part 32 is fixed to each lead frame 17 using solder 27.

Heat generated in coil component 32 such as the choke coil is dissipated to heat dissipation board 16 or resin structure 11 via heat transfer layer 18 and lead frames 17 as indicated by arrow 21.

As shown in FIGS. 13A and 13B, core part 33 and coil part 34 are configured as different structures, whereby an entire mass of coil component 32 can be divided into a plurality of masses, characteristic vibration during vibration can be suppressed and vibration resistance can be improved.

A method of fixing resin structure 11 is not limited to the method using screws 22 but may be a method using a structure (for example, a clutch structure, a hook structure or a wedge structure) formed in a part of resin structure 11 or the like.

Moreover, by sandwiching coil component 32 between resin structure 11 and heat dissipation board 16, an attachment strength of attaching coil component 32 can be increased. In a case of attaching coil component 32 to heat dissipation board 16, a connection part in which coil part 34 is connected to each lead frame 17 by solder 27 is preferably structured so that unnecessary force is not applied to the connection part, for example, configured to have a buffer structure part 49 described below in FIG. 33 and the like or a structure in which resin structure 11 does not directly come into contact with solder parts.

In this way, a pressing force or the like of resin structure 11 is not directly applied to the solder parts, thereby making it possible to improve reliability of solder 27 or the like. Further, it is useful to design an optimum attachment position and an optimum attachment strength for every region of odd-shaped electronic component 29 attached to module 26 or heat dissipation board 16. In FIGS. 13A and 13B, a heat-generation component such as a power semiconductor or the like mounted in each lead frame 17 is not shown.

Sixth Embodiment

A case of mounting odd-shaped electronic component 29 in module 26 described with reference to FIG. 6 and the like will be described with reference to FIG. 14 as a sixth embodiment.

Figure 14:
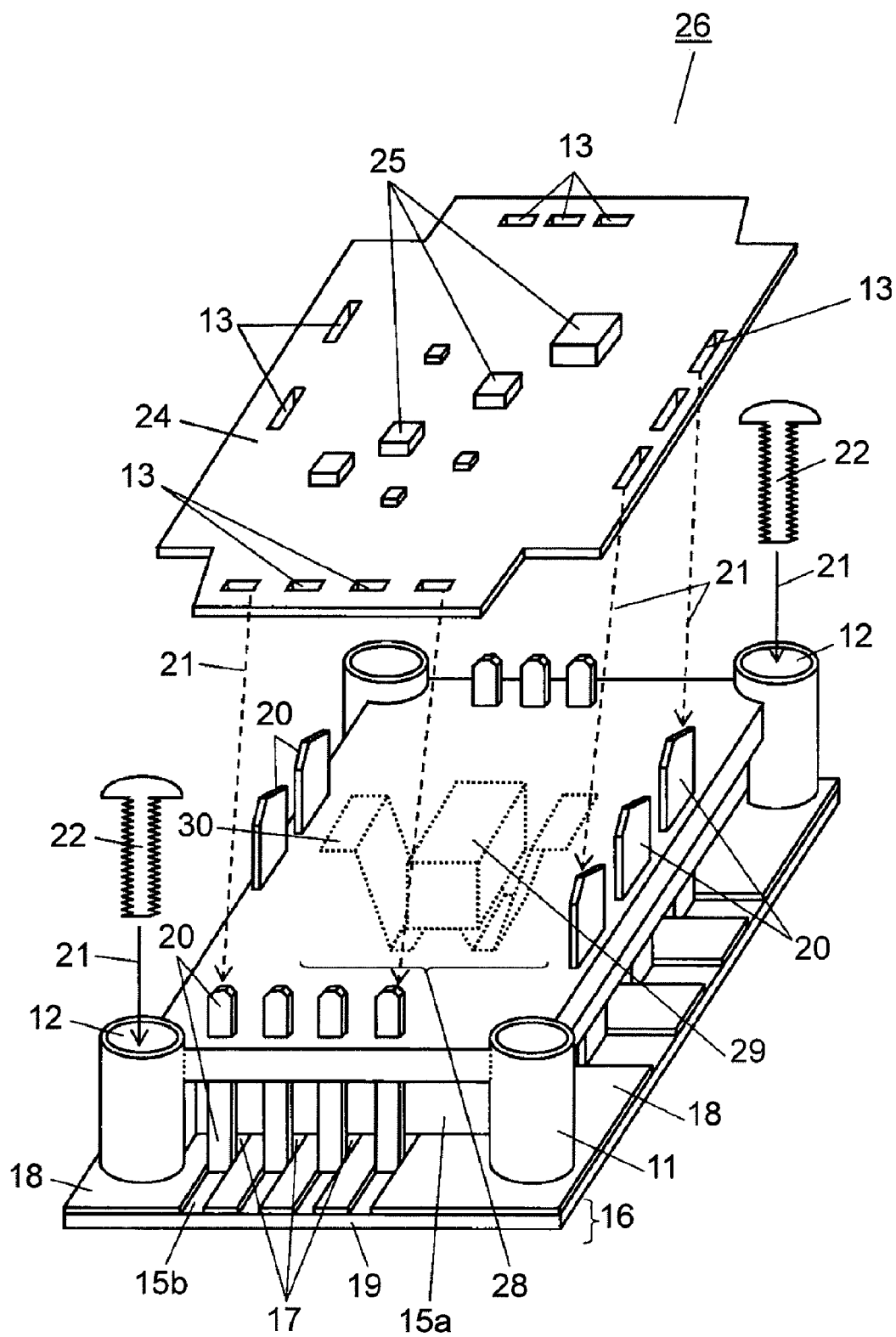
FIG. 14 is a perspective view describing a configuration of a module including an odd-shaped electronic component.

FIG. 14 is a perspective view describing a configuration of module 26 including odd-shaped electronic component 29.

In FIG. 14, attachment holes 12 for fixing resin structure 11 to heat dissipation board 16 or heat dissipation structure board 10 and wiring holes 13 for protecting connection wirings 20 each of which is a part of each lead frame 17 of heat dissipation board 16 are formed in an outer periphery or a part of resin structure 11.

In FIG. 14, wirings constituted by lead frames 17, a power semiconductor or the like mounted on the wirings, a solder resist and the like are not shown.

Odd-shaped electronic component 29 and a fixing member 30 for attaching odd-shaped electronic component 29 are fixed to predetermined parts of resin structure 11. In this way, resin structure 11 holds a part of or more than a part of odd-shaped electronic component 29. In FIG. 14, odd-shaped electronic component 29 and fixing member 30 are both indicated by dotted line 28. This is intended to indicate that odd-shaped electronic component 29 and fixing member 30 are fixed to a rear surface-side (heat dissipation board 16-side) of resin structure 11. Odd-shaped electronic component 29 may be held to either a front surface-side (printed circuit board 24-side) of resin structure 11 or the rear surface-side thereof. However, by fixing odd-shaped electronic component 29 to the rear surface-side of resin structure 11, odd-shaped electronic component 29 can be fixed to be pressed by both resin structure 11 and heat dissipation board 16 and a bonding strength of bonding odd-shaped electronic component 29 can be increased.

It is to be noted that odd-shaped electronic component 29 may be fixed to resin structure 11 by elaborating a shape of resin structure 11 itself or by using fixing member 30.

In FIG. 14, heat dissipation board 16 is configured to include: metal plate 19; sheet-like heat transfer layer 18 formed on this metal plate 19; lead frames 17 fixed to this heat transfer layer 18; and connection wirings 20 each obtained by protruding a part of each of these lead frames 17 from heat transfer layer 18.

While each connection wiring 20 is bent almost perpendicularly to heat transfer layer 18, this is intended to protrude each connection wiring 20 via each wiring hole 13 formed in resin structure 11 and to connect connection wiring 20 to printed circuit board 24 as indicated by arrow 21. In this way, it suffices to bend each lead frame 17 almost perpendicularly in a necessary part of heat dissipation board 16 to provide connection wiring 20 and it is unnecessary to bend each lead frame 17 in all peripheral edges (or on all four sides). Alternatively, a part of each lead frame 17 on a peripheral edge may be protruded from heat dissipation board 16 to outside without bending each lead frame 17 almost perpendicularly (but with each lead frame 17 remaining parallel to heat transfer layer 18).

In FIG. 14, arrow 21 directed to each attachment hole 12 indicates a manner in which resin structure 11 to which a part of or more than a part of odd-shaped electronic component 29 is fixed is fixed onto heat dissipation board 16 by screws 22, thereby constituting heat dissipation structure board 10.

Moreover, a part of resin structure 11 fixed onto heat dissipation board 16 by these screws 22 fixes each lead frame 17, a part of each connection wiring 20 or a base or neighborhoods of the base of each connection wiring 20 bent almost perpendicularly, thereby reinforcing strength of entire module 26.

Each of ordinary electronic components 25 mounted on a surface of printed circuit board 24 is connected to a power semiconductor or the like (not shown) mounted on heat dissipation board 16 at a shortest distance (or shortest line length) via connection wirings 20. Due to this, ordinary electronic components 25 are free from influence of noise.

In this way, realized is module 26 configured to include: metal plate 19, heat transfer layer 18 formed on this metal plate 19; lead frames 17 fixed to this heat transfer layer 18; connection wirings 20 each obtained by protruding a part of each lead frame 17 from heat transfer layer 18; resin structure 11 fixing a part of or more than a part of each of these connection wirings 20; odd-shaped electronic component 29; and printed circuit board 24 fixed to be almost in parallel to metal plate 19, wherein a part of or more than a part of odd-shaped electronic component 29 is fixed using resin structure 11, a part of or more than a part of each connection wiring 20 is connected to printed circuit board 24, and wherein odd-shaped electronic component 29 is disposed on printed circuit board 24.

It is to be noted that attachment accuracy can be improved and attachment work can be reduced by providing a concave part or a protrusion on the part of resin structure 11 to which odd-shaped electronic component is attached. For example, a recess or a protrusion according to an external shape of odd-shaped electronic component 29, for example, a semi-cylindrical concave part into which odd-shaped electronic component 29 of a cylindrical shape is buried or fitted is provided in resin structure 11. Alternatively, a cubic concave part into which cubic odd-shaped electronic component 29 is fixed or the like is provided therein. As a result, fixing member 30 can be dispensed with.

Moreover, as shown in FIG. 14, resin structure 11 to which odd-shaped electronic component 29 is attached can be fixed to heat dissipation board 16 or heat dissipation structure board 10 using screws 22.

As shown in FIG. 14, since resin structure 11 is used to fix odd-shaped electronic component 29, even a plurality of odd-shaped electronic components 29 or odd-shaped electronic components 29 of various different external shapes can be fixed to resin structure 11. It is to be noted that more odd-shaped electronic components 29 can be fixed by fixing odd-shaped electronic components 29 to both surfaces, that is, the front surface-side (printed circuit board 24-side) and the rear surface-side (heat dissipation board 16-side) of resin structure 11 rather than fixing odd-shaped electronic components 29 to one of the front surface-side and the rear surface-side of resin structure 11.

Moreover, as shown in FIG. 14, wiring holes 13 formed in resin structure 11 protect connection wirings 20 of heat dissipation board 16. Further, a bonding strength of bonding a part of resin structure 11 can be increased by pressing bases of connection wirings 20 against heat dissipation board 16.

A method of attaching odd-shaped electronic component 29 to resin structure is not limited to a method using fixing member 30 serving as the holding member but may be a method using parts obtained by working resin structure 11 itself, for example, attachment holes 12, attachment grooves or fitting structures. Structure parts of resin structure 11 to which odd-shaped electronic component 29 is fixed are parts of resin structure 11 with which a part of or more than a part of odd-shaped electronic component 29 contacts. Further, these structure parts to which odd-shaped electronic component 29 is fixed include an attachment part to which fixing member 30 serving as the holding part for odd-shaped electronic component 29 is attached (for example, a part indicated by dotted line 28 in FIG. 2A) and also a structure part that fixes fixing member 30 serving as the holding part. If fixing member 30 is fixed using a hole, a protrusion or the like, the structure part includes such a hole, protrusion or neighborhoods of the hole or protrusion. It is to be noted that these parts are not shown. This is because the fixing part that fixes fixing member 30 (including the attachment part and also neighborhoods thereof) is a part of the structure parts fixing odd-shaped electronic component 29.

In this way, if the attachment structure part or the fixing structure part such as fixing member 30 according to the shape of odd-shaped electronic component 29 is formed on resin structure 11-side, module 26 can handle various shapes of odd-shaped electronic components 29. Resin structure 11 can be formed by using an injection moldable and commercially available thermoplastic resin, preferably a high-strength material such as engineering plastic or liquid crystal polymer.

Odd-shaped electronic component 29 fixed to resin structure 11 will be described. If a plurality of odd-shaped electronic components 29 or heavy odd-shaped electronic component 29 is fixed to resin structure 11, a plurality of odd-shaped electronic components 29 or heavy odd-shaped electronic component 29 is fixed to an optimum position such as a central portion and around the central portion of module 26 or an optimum position for balance. In this way, a shape of resin structure 11 (including a thickness of resin structure 11) is designed in light of a magnitude, a shape, the number, a weight and the like of odd-shaped electronic components 29 to be mounted.

As shown in FIG. 14 and the like, resin structure 11 includes one or more wiring holes 13 and each connection wiring 20 obtained by a part of each lead frame 17 of heat dissipation board 16 is connected to an external circuit such as printed circuit board 24 via each wiring hole 13 provided in resin structure 11, thereby making it possible to reinforce strengths of connection wirings 20. Further, as described in FIGS. 12A, 12B and the like, module 26 can handle reinforcement of not only odd-shaped electronic component 29 but also terminal 31 thereof by pulling out terminal 31 of odd-shaped electronic component 29 via each wiring hole 13.

Moreover, resin structure 11 includes structure parts transmitting an external force applied from outside or connection wirings 20 or the like at several locations of any one of or more than one of metal board 19 and heat transfer layer 18 or any one of or more than one of any one of or more than one of metal board 19 and heat transfer layer 18 and chassis 44 of the device fixing metal plate 19. Due to this, heat dissipation board 16 or heat dissipation structure board 10 has improved resistance against the external force. The structure parts transmitting the external force at a plurality of locations may be obtained by, for example, providing a plurality of attachment holes 12 or the like using screws 22 of resin structure 11. This is because strength reinforcement can be attained by fixing resin structure 11 by screws 22 at a plurality of locations or a plurality of screws 22 rather than fixing resin structure 11 only at one location or only by one screw 22.

Seventh Embodiment

In a seventh embodiment, reinforcement of strength of an electronic component mounted on heat dissipation board 16 will be described with reference to FIGS. 15A and 15B.

Figure 15A:
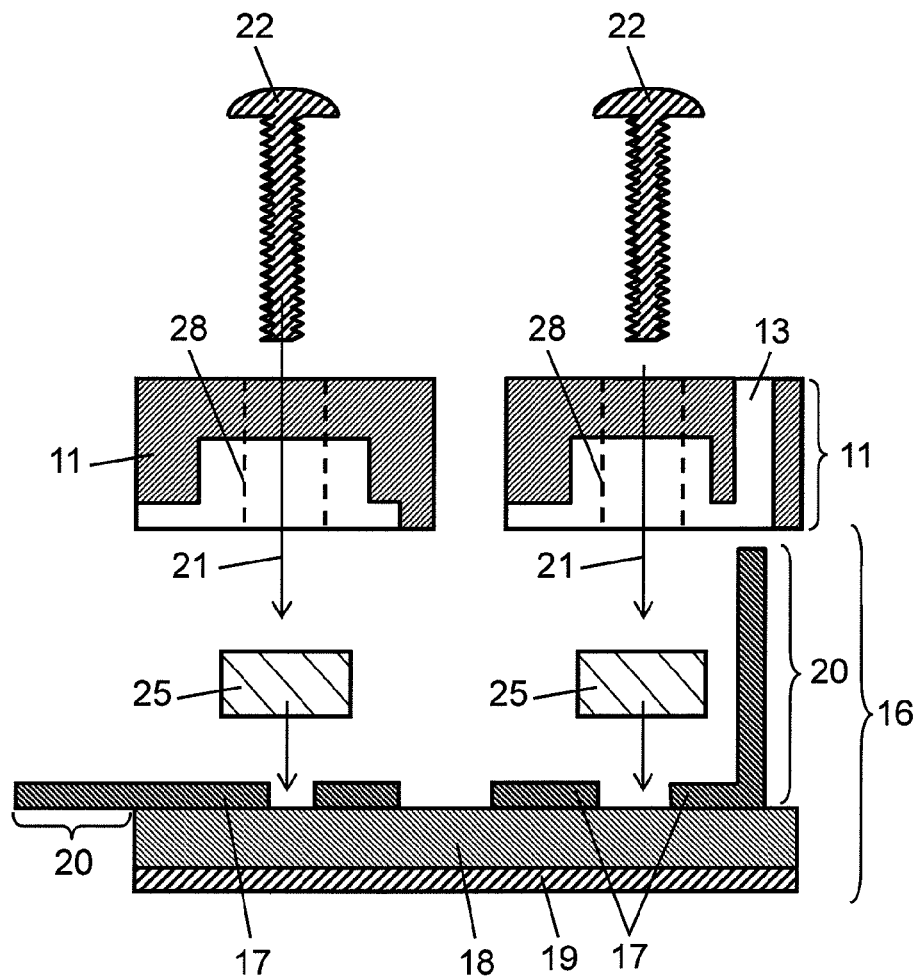
FIG. 15A is a cross-sectional view describing strength reinforcement using a resin structure for an electronic component mounted in a heat dissipation board.
Figure 15B:
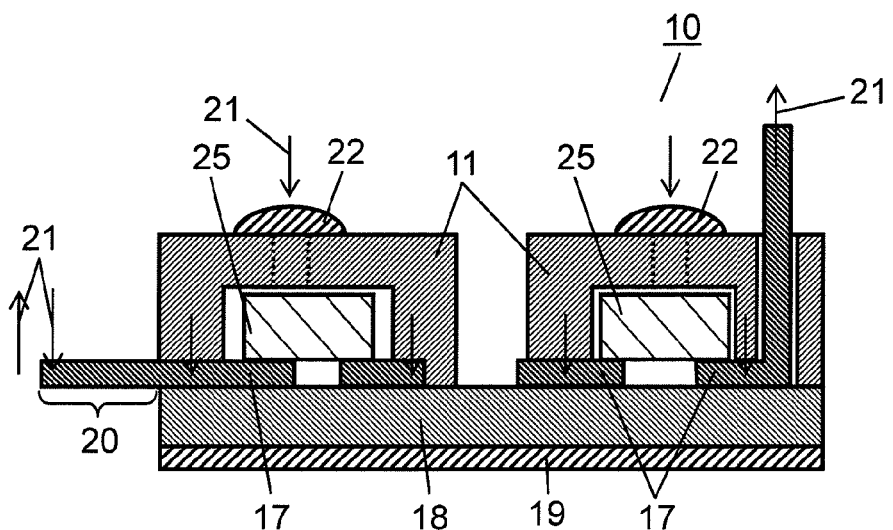
FIG. 15B is a cross-sectional view describing strength reinforcement using the resin structure for the electronic component mounted in the heat dissipation board.

FIGS. 15A and 15B are cross-sectional views both describing strength reinforcement for heat dissipation board 16 or heat dissipation structure board 10 described in the first embodiment and the like. In FIGS. 15A and 15B, ordinary electronic components 25 may be replaced by odd-shaped electronic components 29.

FIG. 15A is a cross-sectional view describing reinforcing strengths of lead frames 17 fixed onto heat transfer layer 18. In FIGS. 15A and 15B, heat dissipation board 16 is configured to include sheet-like heat transfer layer 18 and lead frames 17 fixed to this heat transfer layer 18 on metal plate 19.

Next, as shown in FIG. 15A, each ordinary electronic component 25 or odd-shaped electronic component 29 is mounted on heat dissipation board 16 as indicated by arrow 21. It is to be noted that solders 27 or the like for use in mounting are not shown. Resin structure 11 is set onto heat dissipation board 16 so as to cover up a part of or more than a part of ordinary electronic components 25 and finally fixed onto heat dissipation board 16 by screws 22 or the like.

In this case, examples of each ordinary electronic component 25 include a power semiconductor (a power transistor or a power FET). It is to be noted that odd-shaped electronic components 29, for example, components difficult to surface-mount such as an electrolytic capacitor, an electric double layer capacitor, a transformer or a choke may be similarly fixed.

FIG. 15B is a cross-sectional view describing a state after lead frames 17 and the like are fixed. As shown in FIG. 15B, heat dissipation board 16 and ordinary electronic components 25 mounted on this heat dissipation board 16 are fixed to a heat transfer layer 18-side using resin structure 11, thereby making it possible to further reinforce strengths of these members. In FIG. 15B, a gap is provided between each ordinary electronic component 25 and resin structure 11. Alternatively, as long as each ordinary electronic component 25 has sufficiently high strength, ordinary electronic component 25 may be directly pressed against resin structure 11 so as to directly come into contact with resin structure 11 or without providing the gap. In another alternative, an elastic body, heat dissipation rubber or the like may be inserted into this gap part. It suffices to avoid using regions in which reliability is influenced by stress such as soldering stress.

Arrow 21 in FIG. 15B indicates vibration or a tensile force applied to each lead frame 17 or the like, a pressing force of each screw 22 against resin structure 11 and the like. As shown in FIG. 15B, resin structure 11 fixed onto metal plate 19 absorbs, cancels or relaxes such forces.

In FIG. 15B, if each ordinary electronic component 25 generates heat, this heat expands or spreads via lead frame 17 and is dissipated to metal plate 19 and the like via heat transfer layer 18.

Eighth Embodiment

In an eighth embodiment, a case of providing terminal part 39 that can connect a part of each connection wiring 20 to an external circuit via resin structure 11 will be described.

Figure 16:
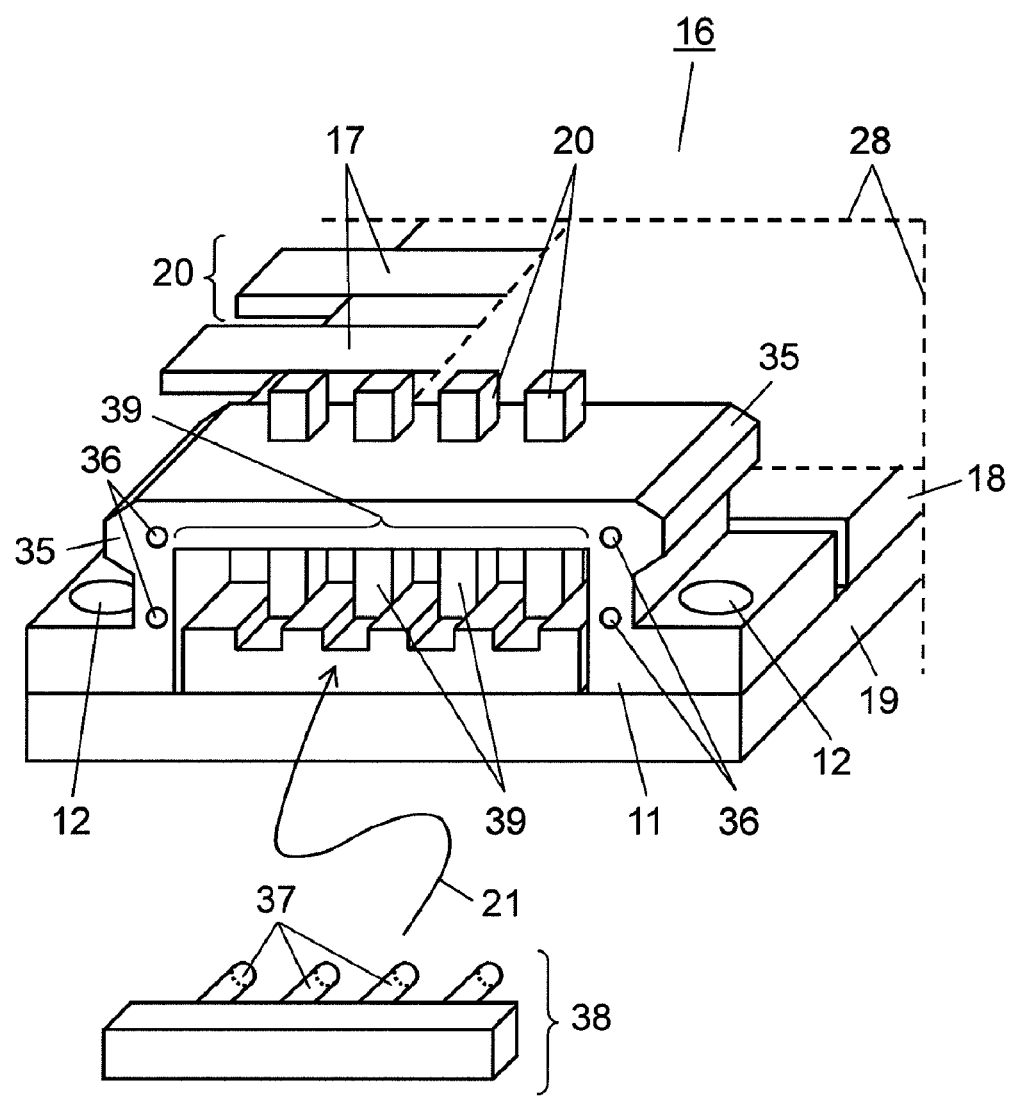
FIG. 16 is a perspective view describing an external connection terminal provided on a resin structure.

FIG. 16 is a perspective view describing terminal 39 provided on resin structure 11 and connectable to an external circuit.

FIG. 16 shows guide groove 35, guide holes 36, connector pins 37, connector 38 and connection terminal part 39. It is to be noted that examples of guide groove 35 include a guide groove in a shape called "introduction guide" or the like. Examples of guide holes 36 include a concave in a recess shape without penetration and a through-hole. FIG. 16 does not show a cable or the like connected to connector 38.

In this way, it is useful to provide structure parts such as guide groove 35 and guide holes 35 assisting in insertion or the like of connector 38 or the like on resin structure 11.

Dotted line 28 indicates omission, that is, dotted line 28 indicates that a wiring pattern constituted by lead frames 17 formed in a central portion or the like of heat dissipation board 16 and a heat-generation component (such as a power semiconductor, a power LED, a high power laser device, a transformer or a coil) mounted on each lead frame 17 are not shown.

Resin structure 11 shown in FIG. 16 includes connection terminal part 39 in a central portion or the like of resin structure 11 for inserting connector 38, and a part of each connection wiring 20 obtained by bending a part of each lead frame 17 is exposed into connection terminal part 39. Further, by inserting connector 38 into connection terminal part 39 as indicated by arrow 21, connectivity between connector pins 37 and respective connection wirings 20 can be improved. By using spring-added pins as connector pins 37, contact performance can be improved. It is to be noted that guide groove 35 and guide holes 36 improve attachment performance, detachment performance (fixing performance, positioning performance and insertion performance) and the like.

In FIG. 16, a part of resin structure 11 is directly fixed onto metal plate 19. In this case, a part of resin structure 11 is fixed onto metal plate 19 by using attachment holes 12 and inserting screws 22, pins or fixtures (both of which are not shown) into attachment holes 12, respectively. In this way, by directly fixing resin structure 11 onto metal plate 19, a part of or more than a part of each lead frame 17, each connection wiring 20 or heat transfer layer 18 is simultaneously pressed against metal plate 19 and mechanically fixed to metal plate 19.

Heat dissipation structure board 10 in FIG. 16 is configured to include: metal plate 19, sheet-like heat transfer layer 18 formed on this metal plate 19, lead frames 17 fixed to this heat transfer layer 18, connection wirings 20 each obtained by bending a part of each of these lead frames 17; and resin structure 11 fixing a part of or more than a part of one of or each of each of these connection wirings 20 and each of lead frames 17. Further, a part of or more than a part of this resin structure 11 is fixed to metal plate 19 and a part of each of connection wirings 20 is exposed to a part of this resin structure 11, thus providing connection terminal part 39.

As shown in FIG. 16, a part of or more than a part of each lead frame 17 is peeled off from heat transfer layer 18 and used as each connection wiring 20, thereby setting a creepage distance of insulation (a kind of an insulation distance) between each connection wiring 20 and metal plate 19. While a part of or more than a part of each lead frame 17 is buried in heat transfer layer 18 in FIG. 16, occurrence of irregularities due to a thickness of each lead frame 17 is prevented by burying.

Figure 17A:
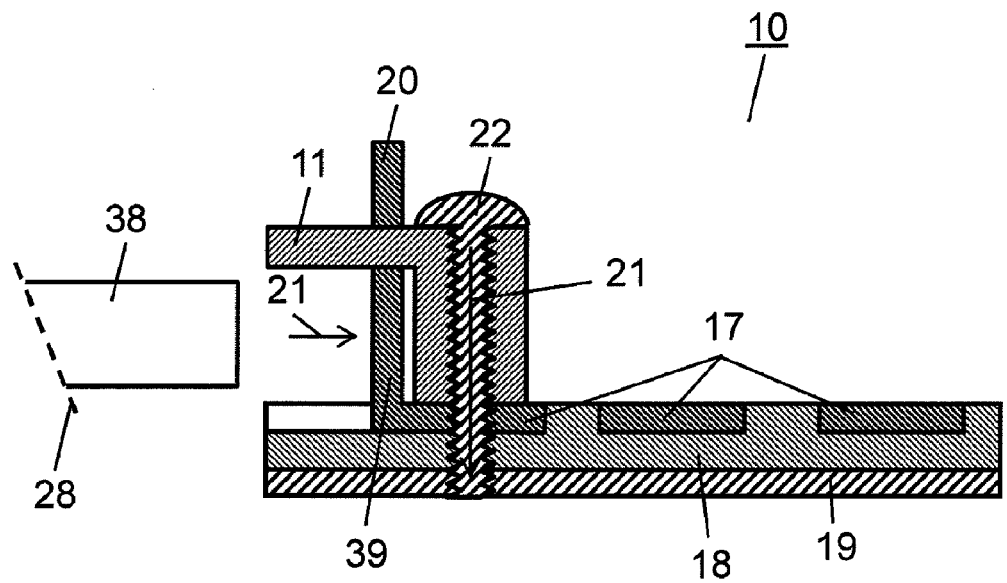
FIG. 17A is a cross-sectional view describing reinforcing strength of an external connection terminal part.
Figure 17B:
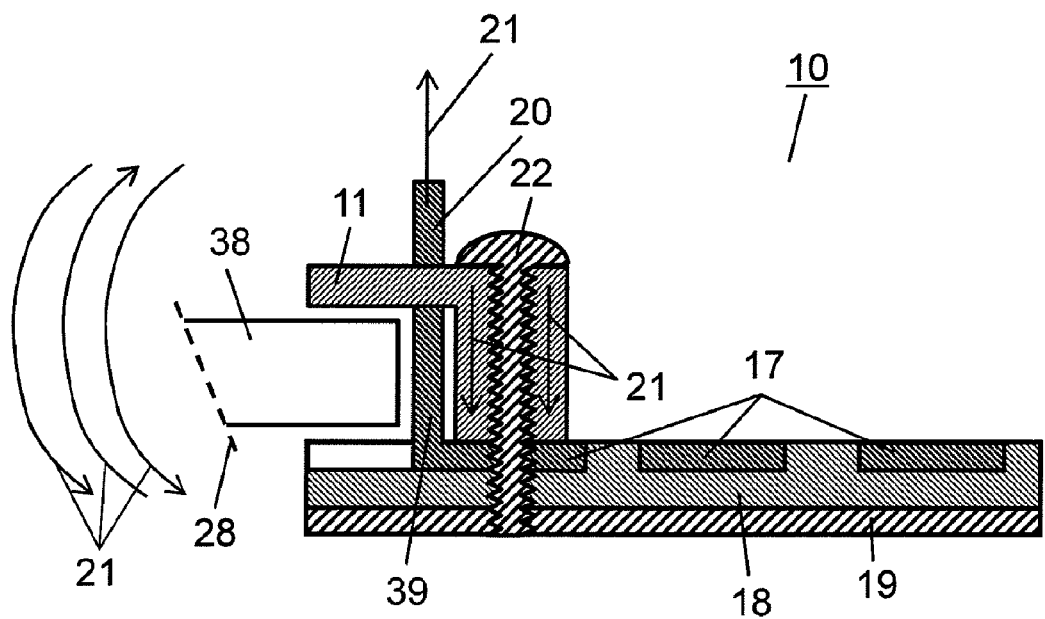
FIG. 17B is a cross-sectional view describing reinforcing strength of the external connection terminal part.

FIGS. 17A and 17B are cross-sectional views both describing reinforcing strength of connection terminal part 39.

As shown in FIG. 17A, a part of resin structure 11 is directly fixed onto metal plate 19 or the like using screw 22. In FIG. 17A, a part of connection wiring 20 is exposed to terminal part 39 for inspection provided on resin structure 11. With this structure, terminal part 39 can also serve as connector 38 and cost can be reduced. Moreover, even after a power semiconductor, ordinary electronic component 25, odd-shaped electronic component 29 or the like is mounted on this heat dissipation board 16 or heat dissipation structure board 10, electric inspection can be conducted and reliability can be, therefore, improved.

FIG. 17B shows a manner of generation of an external force (indicated by, for example, circular arc arrow 21) to connector 38. Various external forces are applied to connector 38 by vibration or the like when connector 38 is inserted, when connector 38 is detached or when heat dissipation board 16 or heat dissipation structure board 10 is incorporated into a device while connector 38 is inserted. However, as shown in FIG. 17B, resin structure 11 is firmly fixed onto metal plate 19 by screw 22 or the like. Due to this, the external forces from connector 38 are not transmitted directly to connection wirings 20 and lead frames 17. As a result, the external forces from connector 38 or the like do not cause peeling off or detaching of connection wirings 20 and lead frames 17.

In this way, even if connection terminal 39 is provided by resin structure 11, it is possible to increase a bonding strength of bonding a part of or more than a part of each lead frame 17 to heat transfer layer 18, a bonding strength of bonding heat transfer layer 18 to metal plate 19, a mechanical strength of each connection wiring 20 or the like and improve reliability of the device.

Ninth Embodiment

In a ninth embodiment, reinforcement of strengths of fixedly bonded parts such as lead frames 17 if lead frames 17 are not buried in heat transfer layer 18 will be described with reference to FIG. 18.

Figure 18:
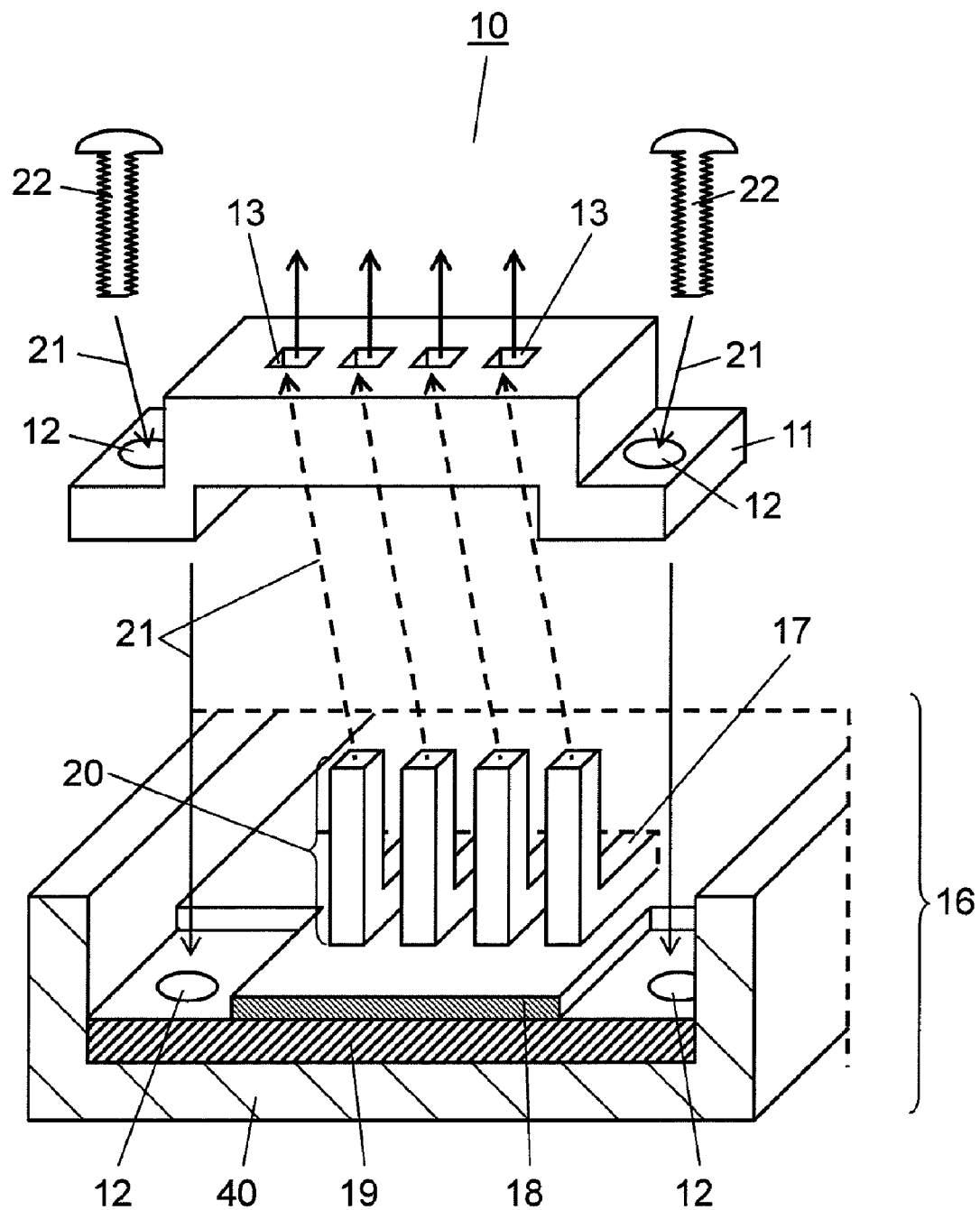
FIG. 18 is a perspective view describing an example of reinforcing strength if lead frames are not buried in a heat transfer layer.

FIG. 18 is a perspective view describing an example of reinforcing strength if lead frames 17 are not buried in heat transfer layer 18.

As shown in FIG. 18, metal plate 19 is fixed into case 40. In addition, sheet-like heat transfer layer 18 is formed on this metal plate 19 and lead frames 17 are further fixed to heat transfer layer 18. A part of each of lead frames 17 fixed onto sheet-like heat transfer layer 18 is bent almost perpendicularly to heat transfer layer 18 to provide each connection wiring 20.

Wiring holes 13 for penetrating through connection wirings 20 and protecting connection wirings 20, respectively and attachment holes 12 for fixing resin structure 11 to metal plate 19 or case 40 are formed in resin structure 11. As indicated by arrow 21, resin structure 11 is fixed to metal plate 19 and case 40 using screws 22 or the like. At the same time, a part of or more than a part of each connection wiring 20 is inserted into each wiring hole 13 formed in resin structure 11, thereby protecting this connection wiring 20. Screws 22 may be replaced by other fixing means than screws 22 such as bolts, nuts, pins or fixtures.

As shown in FIG. 18, neighborhoods of based of connection wirings 20 fixed to heat transfer layer 18 are firmly fixed to heat transfer layer 18 using resin structure 11 fixed by screws 22 or the like. In this manner, even if lead frames 17 are not buried in heat transfer layer 18, a connection interface between each connection wiring 20 (including each lead frame 17 near the base of connection wiring 20) and heat transfer layer 18 is not peeled off.

In FIG. 18, a resin film such as a polyimide film formed by casting method or the like can be used as heat transfer layer 18. Since such a resin film is already hardened, it is difficult to bury lead frames 17 into this film. However, as shown in FIG. 18, even if lead frames 17 are fixed or attached onto the resin film to necessary parts later using adhesive or the like, strengths of lead frames 17 and connection wirings 20 can be reinforced.

In FIG. 18, resin structure 11 is directly fixed to attachment holes 12 provided in metal plate 19 by screws 22 or the like. As shown in FIG. 18, by removing heat transfer layer 18 on metal plate 19 from fixed parts by screws 22 or the like, a fastening force of each screw 22 does not influence heat transfer layer 18. Alternatively, the fastening force of each screw 22 can prevent cracks or the like from occurring on heat transfer layer 18.

An effect of using case 40 will next be described with reference to FIGS. 19A and 19B. Case 40 can be used as, for example, a bank, a dam or the like for sealing resin.

Figure 19A:
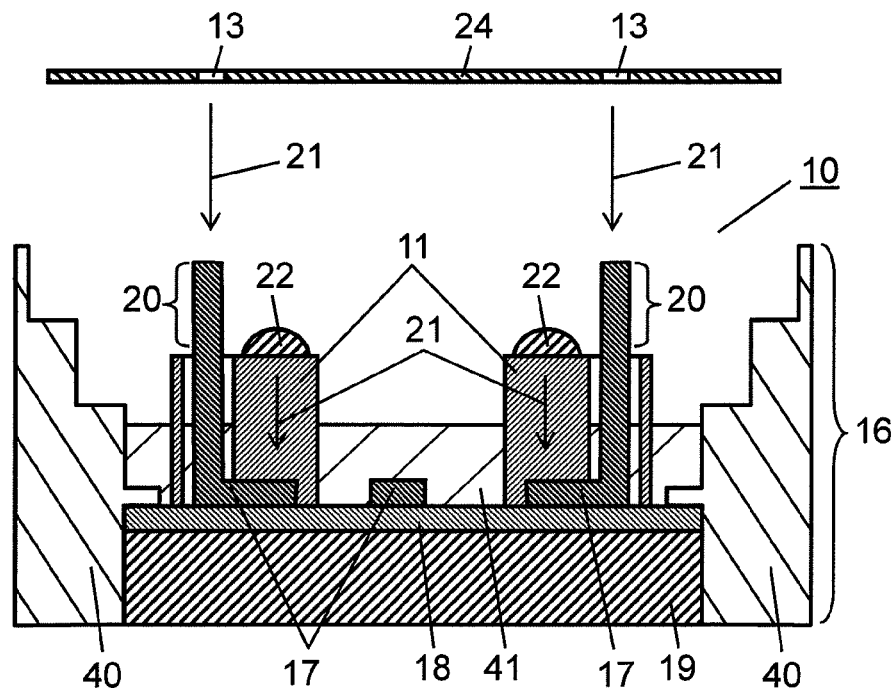
FIG. 19A is a cross-sectional view describing a manner of protecting a part of or more than a part of each of lead frames with a sealing material.
Figure 19B:
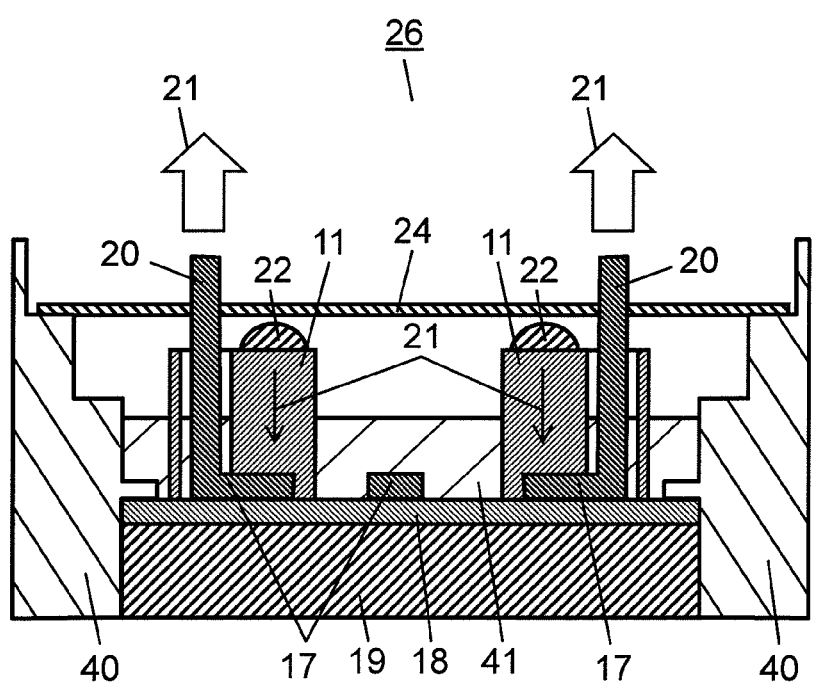
FIG. 19B is a cross-sectional view describing the manner of protecting a part of or more than a part of each of lead frames with the sealing material.

FIGS. 19A and 19B are cross-sectional views both describing a manner of protecting a part of or more than a part of each lead frame 17 with a sealing material. In FIGS. 19A and 19B, a commercially available product of silicon base, epoxy base, polyurethane base or the like can be used as sealing material 41. Reliability can be further improved by covering a part of or more than a part of each of lead frames 17 with sealing material 41 after mounting a power semiconductor (not shown) on each lead frame 17.

FIG. 19A is a cross-sectional view describing a manner after protecting a part of or more than a part of each of lead frames 17 with sealing material 41.

FIGS. 19A and 19B are cross-sectional views describing a manner of protecting printed circuit board 24 using case 40. In FIGS. 19A and 19B, printed circuit board 24 is, for example, a commercially available multilayer board using glass epoxy resin or the like. It is to be noted that FIGS. 19A and 19B do not show a control semiconductor, a chip component and the like mounted on a surface of printed circuit board 24.

As shown in FIG. 19A, connection wirings 20 are inserted into wiring holes 13, for example, through-holes formed in printed circuit board 24, respectively. Thereafter, connection wirings 20 are fixed by solders or the like as shown in FIG. 19B.

FIG. 19B is a cross-sectional view describing a case where a tensile force as indicated by an arrow 21 is generated in each connection wiring 20 via printed circuit board 24. Even if the tensile force is generated in each connection wiring 20, such a tensile force is cancelled by directly fixing connection wiring 20 itself to metal plate 19 and further a housing or the like of a device (not shown) fixing metal plate 19 using screw 22 or the like as indicated by arrow 21.

As shown in FIG. 19B, it is preferable to provide a gap between printed circuit board 24 and resin structure 11. By providing the gap, it is possible to inspect and evaluate a state of bonding of solder 27 to each connection wiring 20-part or the like, flow of solder 27 and an amount of solder 27.

Alternatively, in FIGS. 19A and 19B, a part of resin structure 11 may be provided to cover up or to be bonded to not only a bottom of sealing material 41 but also a side surface, an upper surface and the like of sealing material 41. In this manner, even if vibration or the like is applied to sealing material 41, vibration can be released to resin structure 11 not only from the bottom but also from the side surface and the upper surface of sealing material 41, thereby making it possible to reinforce strength and improve vibration resistance.

Tenth Embodiment

In a tenth embodiment, reinforcement of strength of heat dissipation board 16 or heat dissipation structure board 10 formed using resin structure 11 will be described with reference to FIG. 20.

Figure 20:
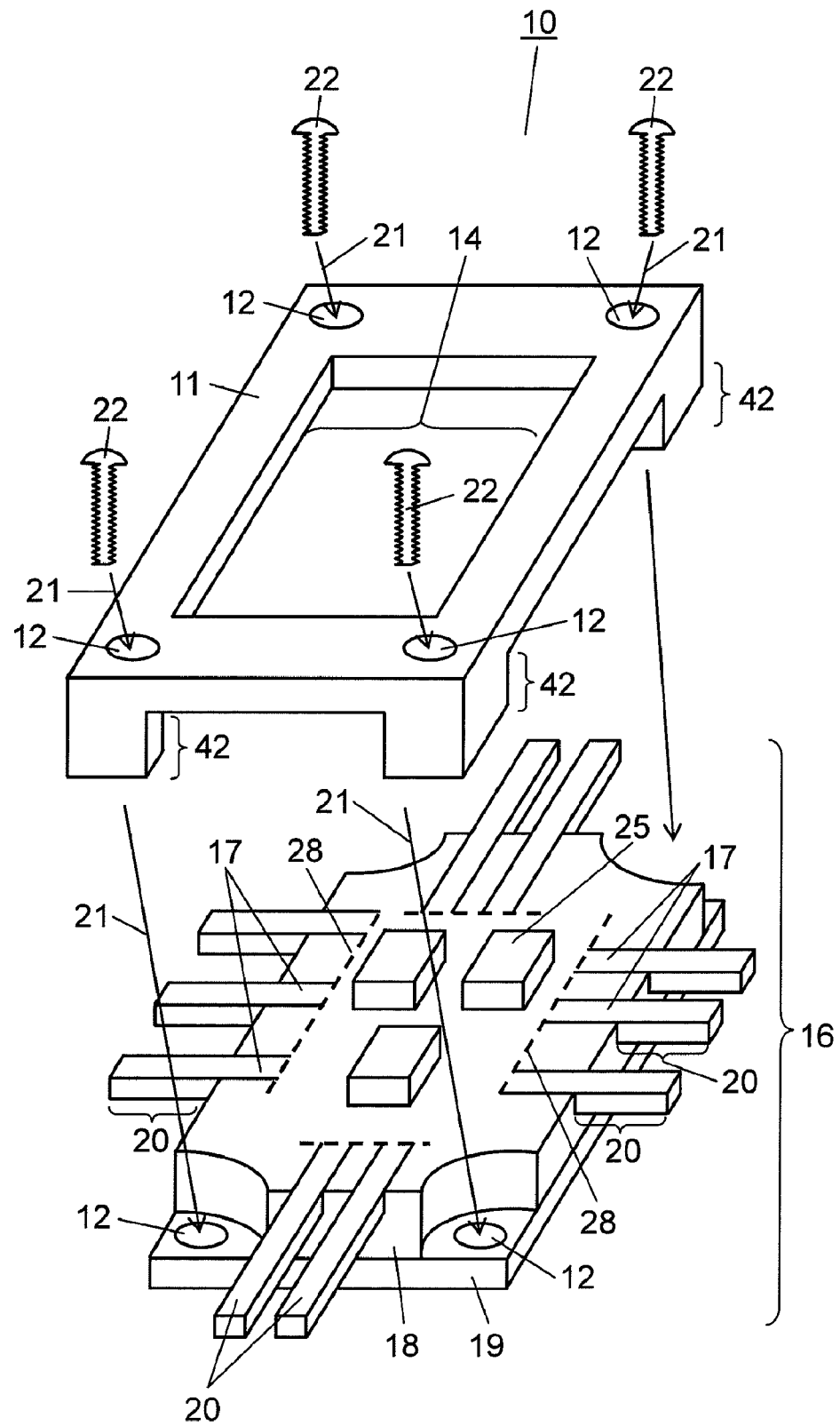
FIG. 20 is a perspective view describing a configuration of a heat dissipation structure board.

FIG. 20 is a perspective view describing a configuration of heat dissipation board 16 or heat dissipation structure board 10. In FIG. 20, each leg 42 is provided to a part of resin structure so as to directly fix a part of resin structure 11 to metal plate 19 or a chassis or a housing of a device or metal plate 19 to a connection member (note that the chassis, the housing, the member and the like are not shown in FIG. 20).

Resin structure 11 shown I FIG. 20 has opening 14 formed in a central portion thereof and ordinary electronic components (including heat-generation component such as a power semiconductor) mounted on lead frames (not shown) each of which is a part of each connection wiring 20 are visible in opening 14.

In FIG. 20, screws 22 or the like are inserted into a plurality of attachment holes 12 formed in a peripheral portion or the like of resin structure 11 as indicated by arrow 21, respectively, thereby directly fixing resin structure 11 to metal plate 19 and the chassis or housing (both of which are not shown) fixing metal plate 19.

In FIG. 20, lead frames (not shown) are fixed onto metal plate 19 via sheet-like heat transfer layer 18, and a part of each lead frame (not shown) protrudes outward from heat transfer layer 18 to constitute one connection wiring 20. In this way, resin structure 11 is directly fixed to metal plate 19 and the chassis, housing, member or the like fixing metal plate 19 so as to avoid heat transfer layer 18 or at a part excluding heat transfer layer 18. This makes it difficult to generate cracks in heat transfer layer 18 during attachment or the like.

As shown in FIG. 20, an attachment strength of attaching each connection wiring 20 is reinforced by constituting heat dissipation board 16 or heat dissipation structure board 10 configured to include: metal plate 19, sheet-like heat transfer layer 18 formed on this metal plate 19, lead frames 17 fixed to this heat transfer layer 18, connection wirings 20 each obtained by protruding a part of each lead frame 17 from heat transfer layer 18; and resin structure 11 fixing a part of or more than a part of each of connection wirings 20, wherein a part of or more than a part of resin structure 11 is fixed to metal plate 19.

Figure 21A:
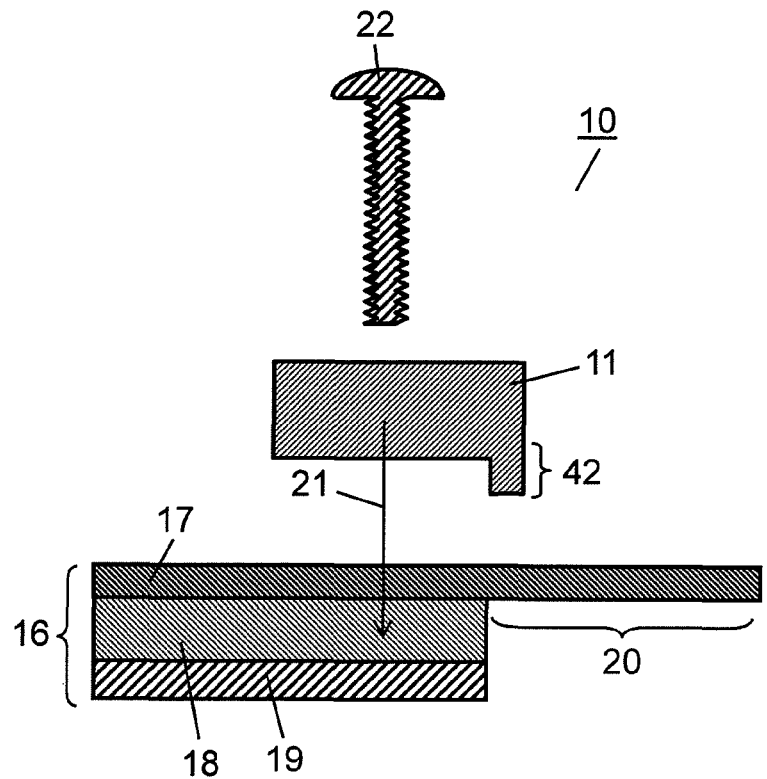
FIG. 21A is a cross-sectional view showing a manner of reinforcing strengths of lead frames, connection wirings and the like by a resin structure.
Figure 21B:
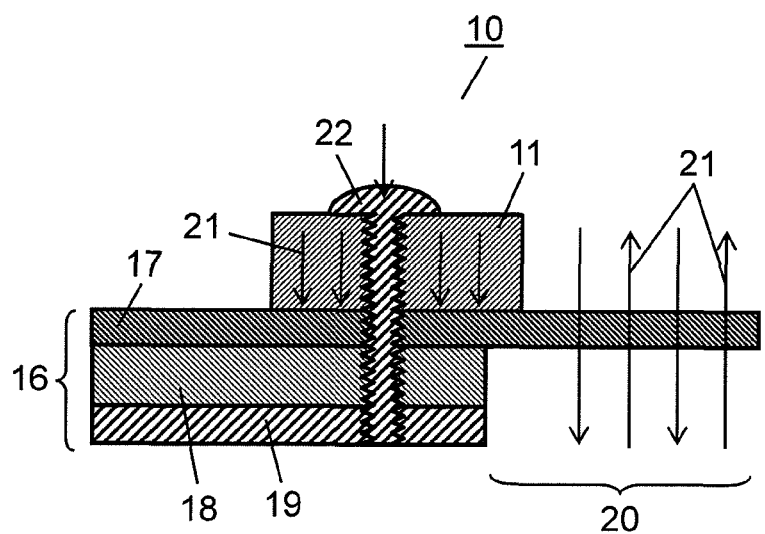
FIG. 21B is a cross-sectional view showing the manner of reinforcing the strengths of the lead frames, the connection wiring and the like by the resin structure.

FIGS. 21A and 21B are cross-sectional views each showing a manner of reinforcing strengths of lead frames 17, connection wirings 20 and the like by resin structure 11. As shown in FIG. 21A, resin structure 11 having legs 42 each provided on a part of resin structure 11 is set onto heat dissipation board 16. Thereafter, resin structure 11 is fixed to heat dissipation board 16, preferably metal plate 19 using screw 22 or the like as indicated by arrow 21. FIGS. 21A and 21B do not show attachment holes 12 and the like.

FIG. 21B is a cross-sectional view describing a manner in which resin structure 11 is fixed to heat dissipation board 16 using screw 22 or the like to provide heat dissipation structure board 10. In FIG. 21B, screw 22 is firmly fixed into the attachment hole (not shown) formed in metal plate 19. It is to be noted that a thread groove may be formed in the attachment hole formed in metal plate 19. Arrow 21 shown in FIG. 21B indicates a force generated in connection wiring 20. As shown in FIG. 21B, even if an external force is applied to connection wiring 20, an interface or the like between lead frame 17 and heat transfer layer 18 is not peeled off since resin structure 11 firmly fixes a part of or more than a part of connection wiring 20 and a part of or more than a part of lead frame 17 to metal plate 19 and heat transfer layer 18 as indicated by arrow 21.

If only one screw 22 is used, each leg 42 is brought into contact with an end of heat dissipation board 16, thereby making it possible to restrict a position of resin structure 11 on heat dissipation board 16 and to stably fix resin structure 11 to heat dissipation board 16. If a plurality of screws 22 is used, the same effect can be produced.

Next, an example of optimizing a shape of resin structure 11 will be described with reference to FIGS. 22 to 25. Resin structure 11 can be optimized according to a shape or usage of heat dissipation board 16.

Figure 22:
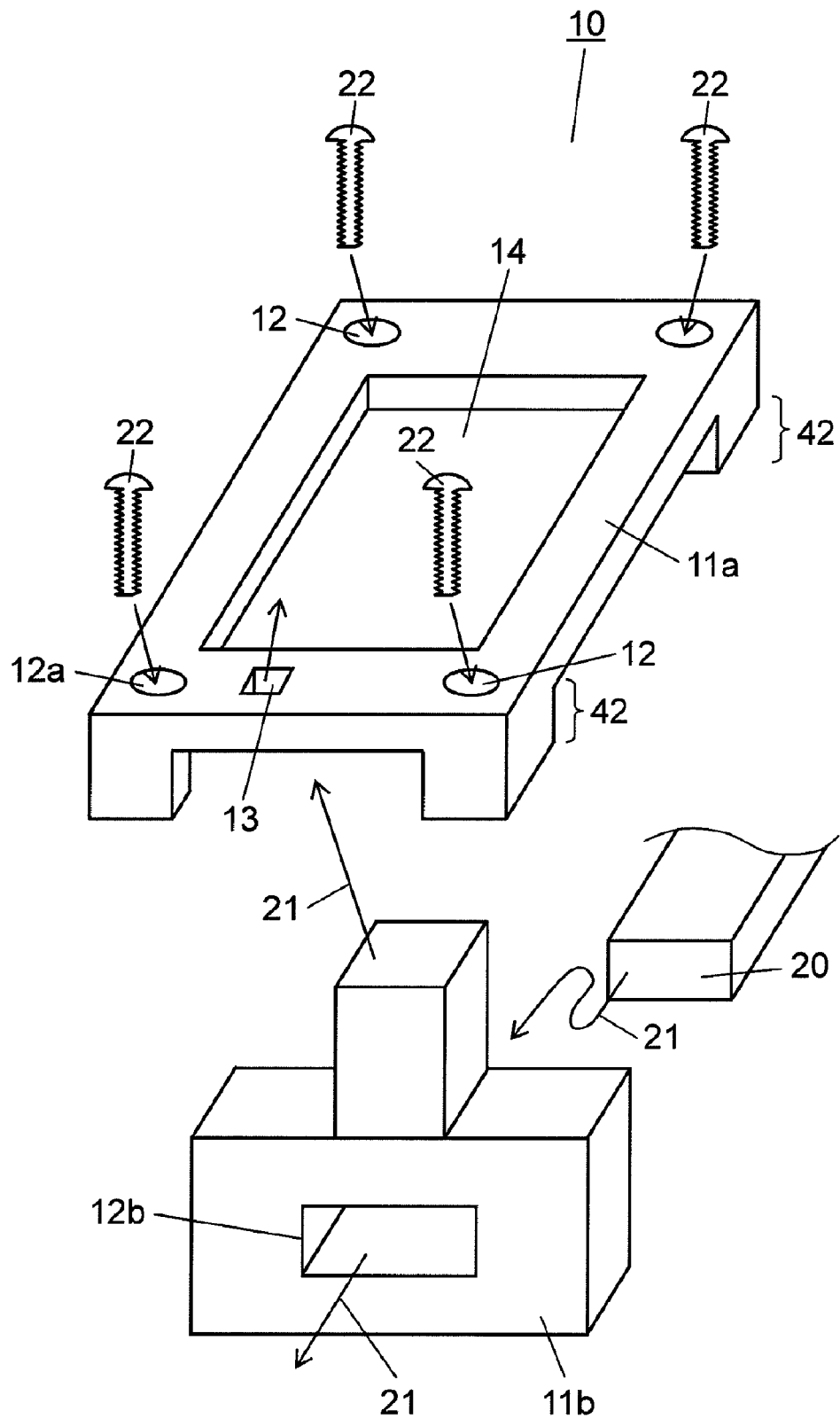
FIG. 22 is a perspective view describing a case of providing one or more resin structures.

FIG. 22 is a perspective view describing a case of providing one or more resin structures 11. As indicated by arrow 21 shown in FIG. 22, connection wiring 20 is inserted into attachment hole 12b formed in resin structure 11b. Thereafter, this resin structure 11b is fitted into attachment hole 12a formed in resin structure 11a. With this structure, resin structure 11b can protect entire surfaces of a periphery of connection wiring 20. As for resin structure 11b shown in FIG. 22, by forming a plurality of attachment holes 12, it is possible to make positional corrections (including positional deviation prevention), bending prevention and short prevention among a plurality of connection wirings 20.

While FIG. 22 shows that resin structure 11a protect surroundings of a heat dissipation board (not shown), resin structure 11a does not necessarily protect all of the surroundings. Resin structure 11a can selectively protect necessary parts, necessary sides, a central portion or the like of the heat dissipation board. In such a case, a shape of resin structure 11a is not limited to a shape (a kind of a picture frame shape) shown in FIG. 20 but may be a rod shape (including an L-shape or a U-shape). Furthermore, if resin structure 11a is a plate-like structure, resin structure 11a can entirely cover up or protect lead frames 17 formed on heat dissipation board 16.

In FIG. 22, if resin structure 11 is divided into a plurality of resin structures or is constituted by a combination of a plurality of resin structures, the shape of resin structure 11 can be optimized.

Figure 23A:
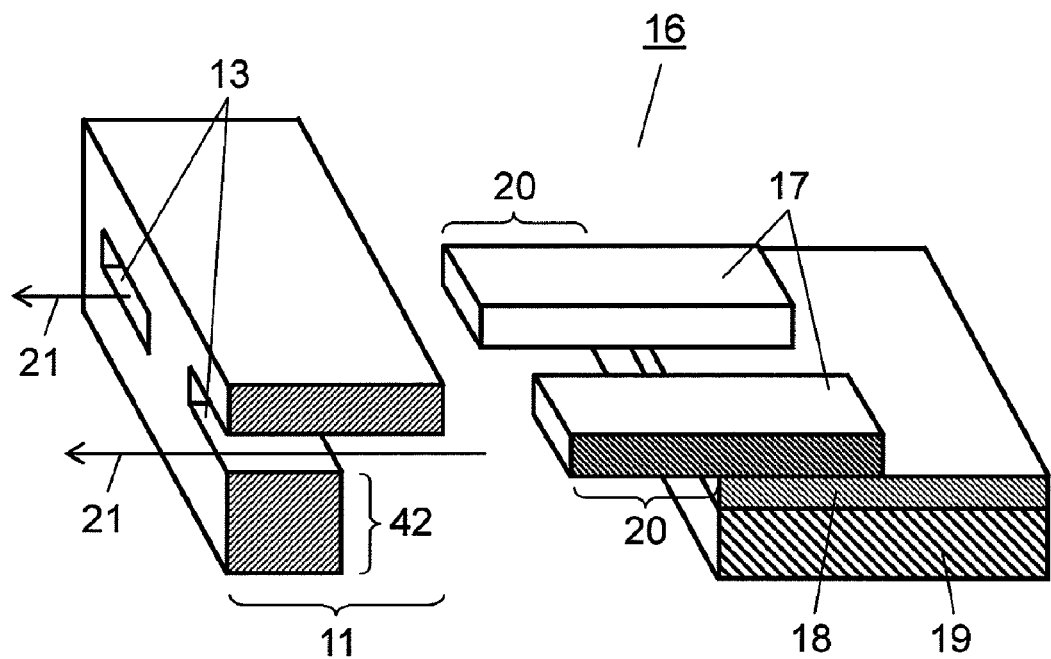
FIG. 23A is a perspective view describing a manner of inserting connection wirings into respective wiring holes formed in the resin structure and protecting the connection wirings.
Figure 23B:
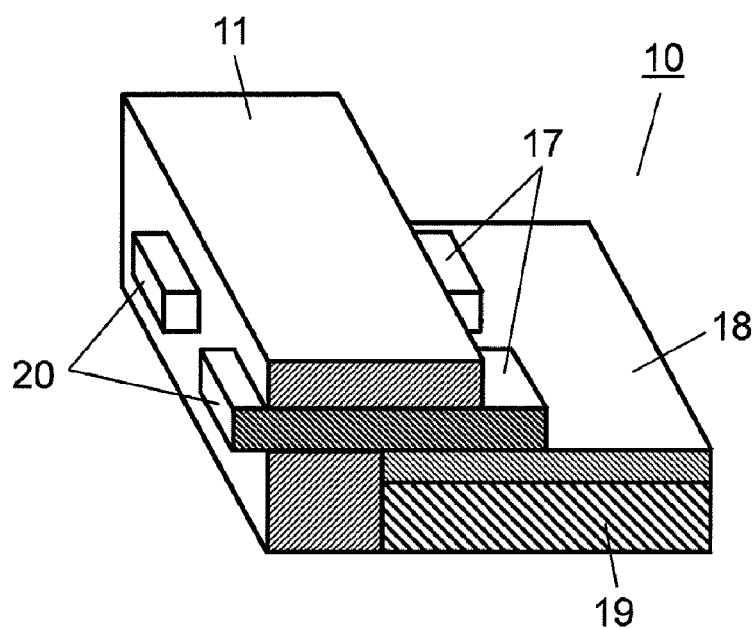
FIG. 23B is a perspective view describing the manner of inserting the connection wirings into the respective wiring holes formed in the resin structure and protecting the connection wirings.

FIGS. 23A and 23B are perspective views each describing a manner of inserting connection wirings 20 into wiring holes 13 formed in resin structure 11 and protecting connection wirings 20, respectively. As shown in FIG. 23A, resin structure 11 is set to neighborhoods of connection wirings 20 of heat dissipation board 16. Thereafter, as indicated by arrow 21, connection wirings 20 are inserted into wiring holes 13, respectively. By bringing legs 42 of resin structure 11 into contact with ends of metal plate 19, respectively, lead frames 17 can be located between a part of resin structure 11 and heat transfer layer 18 and can be, therefore, fixed more firmly.

FIG. 23B is a perspective view showing a manner of protecting connection wirings 20 with resin structure 11.

Figure 24A:
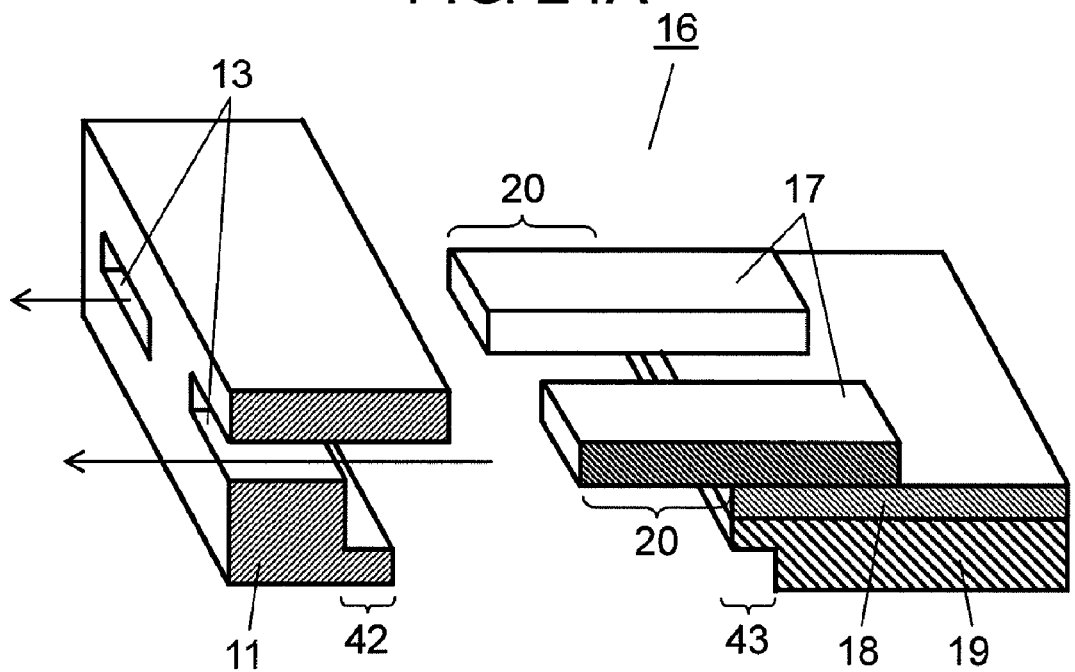
FIG. 24A is a perspective view describing a manner of inserting the connection wirings into the respective wiring holes formed in the resin structure and protecting the connection wirings.
Figure 24B:
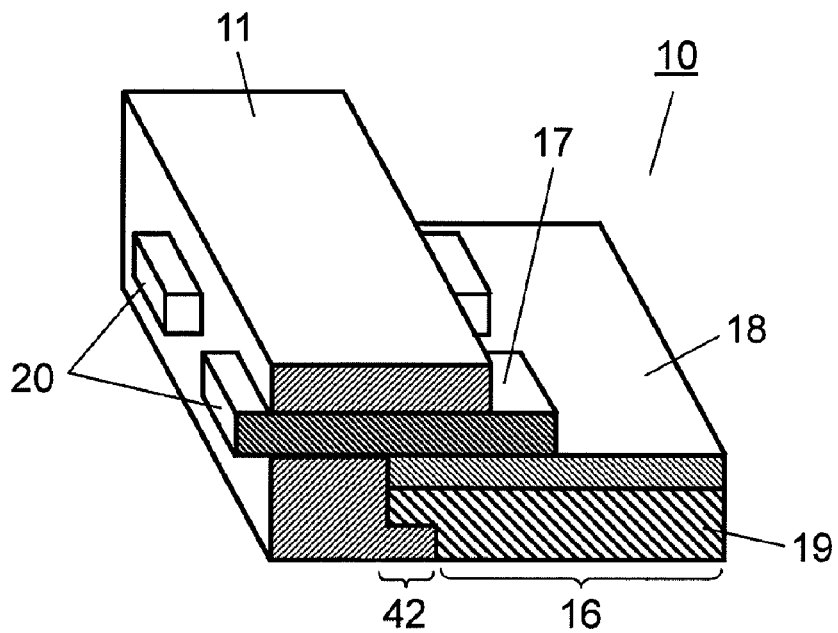
FIG. 24B is a perspective view describing the manner of inserting the connection wirings into the respective wiring holes formed in the resin structure and protecting the connection wirings.

FIGS. 24A and 24B are perspective views each describing a manner of inserting connection wirings 20 into wiring holes 13 formed in resin structure 11 and protecting connection wirings 20, respectively. In FIGS. 24A and 24B, insertion part 43 is set into such a shape as to be able to be fitted into each leg 42 of resin structure 11.

As shown in FIG. 24A, resin structure 11 is set to neighborhoods of connection wirings 20 of heat dissipation board 16. Thereafter, connection wirings 20 are inserted into respective wiring holes 13 using insertion part 43 and each leg 42 as a kind of a guide.

FIG. 24B is a perspective view showing a manner of protecting connection wirings 20 with resin structure 11. As shown in FIGS. 24A and 24B, by forming legs 42 each formed in a part of resin structure 11 and insertion parts 43 each in a part or the like of metal plate 19, performance of insertion of these members can be improved. Further, screws (not shown) can be dispensed with. Moreover, in FIGS. 24A and 24B, resin structure 11 may be fixed not to metal plate 19 but directly to the chassis or housing (both of which are not shown) fixing metal plate 19 by the screws or the like. In this way, working efficiency and reinforce fixing strength can be improved.

Figure 25A:
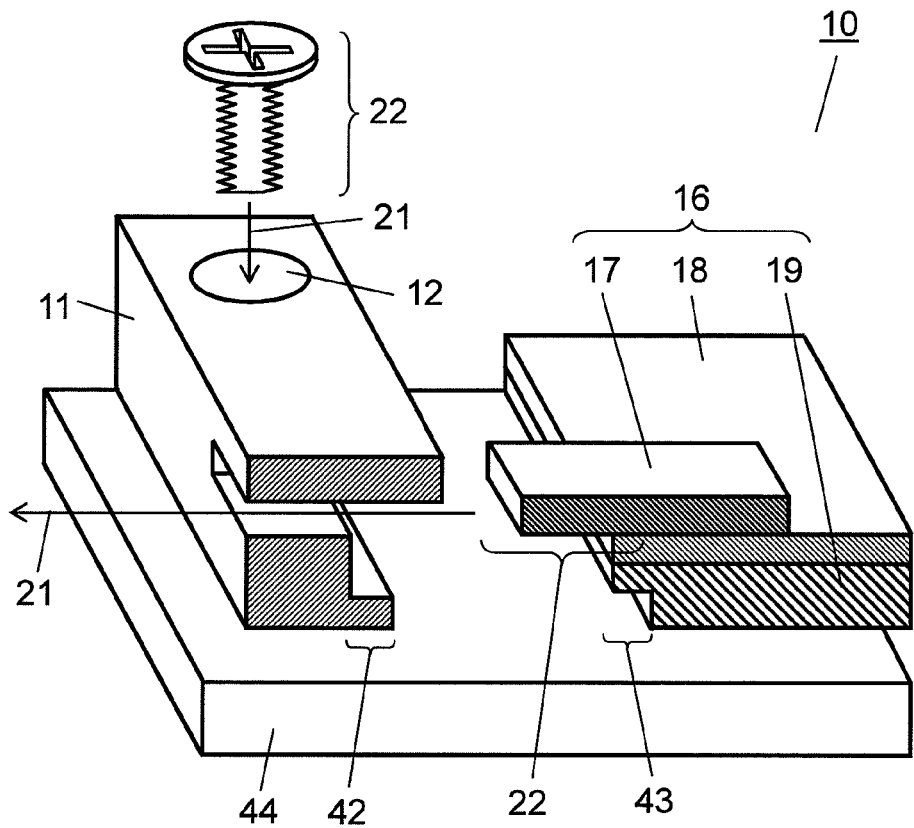
FIG. 25A is a perspective view describing a manner of fixing the resin structure to a chassis by a screw.
Figure 25B:
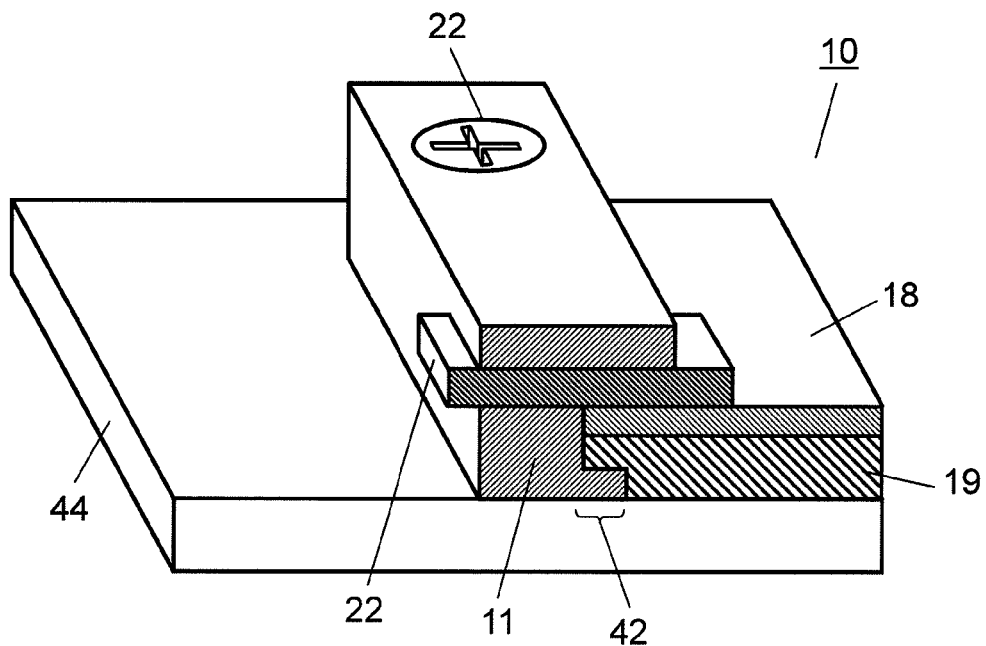
FIG. 25B is a perspective view describing the manner of fixing the resin structure to the chassis by the screw.

FIGS. 25A and 25B are perspective views each describing a manner of fixing resin structure 11 to the chassis or housing by screws 22. In FIGS. 25A and 25B, chassis 44 includes the housing or the like of the device. As shown in FIG. 25A, resin structure 11 is set to neighborhoods of connection wiring 20 of heat dissipation board 16 and inserts connection wiring 20 into wiring hole 13 as indicated by arrow 21. Thereafter, as shown in FIG. 25B, resin structure 11 is directly fixed to chassis 44 or the like by screw 22. This makes it possible to simultaneously fix resin structure 11 to heat dissipation board 16, heat dissipation structure board 10 and chassis 44 or the like, thus reducing cost.

In FIGS. 25A and 25B, insertion part 43 is obtained by working a part of metal plate 19. Insertion part 43 is assumed to have such a shape as to be able to be fitted into each leg 42 of resin structure 43. By fitting insertion part 43 into each leg 42, it is possible to fix resin structure 11 to heat dissipation board 16 and chassis 44 or the like more firmly.

As a material of resin structure 11, a resin material that can be injection molded is used. Such a resin is excellent in formability and low in cost. If it is necessary, high-strength engineering resin such as liquid crystal polymer, PPE or PEEK may be used.

Eleventh Embodiment

In an eleventh embodiment, a manner of mounting odd-shaped electronic component 29 in module 26 or the like formed using resin structure 11 will be described with reference to FIGS. 26 to 27A and 27B.

Figure 26:
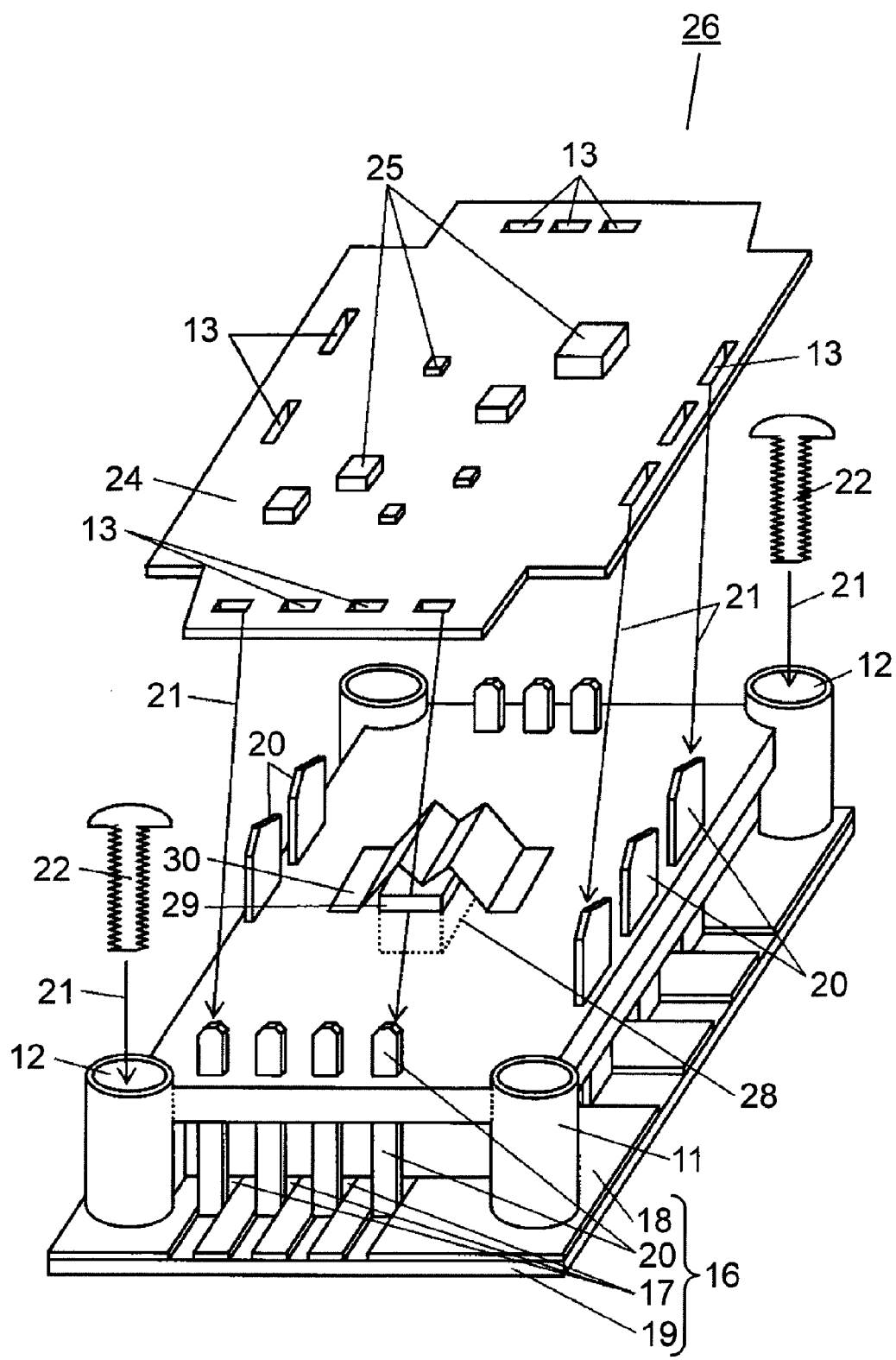
FIG. 26 is a perspective view describing a configuration of a module.

FIG. 26 is a perspective view describing a configuration of module 26.

In FIG. 26, attachment holes 12 for fixing resin structure 11 to heat dissipation board 16 and wiring holes 13 for protecting connection wirings 20 each of which is a part of each lead frame 17 of heat dissipation board 16 are formed in an outer periphery or the like of resin structure 11.

FIG. 26 does not show wirings constituted by lead frames 17, a power semiconductor or the like mounted on the wirings, and solder resist or the like.

Odd-shaped electronic component 29 is inserted into a concave part, a notch or the like formed in a predetermined part (such as a central portion) of resin structure 11 and fixing member 30 is fixed if it is necessary. In this way, a part of or more than a part of odd-shaped electronic component 29 is fixed to a front surface-side (printed circuit board 24-side) of resin structure 11. By fixing a part of or more than a part of odd-shaped electronic component 29 to the front surface-side, resin structure 11 is located between odd-shaped electronic component 29 and heat dissipation board 16 and insulating performance of resin structure 11 from electronic components (not shown) mounted on a surface of resin structure 11 and lead frames 17 or connection wirings 20 can be improved.

To fix odd-shaped electronic component 29 to resin structure 11, fixing member 30 can be dispensed with by elaborating an attachment structure (or a fitting structure) of resin structure 11 to (or into) which structure of odd-shaped electronic component 29 is attached (or fitted).

In FIG. 26, heat dissipation board 16 is configured to include: metal plate 19; sheet-like heat transfer layer 18 formed on this metal plate 19, lead frames 17 fixed to this heat transfer layer 18; and connection wirings 20 each obtained by protruding a part of each of these lead frames 17 from heat transfer layer 18.

Each connection wiring 20 is bent almost perpendicularly to heat transfer layer 18. As indicated by arrow 21, this is intended to protrude connection wiring 20 via wiring hole 13 formed in resin structure 11 and to connect connection wiring 20 to printed circuit board 24. In this way, it suffices to bend each lead frame 17 almost perpendicularly in an optimum part (for example, a peripheral edge) of heat dissipation board 16 to provide connection wiring 20, a terminal part for connection to an external circuit or the like. It is unnecessary to bend lead frames 17 in all the peripheral edges. Alternatively, a part of each lead frame 17 on the peripheral edge may be protruded to outside from heat dissipation board 16 while remaining almost in parallel to heat transfer layer 18.

In FIG. 26, arrow 21 directed to each attachment hole 12 indicates a manner in which resin structure 11 to which a part of or more than a part of odd-shaped electronic component 29 is fixed is fixed onto heat dissipation board 16 by screws 22.

Moreover, a part of resin structure 11 fixed onto heat dissipation board 16 by these screws 22 fixes each lead frame 17 and a part of each connection wiring 20 (or a base or neighborhoods of the base of each connection wiring 20 bent almost perpendicularly), thereby reinforcing strength of entire module 26.

Each of ordinary electronic components 25, for example, a control semiconductor, mounted on a surface of printed circuit board 24 is connected to a power semiconductor or the like (not shown) mounted on heat dissipation board 16 at a shortest distance or shortest line length via connection wirings 20. Due to this, ordinary electronic components 25 are free from influence of noise.

In this way, provided is module 26 configured to include: metal plate 19, heat transfer layer 18 formed on this metal plate 19; lead frames 17 fixed to this heat transfer layer 18; connection wirings 20 each obtained by protruding a part of each lead frame 17 from heat transfer layer 18; resin structure 11 fixing a part of or more than a part of each of these connection wirings 20; odd-shaped electronic component 29; and printed circuit board 24 fixed to be almost in parallel to metal plate 19, wherein a part of or more than a part of odd-shaped electronic component 29 is fixed to resin structure 11, and wherein a part of or more than a part of each connection wiring 20 is connected to printed circuit board 24.

Figure 27A:
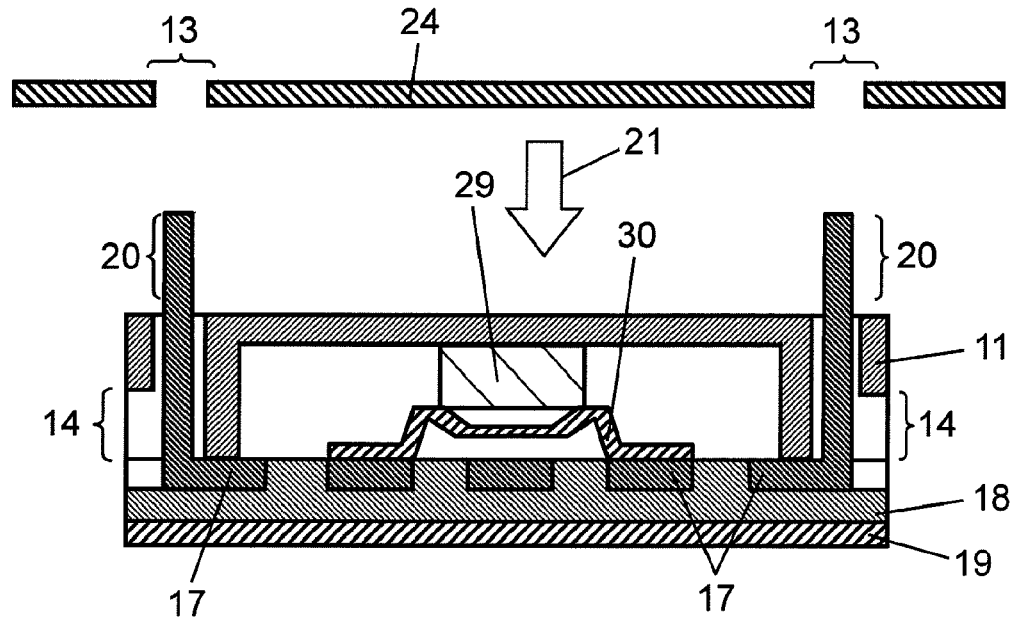
FIG. 27A is a cross-sectional view describing a manner of fixing an odd-shaped electronic component or the like between a heat dissipation board and a resin structure.
Figure 27B:
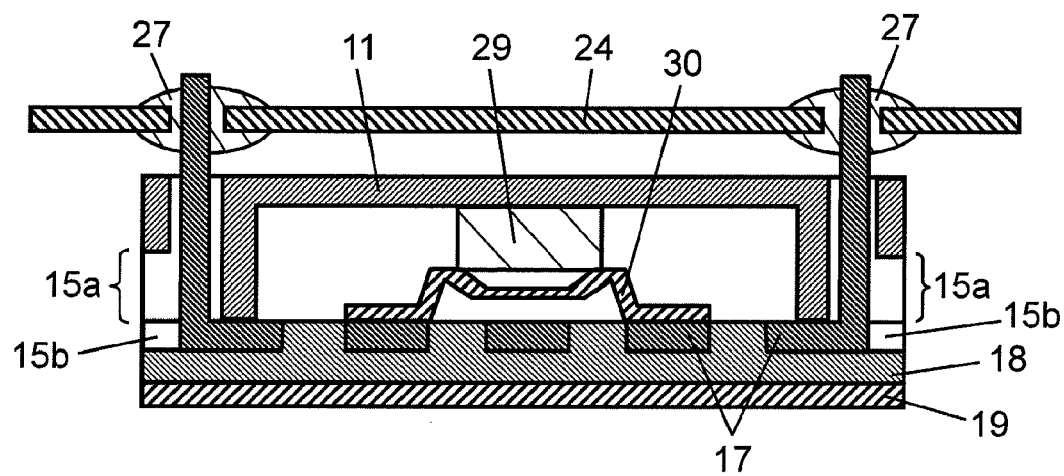
FIG. 27B is a cross-sectional view describing the manner of fixing the odd-shaped electronic component or the like between the heat dissipation board and the resin structure.

FIGS. 27A and 27B are cross-sectional views each describing a manner of fixing odd-shaped electronic component 29 between heat dissipation board 16 and resin structure 11.

As shown in FIGS. 27A and 27B, by fixing odd-shaped electronic component 29 between heat dissipation board 16 and resin structure 11, fixing performance, vibration resistance and the like of fixing odd-shaped electronic component 29 are improved. If odd-shaped electronic component 29 is to be fixed toward resin structure 11, each lead frame 17 is raised or floated from heat transfer layer 18-side and formed into a spring, thereby absorbing vibration resistance and dimensional error during attachment. It is to be noted that each lead frame 17 may be floated or fixing member 30 made of a metal piece (that may also serve as a bus bar) may be used. If the metal piece serving as this fixing member 30 is allowed to function as a kind of a bus bar (current supply line or jumper wiring), degree of freedom of designing how to arrange wirings constituted by lead frames 17 can be improved. Further, by providing resin structure 11 with an elastic structure or an attachment error absorbing structure, resin structure 11 absorbs dimensional irregularities of odd-shaped electronic component 15 to be set thereon.

Furthermore, as shown in FIG. 27B, wiring holes 13 provided in printed circuit board 24 are inserted into connection wirings 20 and fixed to connection wirings 20 by solders 27, respectively. With this structure, each of ordinary electronic components for control (not shown) mounted on a printed circuit board 24-side is connected to a power semiconductor or the like (not shown) mounted on heat dissipation board 16 at a shortest distance (or shortest line length) via connection wirings 20. Due to this, ordinary electronic components 25 are free from influence of noise.

Moreover, as shown in FIGS. 27A and 27B, wiring holes 13 formed in resin structure 11 protect connection wirings 20 of heat dissipation board 16. Further, by providing concave parts 15a and 15b in a part of resin structure 11, each lead frame 17 serving as a base of each connection wiring 20 can be efficiently pressed against heat dissipation board 16-side and bonding strength of bonding lead frame 17 is increased. By thus providing concave parts 15a and 15b, it is possible to reliably bring resin structure 11 into contact with lead frames 17 even if a warp or a swell is generated on heat dissipation board 16 or resin structure 11.

As shown in FIG. 27B, by providing a gap between circuit board 23 and resin structure 11, it is possible to inspect a state of bonding of solder 27 to each connection wiring 20-part or the like, flow of solder 27 and an amount of solder 27. Furthermore, an insulating sheet, an insulating film or the like may be inserted into this gap. This can prevent solder dust or the like during soldering from adhering onto resin structure 11.

Twelfth Embodiment

In a twelfth embodiment, reinforcement of strengths of connection wirings 20 of heat dissipation board 16 using resin structure 11 will be described with reference to FIGS. 28 to 31.

Figure 28:
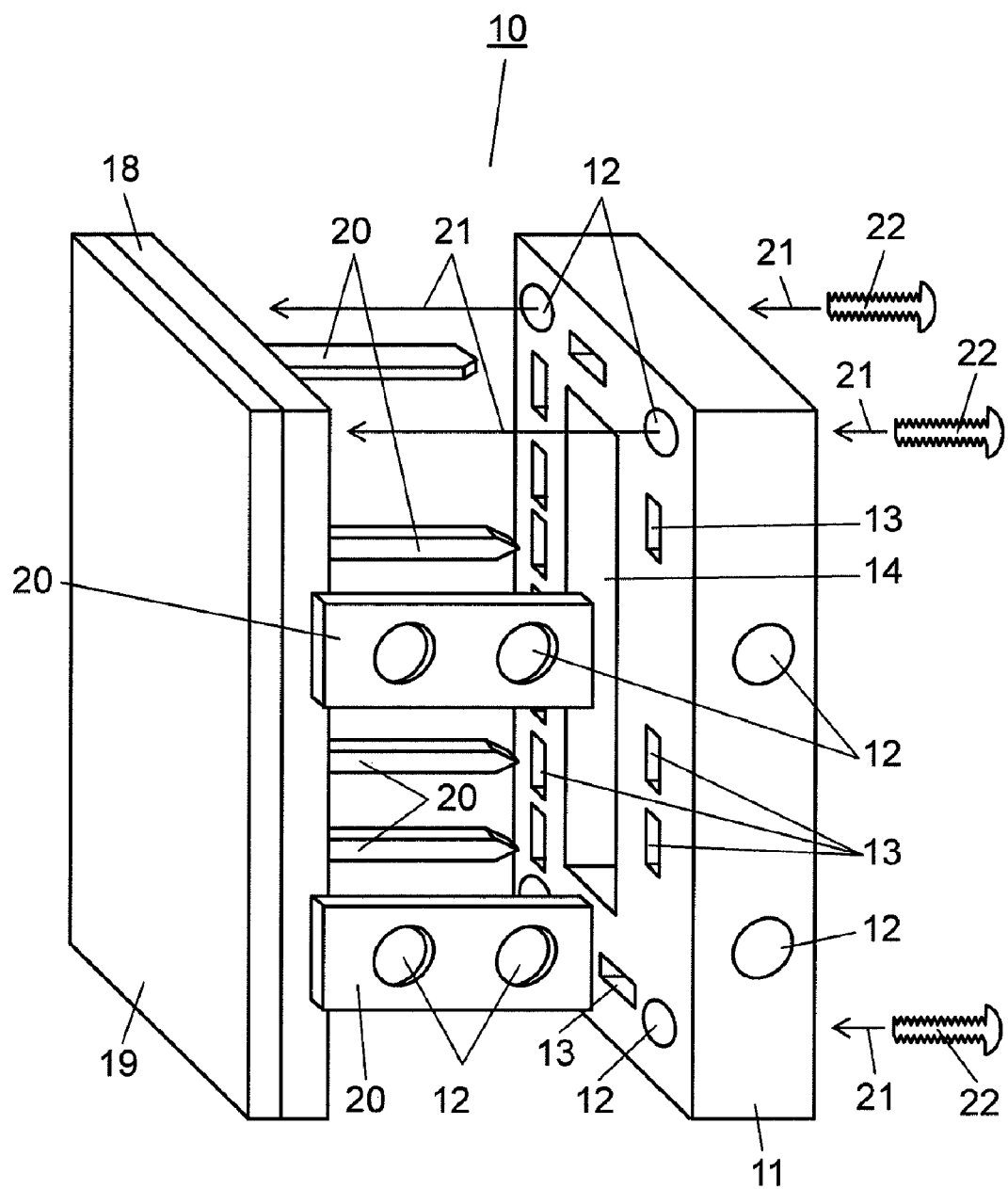
FIG. 28 is a perspective view describing an example of reinforcing strengths of connection wirings of a heat dissipation structure board.

FIG. 28 is a perspective view describing an example of reinforcing strengths of connection wirings 20 of heat dissipation structure board 16. As shown in FIG. 28, a part of or more than a part of each connection wiring 20 is inserted into each wiring hole 13 formed in resin structure 11, thereby connection wiring 20 is protected. Furthermore, shorting between connection wirings 20 is prevented. At the same time, bending, distortion and inclination of connection wirings 20 are corrected.

Figure 29A:
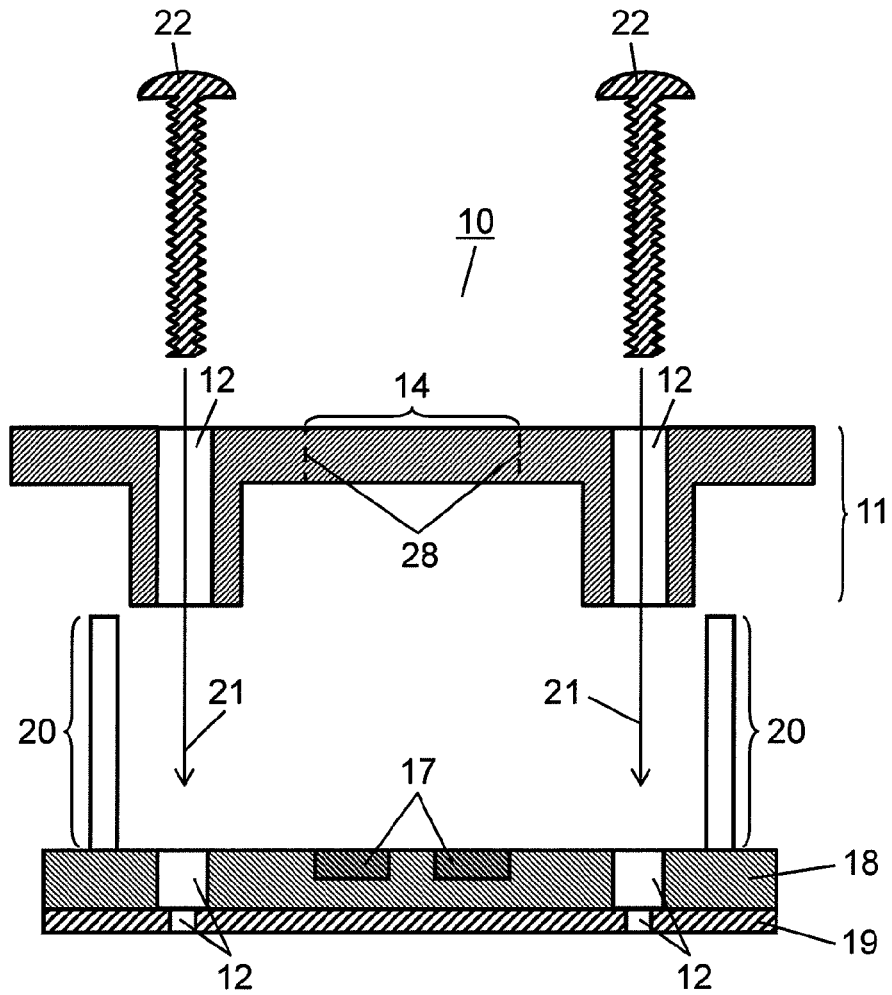
FIG. 29A is a cross-sectional view describing a manner of fixing the connection wirings of the heat dissipation structure board by physical means (or mechanical means) such as screws.
Figure 29B:
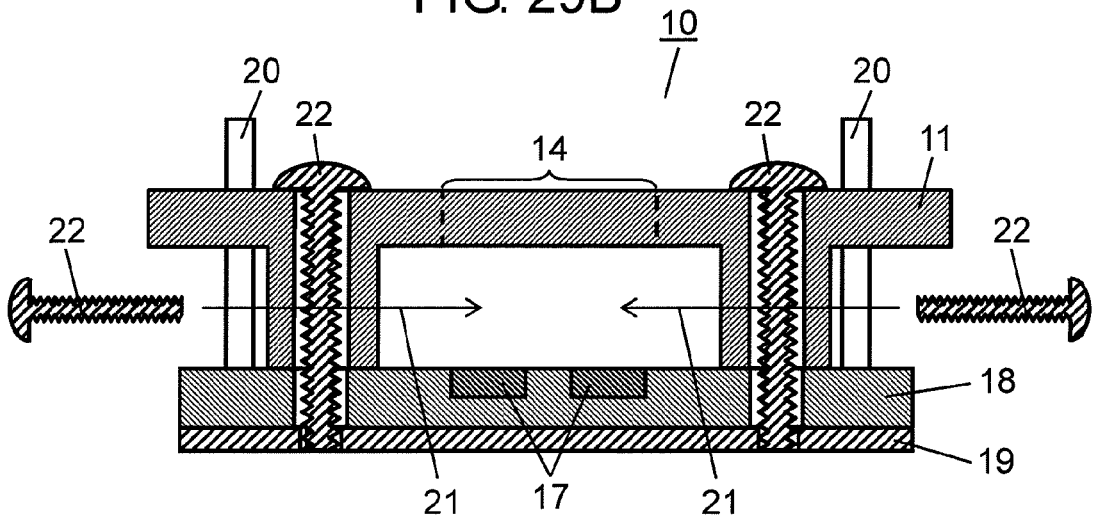
FIG. 29B is a cross-sectional view describing the manner of fixing the connection wiring of the heat dissipation structure board by physical means (or mechanical means) such as the screws.

FIGS. 29A and 29B are cross-sectional views describing a manner of fixing resin structure 11 by physical means or mechanical means such as screws 22. By thus providing structure parts fixing resin structure 11 either physically or mechanically, for example, screws 22 or the like and attachment holes 12 or the like in resin structure 11 in a positive manner, resin structure 11 can be integrated with heat dissipation board 16 or the like and reinforcement of strength of resin structure can be realized.

Dotted line 28 shown in FIGS. 29A and 29B indicate opening 14 formed in a central portion or the like of resin structure 11. Opening 14 is provided to prevent resin structure 11 from being a physical obstacle against various types of heat-generation components such as a power semiconductor, a power LED, a high-power laser device, a transformer, a coil or the like (all of which are not shown) mounted on lead frames 17 serving as wirings.

In FIG. 29A, sheet-like heat transfer layer 18 is fixed onto metal plate 19 and lead frames (not shown) are fixed to this heat transfer layer 18.

Screws 22 shown in FIG. 29A are inserted into attachment holes 12 provided in resin structure 11 as indicated by arrow 21, thus fixing resin structure 11. By setting a diameter of each of attachment holes 12 formed on a heat transfer layer 18-side to be larger than that of each of holes 12 formed in metal plate 19, a screw thread or a tap groove can be formed in each of holes 16 of metal plate 19. FIG. 29B shows a manner of mechanically fixing connection wirings 20 each of which is a part of each lead frame 17 by screws 22 to resin structure 11. As shown in FIG. 29B, by mechanically fixing connection wirings 20 to resin structure 11, an external force transmitted to connection wirings 20 can be released to metal plate 19 or the like via resin structure 11.

Figure 30A:
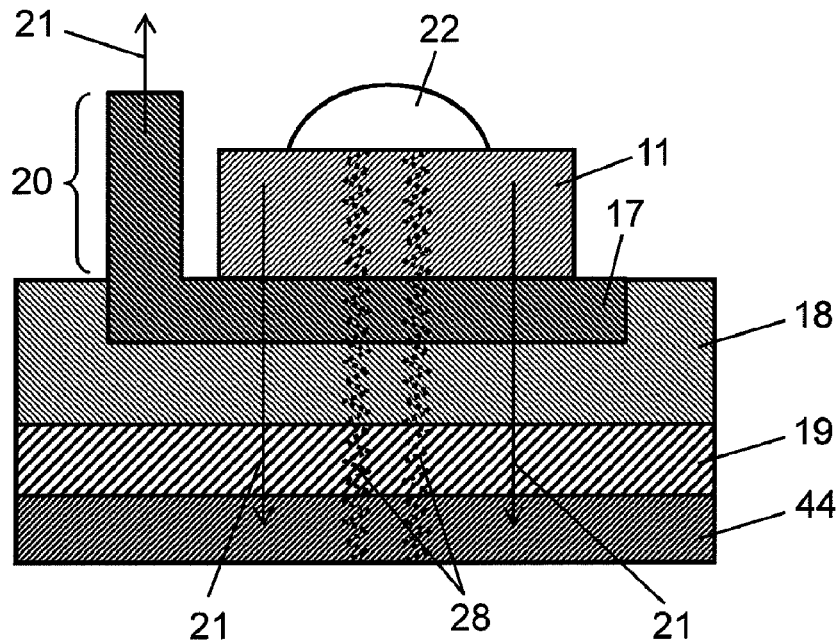
FIG. 30A is a cross-sectional view showing an example of a structure part in which a resin structure reinforces a lead frame and a part of or more than a part of a connection wiring.
Figure 30B:
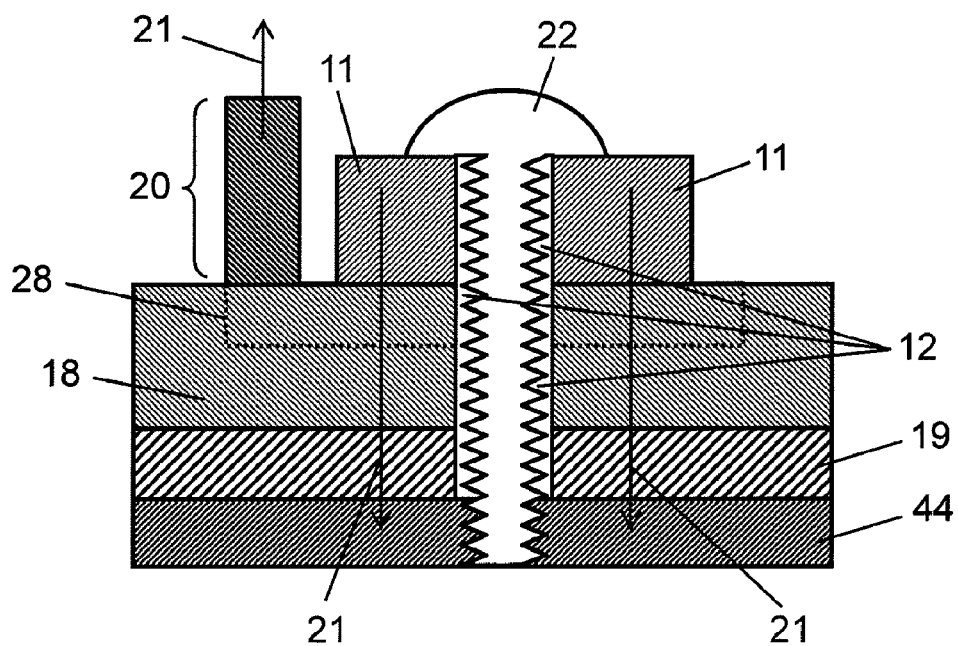
FIG. 30B is a cross-sectional view showing an example of the structure part in which the resin structure reinforces the lead frame and a part of or more than a part of the connection wiring.

FIGS. 30A and 30B are cross-sectional views showing an example of structure parts by which resin structure 11 reinforces a part of or more than a part of each lead frame 17, each connection wiring 20 or a connection part or the like connected to an external circuit or the like.

FIG. 30A is a cross-sectional view describing a manner in which resin structure 11 reinforces lead frame 17 and a base of connection wiring 20 obtained by a part of lead frame 17.

As shown in FIG. 30A, resin structure 11 is fixed to metal plate 19 and further to chassis 44 by screws 22 or the like, a fixing force indicated by arrow 21 is generated in lead frame 17. As a result, even if a tensile force (arrow 21) is generated, the fixing force indicated by arrow 21a cancels this tensile force (arrow 21).

FIG. 30B is a cross-sectional view in screw 22-part. As shown in FIG. 30B, screw 22 and lead frame 17 are isolated and fixed via resin structure 11 having insulating property halfway, thereby preventing influence of noise or the like due to screw 22. It is to be noted that dotted line 28 in FIG. 30B indicates a position of lead frame 17 hidden behind heat transfer layer 18.

Figure 31A:
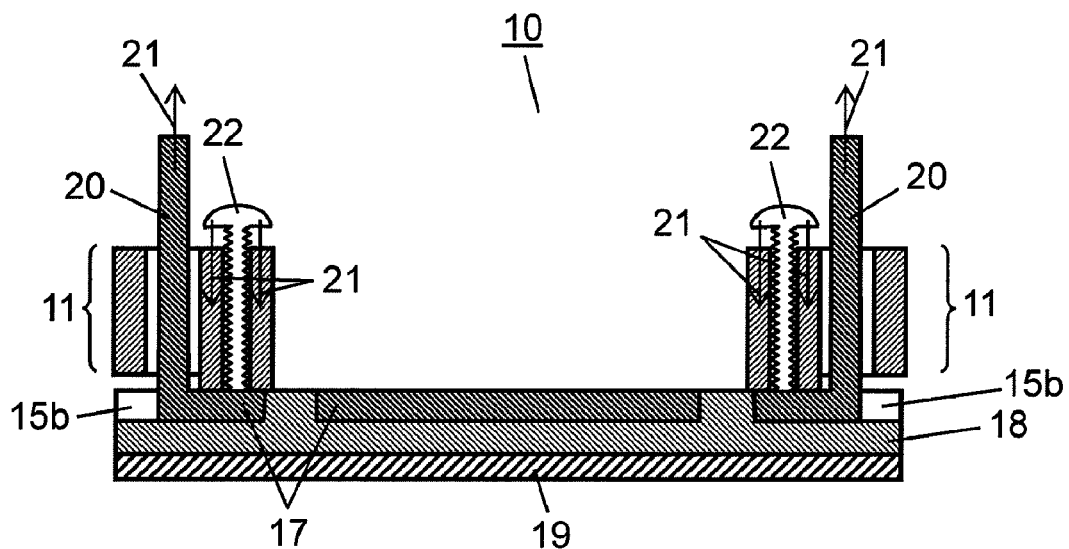
FIG. 31A is a cross-sectional view describing a manner of using the resin structure for filling up a sealing material.
Figure 31B:
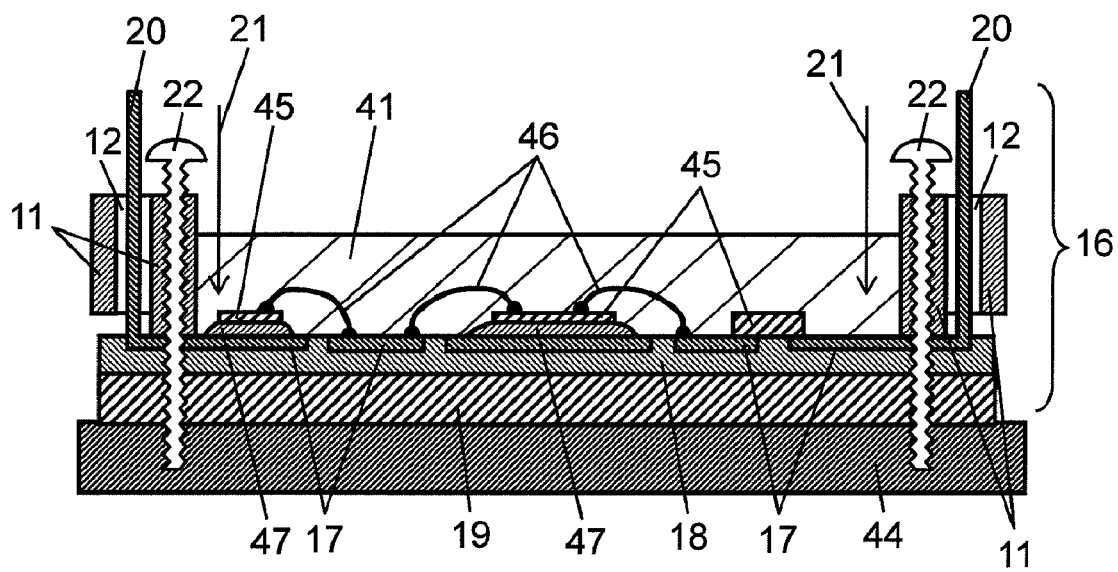
FIG. 31B is a cross-sectional view describing the manner of using the resin structure for filling up the sealing material.

FIGS. 31A and 31B are cross-sectional views describing a manner of using resin structure 11 for filling up sealing material 41. In FIGS. 31A and 31B, aluminum wires or the like can be used as bonding wires 46. Further, a fixing layer 47 is made of solders 27, adhesive or the like for fixing bare chips 45 to lead frames 17 or the like.

In FIGS. 31A and 31B, bare chips 45 and the like are mounted on heat dissipation board 16. Bare chips 45 are connected to one another by bonding wires 46 or the like and covered with sealing material 41.

Arrow 21 shown in FIGS. 31A and 31B indicates a manner of reinforcing strengths of connection wirings 20 and the like by fixing resin structure 11 to metal plate 19 and the like by screws 22.

As shown in FIG. 31B, it is preferable to protect bare chips 45 with sealing material 41 after mounting bare chips 45. Alternatively, resin structure 11 (not shown) may be formed to cover up a part of or more than a part of sealing material 41. In this way, by configuring resin structure 11 to cover up lead frames 17 fixed to heat transfer layer 18, odd-shaped electronic component 29 and further metal foil pattern 48 or the like to be described below with reference to FIGS. 32A, 32B to 33, strengths of these lead frames 17, odd-shaped electronic component 29 and further metal foil 48 can be reinforced. Metal foil pattern 48 will be described below with reference to FIGS. 32A and 32B. This is because resin structure 11 provided to cover up these members presses these members against a metal plate 19-side, fixes and hold these members by fixing resin structure 11 to metal plate 19 and the like by screws 22 or the like. Furthermore, by reinforcing fixing strengths of fixing the respective members using resin structure 11, it is possible to substantially reinforce a peel strength of peeling off, for example, sealing material 41 itself from a ground and improve a degree of freedom of selecting a material for sealing material 41 or the like. Only by fixing a base part of each connection wiring 20, resin structure 11 can relax a force applied to lead frames 17 and protect bare chips 45 and bonding wires 46 mounted on lead frames 17. It is, therefore, possible to substantially reinforce the peel strength of peeling off sealing material 41 itself from the ground.

Moreover, as shown in FIGS. 31A and 31B, resin structure 11 is formed into, for example, a picture frame shape. With this structure, even if sealing material 41 is injected into a part surrounded by this resin structure 11, sealing material 41 does not flow from a gap of the part. As a result, sealing material 41 low in viscosity and high in mobility can be selected. Even if bare chips 45 and the like are sealed with sealing material 41, it is difficult for bubbles, for example, air bubbles to remain in sealing material 41. Therefore, sealing performance of sealing material 41 can be improved.

In FIGS. 30A and 30B, one of an insert, an insert nut, a screw, a buried nut and an insertion nut (all of which are not shown) may be used as attachment hole 12 formed in resin structure 11. Further, by not exposing a tip end (a side out of contact with a driver or a screw driver) of screw 22 from resin structure 11, that is, concealing the tip end of screw 22 in resin structure 11, an insulating performance (including a creepage distance of insulation) of screw 22 from the other wirings (including other mounted components and wirings) can be improved.

In this way, by fixing resin structure to metal plate (and also a housing and chassis 44 fixing metal plate 19, each of which is not shown) by screws 22 or the like, strength can be partially reinforced (or peel strength can be reinforced). It is preferable to design a shape of a part of resin structure 11 so as to cover up lead frames 17 in a positive manner and to come into contact with lead frames 17.

In this way, by providing heat dissipation board 16 configured so that resin structure 11 protects bare chips 45 mounted on lead frames 17 or protects or covers up a part of or more than a part of sealing material 41 sealing bare chips 45, it is possible to reinforce strengths of not only bare chips 45 but also sealing material 41.

Thirteenth Embodiment

In a thirteenth embodiment, a case where each lead frame 17 used for heat dissipation board 16 is a multilayer body including lead frame 17 and a metal foil pattern will be described with reference to FIGS. 32A and 32B.

Figure 32A:
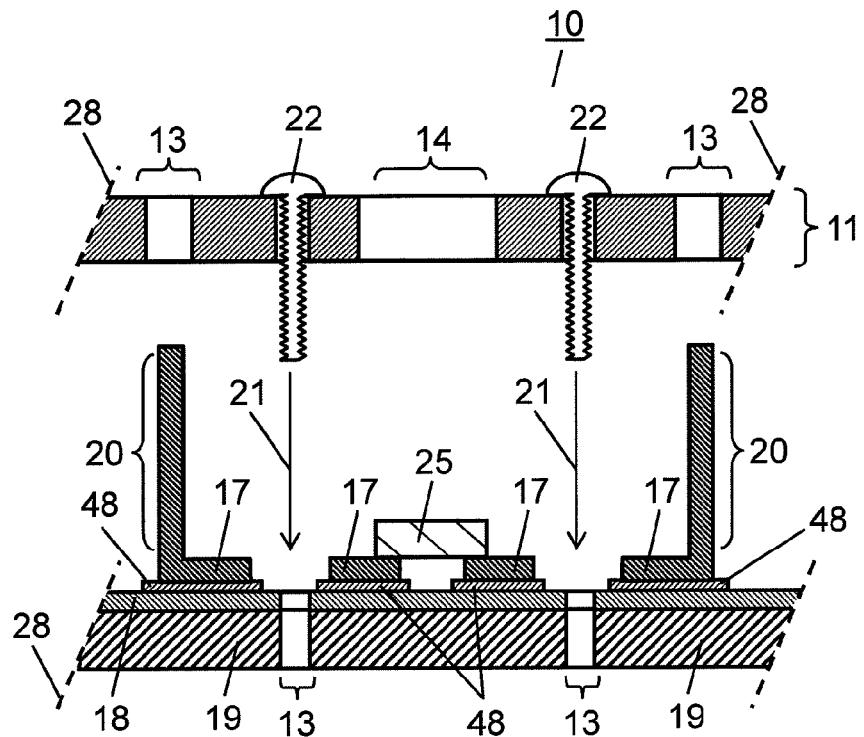
Figure 32B:
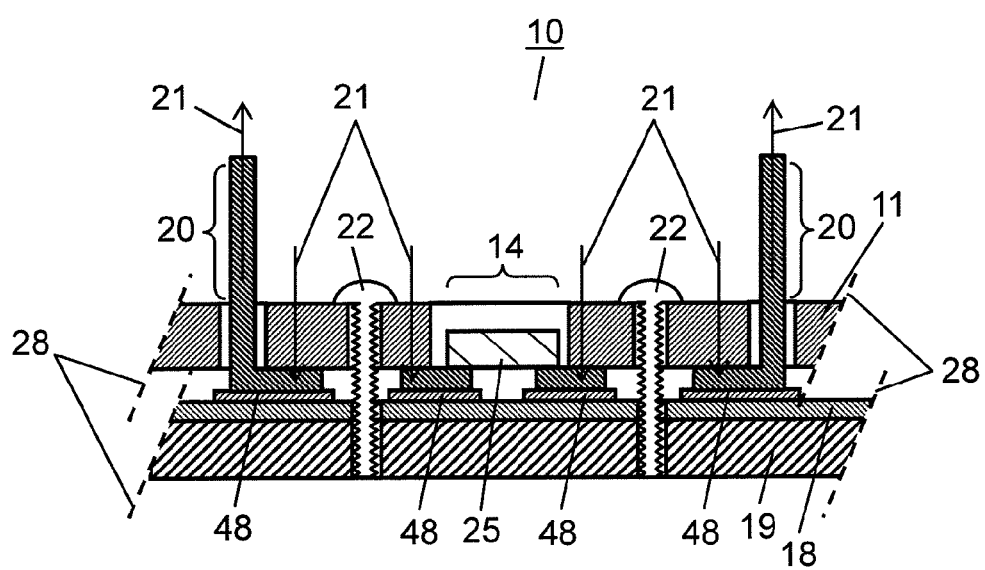

FIGS. 32A and 32B are cross-sectional views each describing a manner of forming heat dissipation board 16 using an aluminum board or the like.

In FIGS. 32A and 32B, as heat dissipation board 16 including metal foil pattern 48, a commercially available aluminum board, for example, a board obtained by forming a wiring pattern using a metal foil such as an aluminum foil or a copper foil on an aluminum board to which a polyimide film is bonded can be used. Since the metal foil of such an aluminum board is patterned by photo-etching, fine metal foil pattern 48 having line interval/line width=50 microns/50 microns can be formed.

Moreover, a product having a circular end pattern of a copper foil or an aluminum foil bonded via an aluminum board (for example, an aluminum plate on which a heat-resistant film made of polyimide or the like is bonded or a heat dissipation insulating layer obtained by dispersing ceramic powder such as alumina powder into thermosetting resin) is commercially available in the name of a metal board, an aluminum heat dissipation board, a metal heat dissipation board or the like. Such a commercially available board can be used as the aluminum board.

The copper foil or the aluminum foil constituting metal foil pattern 48 is assumed as electrolyte copper or an aluminum foil having a thickness not less than 18 microns and not more than 200 microns. By setting the thickness of metal foil pattern 48 to this thickness, it is possible to easily form a fine pattern by using etching or the like and to handle downsizing and density increase of the board. If the thickness of the metal foil is less than 18 microns, the thickness possibly influences heat conductivity and wiring resistance. If the thickness exceeds 200 microns, it is often difficult to form the fine pattern by etching. In such a case, a copper plate can be used in place of the copper foil. The copper foil is excellent in workability by etching. The copper plate is excellent is workability by a die or the like.

By forming lead frames 17 out of tough pitch copper, cost of lead frames 17 can be reduced and heat conductivity thereof can be improved. Moreover, a material of lead frames 17 is not always limited to copper but may be copper alloy, aluminum or aluminum alloy. This is because copper or the like is excellent in solderability and weldability and aluminum or the like is excellent in wire bonding performance or the like. The material of lead frames 17 may be appropriately selected according to purposes.

In the thirteenth embodiment, lead frames 17 are fixed to a predetermined part of such an aluminum board, thus providing heat dissipation board 16. By fixing lead frames 17 to a part of the aluminum board, heat dissipation board 16 can handle high current (for example, 100 amperes (A)) or heat spread (for example, heat diffusivity) which metal foil pattern 48 cannot handle.

In FIGS. 32A and 32B, heat transfer layer 18 made of a polyimide film or the like is formed on metal plate 19. Metal foil pattern 48 made of the copper foil or aluminum foil is formed on a surface of heat transfer layer 18. Lead frames 17 are fixed onto metal foil pattern 48 according to necessity. By mounting ordinary electronic component 25 on a metal foil pattern 48-side, it is possible to handle high-density mounting. By mounting ordinary electronic component 25 on a lead frame 17-side, it is possible to handle heat spread and high current.

As indicated by arrow 21 in FIG. 32A, resin structure 11 is fixed to heat dissipation board 16, thus providing heat dissipation structure board 10.

FIG. 32B is a cross-sectional view of reinforced heat dissipation board 16. As shown in FIG. 32B, by reinforcing a part of lead frames 17 and metal foil pattern 48 using resin structure 11, strengths of these members can be increased or a bonding strength of bonding each of these members to heat transfer layer 18 can be increased. Further, by bending a part of each lead frame 17 almost perpendicularly and protruding the bent part of lead frame 17 to outside from wiring hole 13 formed in resin structure, this part can be used as connection wiring 20 for connection to an external circuit or the like.

Arrow 21 in FIG. 32B indicates a force by which screws 22 press lead frames 17 against metal plate 19 via resin structure 11. Arrow 21 in FIG. 32B also indicates an external force from a power cable or the like (not shown) connected to connection wirings 20 or the like. As shown in FIG. 32B, a fastening force by which screws 22 or the like fasten resin structure 11 cancels these external forces.

In this way, by providing heat dissipation board 16 configured so that metal foil pattern 48 is provided on heat transfer layer 18 and so that a part of or more than a part of each lead frame 17 includes the connection part electrically connected to metal foil pattern 48, circuit patterns can be appropriately used, that is, a circuit pattern using metal foil pattern 48 is adopted for parts required of a fine pattern and a circuit pattern using lead frames 17 is adopted for parts required of high strength, high current and the like. Furthermore, since the strength of the aluminum board using commercially available metal foil pattern 48 can be increased and high current can be applied to the aluminum board, it is possible to deal with a wide range of commercial demand.

A manner designed not to generate an unnecessary stress in a solder part if resin structure 11 fixes lead frames 17 will be described.

Figure 33:
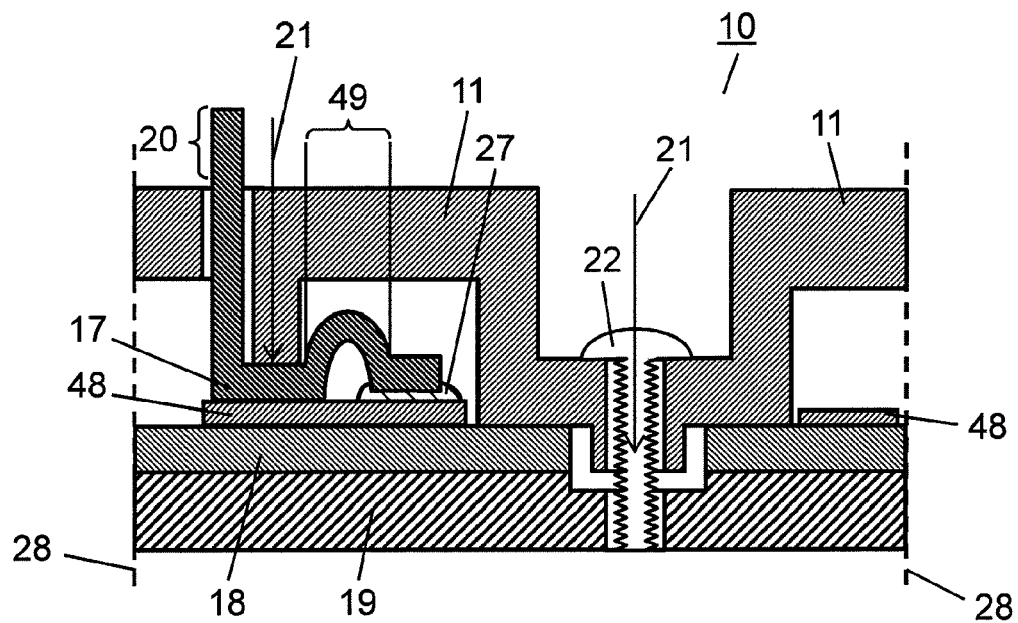
FIG. 33 is a cross-sectional view describing an example of a cross-sectional view of a heat dissipation structure board designed not to generate an unnecessary stress in a solder part.
Figure 34:
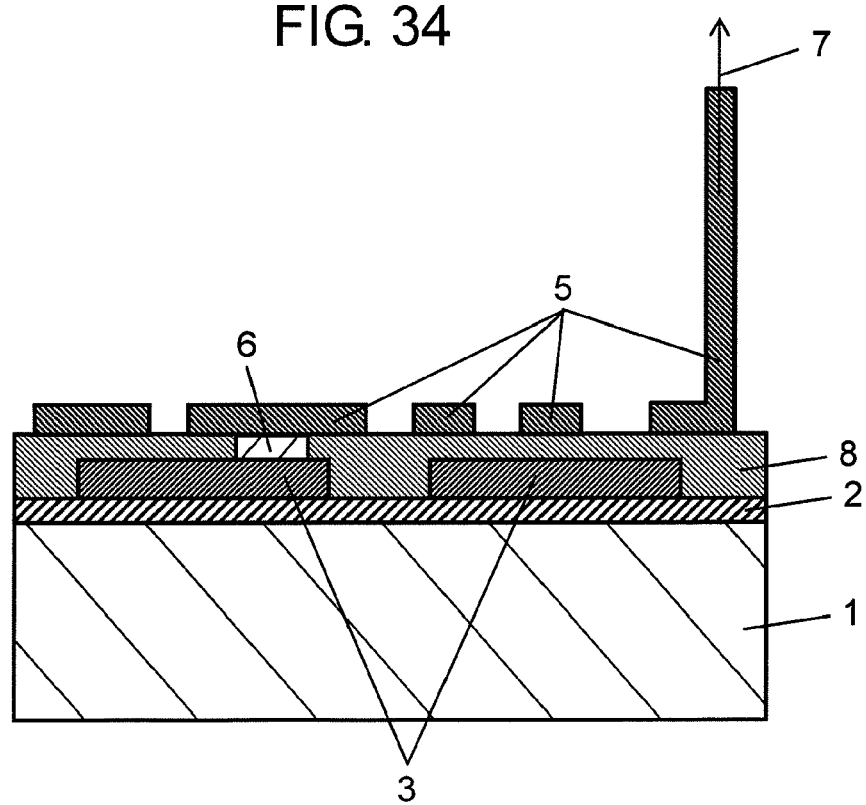
FIG. 34 is a cross-sectional view of a conventional heat dissipation board.

FIG. 33 is a cross-sectional view describing an example of heat dissipation board 16 and resin structure 11 configured so as not to generate an unnecessary stress in a solder part. In FIG. 33, buffer structure part 49 is obtained by, for example, bending a part of each lead frame 17. It is to be noted that buffer structure part 49 is a part structured so that, for example, resin structure 11 is not directly superimposed on the solder part or so that resin structure 11 does not directly come into contact with solder.

In this way, provided is buffer structure part 49 configured so that a fixing force by resin structure 11 is not directly transmitted to the solder part, resin structure 11 is not brought into contact with the solder or solder part or a stress deriving from attachment of resin structure 11 is not generated in the solder or solder part. As a result, even if a strong pressing force is applied to lead frames 17 from resin structure 11, the stress generated in the solder part can be reduced. Buffer structure part 49 is useful particularly for lead-free solder 27 and the like susceptible to influence of the stress.

In FIG. 33, lead frame 17 is fixed onto metal foil pattern 48 by solder 27. Furthermore, a part of lead frame 17 away from the solder part is fixed using resin structure 11 as indicated by arrow 21, thereby preventing an unnecessary stress from being generated in the solder part. Alternatively, resin structure 11 can be structured not to directly press the solder part. Moreover, by providing buffer structure part 49 on a part of lead frame 17, the generation of the stress can be further prevented and reliability of the solder part can be improved.

In FIG. 33, solder 27 may be adhesive (including conductive adhesive, a heat-conducting insulating adhesive or the like) other than solder 27 (including lead-free solder). For example, by providing buffer structure part 49 obtained by bending a part of lead frame 17 into a U-shape or the like between a part in which resin structure 11 is fixed to a metal plate 19-side and a part fixed by solder 27, it is possible to prevent an attachment force (a fixing force or a fastening force) indicated by arrow 21 from being directly transmitted to solder 27. By providing such buffer structure part 49 in a part of lead frame 17 according to need, cracks or the like resulting from stress concentration or the like can be prevented from occurring.

In this way, by providing the structure or buffer structure part 49 designed not to directly generate a stress in solder 27 formed on terminal 31 of each lead frame 17 or odd-shaped electronic component 29 or the like, for example, avoiding the solder part, keeping resin structure 11 out of contact with the solder part or suppressing generation of the stress when resin structure 11 fixes lead frames 17 and odd-shaped electronic component 29 or the like, it is possible to prevent generation of the stress in the solder part and improve reliability of heat dissipation board 16.

INDUSTRIAL APPLICABILITY

The heat dissipation structure board according to the present invention is useful as a heat dissipation structure used in a hybrid vehicle such as a mild hybrid vehicle, an electric vehicle or an industrial device.

The invention claimed is:

1. A heat dissipation structure board comprising:
   a metal plate;
   a heat transfer layer provided on the metal plate;
   a lead frame having a terminal part, a portion of the lead frame other than the terminal part being fixedly attached to and arranged within the heat transfer layer;
   a resin structure connected to an upper surface of the portion of the lead frame other than the terminal part;
   a connection part in which the resin structure is fixed to at least one of the metal plate, the heat transfer layer, a chassis fixing the metal plate and a member to which the chassis is connected;
   a guide part guiding a connection wiring and the terminal part, the connection wiring being a part of the terminal part, the connection wiring being formed by peeling up a part of the lead frame so as to protrude perpendicularly from the heat transfer layer; and
   a reinforcement part that corresponds to a part of or more than the part of the lead frame, the resin structure abutting on the lead frame in the reinforcement part,
   wherein the terminal part is formed at a peripheral edge of the heat transfer layer,
   wherein the guide part is a wiring hole into which the connection wiring is inserted, the wiring hole having a tapered guide structure,
   wherein a base of the connection wiring is fixed by the resin structure directly, the base of the connection wiring being a part of the lead frame arranged within the heat transfer layer,
   and wherein the resin structure has a concave portion in a lower part of a periphery of the resin structure.

2. The heat dissipation structure board according to claim 1, further comprising a holding part provided in a part of the resin structure and holding at least a part of an odd-shaped electronic component.

3. The heat dissipation structure board according to claim 1,
   wherein at least one of the connection wiring and the resin structure is formed in a peripheral edge of the heat transfer layer or the heat dissipation structure board.

4. The heat dissipation structure board according to claim 2,
   wherein the odd-shaped electronic component is insert molded into the resin structure.

5. The heat dissipation structure board according to claim 2, wherein the lead frame is electrically connected to one or more than one terminal of the odd-shaped electronic component.

6. The heat dissipation structure board according to claim 2,
   wherein one or more than one connection part of the odd-shaped electronic component is protruded or exposed to a surface-side of the resin structure, the surface-side being out of contact with the metal plate.

7. The heat dissipation structure board according to claim 1,
   wherein the wiring hole comprises one or more wiring holes formed in the resin structure, and
   a part of the connection wiring of the heat dissipation structure board is connectable to an external circuit via the one or more wiring holes.

8. The heat dissipation structure board according to claim 2,
   wherein the heat dissipation structure board includes a bus bar, the bus bar constituting a part of a wiring pattern of the heat dissipation structure board and holding the part of or more than the part of the odd-shaped electronic component.

9. The heat dissipation structure board according to claim 1,
   wherein the resin structure includes a plurality of structures holding the connection wiring or a part of or more than the part of a printed circuit board connected to the connection wiring.

10. The heat dissipation structure board according to claim 1, further comprising:
    a bare chip mounted on the lead frame, wherein the resin structure includes a sealing material protecting or sealing the bare chip.

11. The heat dissipation structure board according to claim 1,
    wherein a metal foil pattern is provided on the heat transfer layer, and
    a part of or more than the part of the lead frame includes a connection part electrically connected to the metal foil pattern, and the part of or more than the part of the lead frame is out of contact with the lead frame and a solder part formed on the metal foil pattern by the resin structure.

12. A module comprising:
    the heat dissipation structure board according to claim 1; and
    one or more printed circuit boards almost in parallel to the metal plate, and provided on a surface-side of the resin structure different from a surface-side on which the metal plate is provided,
    wherein the printed circuit board is electrically connected to a part of or more than the part of the connection wiring or the terminal part.

13. The module according to claim 12,
    wherein an odd-shaped electronic component is provided between the metal plate and the resin structure, and the odd-shaped electronic component is electrically connected to at least one of the lead frame and the printed circuit board.

14. A method of manufacturing a heat dissipation structure board according to claim 1,
    said method comprising:

protruding a part of the lead frame from the heat transfer layer or bending the part of the lead frame almost perpendicularly to the heat transfer layer, thereby providing a connection wiring or a terminal part; and fixing the resin structure to any one of or more than one of the metal plate and the heat transfer layer, a chassis of a device fixing the metal plate and a member to which the metal plate is connected.

15. The heat dissipation structure board according to claim 2, wherein the wiring hole comprises one or more wiring holes formed in the resin structure, and a part of the connection wiring of the heat dissipation structure board is connectable to an external circuit via the one or more wiring holes.

16. The heat dissipation structure board according to claim 2, wherein the resin structure includes a plurality of structures holding the connection wiring or a part of or more than the part of a printed circuit board connected to the connection wiring.

17. The heat dissipation structure board according to claim 2, further comprising:

a bare chip mounted on the lead frame, wherein the resin structure includes a sealing material protecting or sealing the bare chip.

18. The heat dissipation structure board according to claim 3, further comprising:

a bare chip mounted on the lead frame, wherein the resin structure includes a sealing material protecting or sealing the bare chip.

19. The heat dissipation structure board according to claim 4, further comprising:

a bare chip mounted on the lead frame, wherein the resin structure includes a sealing material protecting or sealing the bare chip.

20. The heat dissipation structure board according to claim 5, further comprising:

a bare chip mounted on the lead frame, wherein the resin structure includes a sealing material protecting or sealing the bare chip.

21. The heat dissipation structure board according to claim 6, further comprising:

a bare chip mounted on the lead frame, wherein the resin structure includes a sealing material protecting or sealing the bare chip.

22. The heat dissipation structure board according to claim 2, wherein a metal foil pattern is provided on the heat transfer layer, and a part of or more than the part of the lead frame includes a connection part electrically connected to the metal foil pattern, and the part of or more than the part of the lead frame is out of contact with the lead frame and a solder part formed on the metal foil pattern by the resin structure.

23. The heat dissipation structure board according to claim 3, wherein a metal foil pattern is provided on the heat transfer layer, and a part of or more than the part of the lead frame includes a connection part electrically connected to the metal foil pattern, and the part of or more than the part of the lead frame is out of contact with the lead frame and a solder part formed on the metal foil pattern by the resin structure.

24. The heat dissipation structure board according to claim 4, wherein a metal foil pattern is provided on the heat transfer layer, and a part of or more than the part of the lead frame includes a connection part electrically connected to the metal foil pattern, and the part of or more than the part of the lead frame is out of contact with the lead frame and a solder part formed on the metal foil pattern by the resin structure.

25. The heat dissipation structure board according to claim 5, wherein a metal foil pattern is provided on the heat transfer layer, and a part of or more than the part of the lead frame includes a connection part electrically connected to the metal foil pattern, and the part of or more than the part of the lead frame is out of contact with the lead frame and a solder part formed on the metal foil pattern by the resin structure.

26. The heat dissipation structure board according to claim 6, wherein a metal foil pattern is provided on the heat transfer layer, and a part of or more than the part of the lead frame includes a connection part electrically connected to the metal foil pattern, and the part of or more than the part of the lead frame is out of contact with the lead frame and a solder part formed on the metal foil pattern by the resin structure.

* * * * *